(12) United States Patent
Yu et al.

(10) Patent No.: US 9,299,866 B2
(45) Date of Patent: Mar. 29, 2016

(54) NANOWIRE ARRAY BASED SOLAR ENERGY HARVESTING DEVICE

(75) Inventors: Young-June Yu, Cranbury, NJ (US); Munib Wober, Topsfield, MA (US); Peter Duane, Waltham, MA (US)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 910 days.

(21) Appl. No.: 12/982,269

(22) Filed: Dec. 30, 2010

(65) Prior Publication Data

US 2012/0168613 A1 Jul. 5, 2012

(51) Int. Cl.
*G01J 1/20* (2006.01)
*H01L 31/0352* (2006.01)
*H01L 31/056* (2014.01)

(52) U.S. Cl.
CPC .. *H01L 31/035281* (2013.01); *H01L 31/03529* (2013.01); *H01L 31/056* (2014.12); *Y02E 10/52* (2013.01)

(58) Field of Classification Search
CPC . H01L 27/142; H01L 31/056; H01L 31/0232; Y02E 10/547; Y02E 10/548
USPC ......... 250/203.4; 136/244, 252; 977/721, 762
See application file for complete search history.

(56) References Cited

U.S. PATENT DOCUMENTS

| | | | |
|---|---|---|---|
| 1,918,848 A | 4/1929 | Land | |
| 3,903,427 A | 9/1975 | Pack | |
| 4,017,332 A | 4/1977 | James | |
| 4,292,512 A | 9/1981 | Miller | |
| 4,316,048 A | 2/1982 | Woodall | |
| 4,357,415 A | 11/1982 | Hartman | |
| 4,387,265 A | 6/1983 | Dalal | |
| 4,394,571 A | 7/1983 | Jurisson | |
| 4,400,221 A | 8/1983 | Rahilly | |
| 4,443,890 A | 4/1984 | Eumurian | |
| 4,513,168 A | 4/1985 | Borden | |
| 4,531,055 A | 7/1985 | Shepherd, Jr. | |
| 4,620,237 A | 10/1986 | Traino | |
| 4,678,772 A | 7/1987 | Segal et al. | |
| 4,827,335 A | 5/1989 | Saito | |

(Continued)

FOREIGN PATENT DOCUMENTS

| | | |
|---|---|---|
| CN | 1624925 | 6/2005 |
| CN | 1306619 | 3/2007 |
| CN | 100350429 | 11/2007 |
| CN | 101459185 | 6/2009 |

(Continued)

OTHER PUBLICATIONS

International Preliminary Search Report on Patentability of PCT/US201-057325, mailed May 2, 2013.

(Continued)

*Primary Examiner* — Georgia Y Epps
*Assistant Examiner* — Kevin Wyatt
(74) *Attorney, Agent, or Firm* — Pillsbury Winthrop Shaw Pittman LLP

(57) ABSTRACT

A photovoltaic device operable to convert light to electricity, comprising a substrate, a plurality of structures essentially perpendicular to the substrate, one or more recesses between the structures, each recess having a planar mirror on a bottom wall thereof and each recess filled with a transparent material. The structures have p-n or p-i-n junctions for converting light into electricity. The planar mirrors function as an electrode and can reflect light incident thereon back to the structures to be converted into electricity.

44 Claims, 44 Drawing Sheets

(56) References Cited

U.S. PATENT DOCUMENTS

| | | |
|---|---|---|
| 4,846,556 A | 7/1989 | Haneda |
| 4,857,973 A | 8/1989 | Yang |
| 4,876,586 A | 10/1989 | Dyck |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 4,990,988 A | 2/1991 | Lin |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,217,911 A | 6/1993 | Denda |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unlu |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang |
| 5,943,463 A | 8/1999 | Unuma |
| 5,968,528 A | 10/1999 | Deckner et al. |
| 6,013,871 A | 1/2000 | Curtin |
| 6,033,582 A | 3/2000 | Lee |
| 6,037,243 A | 3/2000 | Ha |
| 6,046,466 A | 4/2000 | Ishida |
| 6,074,892 A | 6/2000 | Bowers |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto |
| 6,463,204 B1 | 10/2002 | Ati |
| 6,542,231 B1 | 4/2003 | Garrett |
| 6,563,995 B2 | 5/2003 | Kane |
| 6,566,723 B1 | 5/2003 | Vook |
| 6,680,216 B2 | 1/2004 | Kwasnick |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang |
| 7,306,963 B2 | 12/2007 | Linden |
| 7,307,327 B2 | 12/2007 | Bahl |
| 7,311,889 B2 | 12/2007 | Awano |
| 7,326,915 B2 | 2/2008 | Kaluzhny |
| 7,330,404 B2 | 2/2008 | Peng |
| 7,335,962 B2 | 2/2008 | Mouli |
| 7,336,860 B2 | 2/2008 | Cyr |
| 7,339,110 B1 | 3/2008 | Mulligan et al. |
| 7,358,583 B2 | 4/2008 | Reznik |
| 7,381,966 B2 | 6/2008 | Starikov |
| 7,388,147 B2 * | 6/2008 | Mulligan et al. ............... 136/256 |
| 7,416,911 B2 | 8/2008 | Heath et al. |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang |
| 7,524,694 B2 | 4/2009 | Adkisson |
| 7,582,587 B2 | 9/2009 | Dufresne |
| 7,582,857 B2 | 9/2009 | Gruev et al. |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa et al. |
| 7,655,860 B2 | 2/2010 | Parsons |
| 7,663,202 B2 | 2/2010 | Wang et al. |
| 7,692,860 B2 | 4/2010 | Sato et al. |
| 7,704,806 B2 | 4/2010 | Chae |
| 7,713,779 B2 | 5/2010 | Firon et al. |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,888,155 B2 | 2/2011 | Chen |
| 7,902,540 B2 | 3/2011 | Cohen |
| 8,030,729 B2 | 10/2011 | Quitoriano |
| 8,035,184 B1 | 10/2011 | Dutta |
| 8,049,203 B2 | 11/2011 | Samuelson |
| 8,063,450 B2 | 11/2011 | Wernersson |
| 8,067,299 B2 | 11/2011 | Samuelson |
| 8,067,736 B2 | 11/2011 | Gruss |
| 8,084,728 B2 | 12/2011 | Tsang |
| 8,093,675 B2 | 1/2012 | Tsunemi |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjoerk |
| 8,208,776 B2 | 6/2012 | Tokushima |
| 8,212,138 B2 * | 7/2012 | Landis ........................... 136/244 |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu et al. |
| 8,330,090 B2 | 12/2012 | Agarwal |
| 8,384,007 B2 | 2/2013 | Yu et al. |
| 8,455,857 B2 | 6/2013 | Samuelson |
| 8,514,411 B2 | 8/2013 | Wober |
| 8,546,742 B2 | 10/2013 | Wober |
| 8,748,799 B2 | 6/2014 | Wober |
| 8,766,272 B2 | 7/2014 | Yu et al. |

(56) References Cited

U.S. PATENT DOCUMENTS

| | | |
|---|---|---|
| 8,791,470 B2 | 7/2014 | Wober |
| 8,810,808 B2 | 8/2014 | Wober |
| 8,835,831 B2 | 9/2014 | Yu |
| 8,866,065 B2 | 10/2014 | Wober |
| 9,000,353 B2 | 4/2015 | Seo |
| 2002/0003201 A1 | 1/2002 | Yu |
| 2002/0020846 A1 | 2/2002 | Pi et al. |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao et al. |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0011975 A1 | 1/2004 | Nicoli |
| 2004/0021062 A1* | 2/2004 | Zaidi ............... H01L 31/035281 250/214 R |
| 2004/0021602 A1 | 2/2004 | Weckstrom |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea et al. |
| 2004/0109666 A1 | 6/2004 | Kim |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton et al. |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0261840 A1* | 12/2004 | Schmit et al. .................. 136/258 |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst, III |
| 2005/0095699 A1 | 5/2005 | Miyauchi et al. |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar et al. |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1 | 2/2006 | Habib et al. |
| 2006/0113622 A1 | 6/2006 | Adkisson |
| 2006/0121371 A1 | 6/2006 | Wu |
| 2006/0146323 A1 | 7/2006 | Bratkovski |
| 2006/0162766 A1* | 7/2006 | Gee et al. ...................... 136/256 |
| 2006/0180197 A1 | 8/2006 | Gui |
| 2006/0208320 A1 | 9/2006 | Tsuchiya |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn et al. |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya et al. |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee et al. |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0065451 A1 | 3/2008 | For |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |
| 2008/0143906 A1 | 6/2008 | Allemand et al. |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0157253 A1 | 7/2008 | Starikov |
| 2008/0166883 A1 | 7/2008 | Liu et al. |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |

(56) References Cited

U.S. PATENT DOCUMENTS

| | | |
|---|---|---|
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim et al. |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwat et al. |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1* | 2/2009 | Guo et al. ...................... 359/486 |
| 2009/0046749 A1 | 2/2009 | Mizuuchi |
| 2009/0050204 A1 | 2/2009 | Habib |
| 2009/0052029 A1 | 2/2009 | Dai |
| 2009/0057650 A1 | 3/2009 | Lieber |
| 2009/0072145 A1 | 3/2009 | Peczalski et al. |
| 2009/0104160 A1 | 4/2009 | Young |
| 2009/0120498 A1 | 5/2009 | Yamazaki |
| 2009/0121136 A1 | 5/2009 | Gruss et al. |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang et al. |
| 2009/0194160 A1 | 8/2009 | Chin |
| 2009/0199597 A1 | 8/2009 | Danley |
| 2009/0201400 A1 | 8/2009 | Zhang et al. |
| 2009/0206405 A1 | 8/2009 | Doyle |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig et al. |
| 2009/0233445 A1 | 9/2009 | Lee |
| 2009/0242018 A1 | 10/2009 | Ahn |
| 2009/0243016 A1 | 10/2009 | Kawahara et al. |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu et al. |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins et al. |
| 2010/0025710 A1 | 2/2010 | Yamada |
| 2010/0078055 A1 | 4/2010 | Vidu |
| 2010/0090341 A1* | 4/2010 | Wan et al. ...................... 257/749 |
| 2010/0101633 A1* | 4/2010 | Park et al. ...................... 136/249 |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang et al. |
| 2010/0302440 A1 | 12/2010 | Wober |
| 2010/0304061 A1 | 12/2010 | Ye et al. |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su et al. |
| 2011/0049572 A1 | 3/2011 | Jeon |
| 2011/0050042 A1 | 3/2011 | Choi et al. |
| 2011/0057231 A1 | 3/2011 | Jeon |
| 2011/0057234 A1 | 3/2011 | Jeon |
| 2011/0057286 A1 | 3/2011 | Jeon |
| 2011/0080508 A1 | 4/2011 | Katsuno et al. |
| 2011/0084212 A1 | 4/2011 | Clark |
| 2011/0127490 A1 | 6/2011 | Mi |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0146771 A1 | 6/2011 | Chuang et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0220191 A1 | 9/2011 | Flood |
| 2011/0226937 A1 | 9/2011 | Yu |
| 2011/0248315 A1* | 10/2011 | Nam et al. ...................... 257/184 |
| 2011/0249219 A1* | 10/2011 | Evans et al. ...................... 349/63 |
| 2011/0249322 A1 | 10/2011 | Wang |
| 2011/0253982 A1 | 10/2011 | Wang et al. |
| 2011/0272014 A1 | 11/2011 | Mathai et al. |
| 2011/0297214 A1 | 12/2011 | Kim |
| 2011/0309237 A1 | 12/2011 | Seo et al. |
| 2011/0309240 A1 | 12/2011 | Yu et al. |
| 2011/0309331 A1 | 12/2011 | Yu |
| 2011/0315988 A1 | 12/2011 | Yu et al. |
| 2011/0316106 A1 | 12/2011 | Kim |
| 2012/0006390 A1 | 1/2012 | Huo et al. |
| 2012/0009714 A1 | 1/2012 | Mouli |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1 | 6/2012 | Yu |
| 2012/0192939 A1 | 8/2012 | Tamboli et al. |
| 2012/0196401 A1* | 8/2012 | Graham et al. ...................... 438/98 |
| 2012/0240999 A1 | 9/2012 | Yoshida |
| 2012/0258563 A1 | 10/2012 | Ogino |
| 2012/0280345 A1 | 11/2012 | Zhu |
| 2012/0298843 A1 | 11/2012 | Yu |

(56) References Cited

U.S. PATENT DOCUMENTS

| | | |
|---|---|---|
| 2012/0313078 A1 | 12/2012 | Fukui |
| 2012/0318336 A1 | 12/2012 | Hekmatshoar-Tabari |
| 2012/0322164 A1 | 12/2012 | Lal |
| 2013/0000704 A1 | 1/2013 | Fogel |
| 2013/0037100 A1 | 2/2013 | Platzer Bjorkman |
| 2013/0112256 A1 | 5/2013 | Yu |
| 2013/0125965 A1 | 5/2013 | Hazeghi |
| 2013/0174904 A1 | 7/2013 | Yamasaki |
| 2013/0220406 A1 | 8/2013 | Day |
| 2013/0341749 A1 | 12/2013 | Yu |
| 2014/0096816 A1 | 4/2014 | Atwater et al. |
| 2014/0117401 A1 | 5/2014 | Herner |

FOREIGN PATENT DOCUMENTS

| | | |
|---|---|---|
| CN | 100568516 | 12/2009 |
| CN | 101675522 | 3/2010 |
| CN | 101681941 | 3/2010 |
| EP | 0809303 B1 | 9/2006 |
| FR | 2923651 | 5/2009 |
| GB | 2348399 A | 4/2000 |
| JP | 359013708 A | 1/1984 |
| JP | 59198413708 | 1/1984 |
| JP | 2000324396 | 11/2000 |
| JP | 2002151715 | 5/2002 |
| JP | 2005252210 | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2013513253 | 4/2013 |
| JP | 2013513254 | 4/2013 |
| TW | I318418 | 5/2004 |
| TW | 200535914 | 11/2005 |
| TW | 200536048 | 11/2005 |
| TW | 200742115 | 4/2007 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | 201027730 | 7/2010 |
| TW | 201034172 | 9/2010 |
| TW | 201044610 | 12/2010 |
| TW | 201140859 | 11/2011 |
| WO | 8603347 | 6/1986 |
| WO | 0002379 | 1/2000 |
| WO | 0269623 | 9/2002 |
| WO | WO 03107439 A1 * | 12/2003 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 20080131313 | 12/2008 |
| WO | 2009099841 | 8/2009 |
| WO | 2009116018 | 9/2009 |
| WO | 2009/137241 A2 | 11/2009 |
| WO | 2010/019887 A1 | 2/2010 |
| WO | 2010039631 | 4/2010 |
| WO | 2011074457 | 6/2011 |

OTHER PUBLICATIONS

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

"CMOS image sensor pixel optical efficiency and optical crosstalk optimization using FDTD Solutions" www.lumerical.com/fdtd_microlens/cmos_image_sensor_pixel_microlens.php, Mar. 19, 2009.

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.

Baillie et al., 'Zero-space microlenses for CMOS image sensors: optical modeling and lithographic process development', Publication Date May 2004, http://adsabs.harvard.edu/abs/2004SPIE.5377..953B, pp. 1-2.vbTab.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Chung, Sung-Wook et al. Silicon Nanowire Devices. Applied Physics Letters, vol. 76, No. 15 (Apr. 10, 2000), pp. 2068-2070.

Deptuch et al., Vertically Integrated Circuits at Fermilab, IEEE Transactions on Nuclear Science, Aug. 2010, vol. 54, Issue 4, pp. 2178-2186.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.

Furumiya, et al. "High-sensitivity and no-crosstalk pixel technology for embedded CMOS image sensor"; IEEE Electron Device Letters, vol. 48, No. 10, Oct. 2001.

Gadelrab et al., The Source-Gated Amorphous Silicon Photo-Transistor, IEEE Transactions on Electron Devices, Oct. 1997, vol. 44, No. 10, pp. 1789-1794.

Gambino et al., 'CMOS Imager with Copper Wiring and Lightpipe,' Electron Devices Meeting, 2006. IEDM '06, International Publication Date: Dec. 11-13, 2006, pp. 1-4.

Ge et al., Orientation-Controlled Growth of Single-Crystal Silicon-Nanowire Arrays, Advanced Materials, Jan. 18, 2005, vol. 17, No. 1, pp. 56-61.

Guillaumée, et al., Polarization Sensitive Silicon Photodiodes Using Nanostructured Metallic Grids, Applied Physics Letters 94, 2009.

Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.

Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.

Hochbaum et al., Controlled Growth of Si Nanowire Arrays for Device Integration, Nano Letters, Mar. 2005, vol. 5, No. 3, pp. 457-460.

Holmes et al., Control of Thickness and Orientation of Solution-Grown Silicon Nanowires, Science, Feb. 25, 2000, vol. 287, No. 5457, pp. 1471-1473.

International Preliminary Report on Patentability for PCT International Patent Application No. PCT/U62009/055963, mailed Mar. 17, 2011.

(56) References Cited

OTHER PUBLICATIONS

International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.vbTab.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
Jin-Kon Kim; 'New Functional Nanomaterials Based on Block Copolymers' http://www.ziu.edu.cn/adver/subjectizyhd/jz0707061313.html.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et. al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide as Dopant Source for Shallow Doping of Silicon, Meeting Abstract 943, 217th ECS Meeting, MA2010-01, Apr. 25-30, 2010, Vancouver Canada, El—Advanced Gate Stack, Source / Drain, and Channel Engineeringfor Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n Nanowire Photovoltaic Devices. Nano Letters. 2008, vol. 8, No. 10, 3456-3460.
Kim et al., Electronic Structure of Vertically Aligned Mn-Doped $CoFe_2O_4$ Nanowires and Their Application as Humidity Sensors and Photodetectors, Journal of Physical Chemistry C, Apr. 7, 2009.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: <http://spie.org/x40194.xml?ArticleID=x40194>.
Loose et al., CMOS Detector Technology, Scientific Detector Workshop, Sicily, 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N.L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.
Sarkar et. al., Integrated polarization-analyzing CMOS image sensor for detecting incoming light ray direction, Sensors Application Symposium (SAS) p. 194-199, 1010 IEEE.
Schmidt et al., Realization of a Silicon Nanowire Vertical Surround-Gate Field-Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.

(56) References Cited

OTHER PUBLICATIONS

Tseng, et al. 'Crosstalk improvement technology applicable to 0.14μm CMOS image sensor'; IEEE International Electron Devices Meeting, Dec. 13-15, 2004; IEDM Technical Digest, pp. 997-1000. vbTab.
Verheijen, Marcel A. et al. Growth Kinetics of Heterostructured GaP—GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wang, Introduction to Nanotechnology—Where Opportunities arise & Great Future Being Built from Small Things.
Ye et al., Fabrication Techniques of High Aspect Ratio Vertical Lightpipes Using a Dielectric Photo Mask, SPIE, Proceedings, Feb. 2010, vol. 7591.
International Preliminary Report and Written Opinion re PCT/US2010/059491, mailed Jun. 21, 2012.
International Search Report and Written Opinion re PCT/US2011/57325, mailed Jun. 22, 2012.
International Preliminary Report and Written Opinion re PCT/US2010/059468, mailed Jun. 21, 2012.
International Preliminary Report and Written Opinion re PCT/US2010/059504, mailed Jun. 21, 2012.
International Preliminary Report and Written Opinion re PCT/US2010/059496, mailed Jun. 21, 2012.
U.S. Office Action for U.S. Appl. No. 12/573582, dated Jun. 28, 2012.
William Shockley and H. Queisser, Detailed Balance Limit of Efficiency of p-n Junction Solar Cells, J. of Appl. Physics, Mar. 1961, 32(3).
International Preliminary Report on Patentability for PCT International Application No. PCT/US2010/035722, mailed Nov. 3, 2011.
Baomin Wang and Paul W. Leu, Nanotechology 23 (2012) 194003, 7 pages.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Jin-Kon Kim; 'New Functional Nanomaterials Based on Block Copolymers' http://www.ziu.edu.cn/adver/subjectizyhd/jz0707061313.html, Jul. 7, 2011.
Ozgur Yavuzcetin, et al.; 'Index-tuned Anti-reflective Coating using a Nanostructured Metamaterial'; http://www.umass.edu/research/rld/bioportal/vuewlech.php?tid=40, Feb. 28, 2007.
Reynard Corporation; 'Anti-Reflection Coatings (AR)', http://www.reynardcorp.com/coating_anti_reflection.php, undated.
Shimizu et al., Homoepitaxial Growth of Vertical Si Nanowires on Si(100) Substrate using Anodic Aluminum Oxide Template, (abstract only), Materials Research Society, Fall 2007.
Wang, Introduction to Nanotechnology—Where Opportunities arise & Great Future Being Built from Small Things, Fall 2008.
Fang et al., Fabrication of Slantingly-Aligned Silicon Nanowire Arrays for Solar Cell Applications, Nanotechnology, 2008, vol. 19, No. 25.
Garnett et al., Light Trapping in Silicon Nanowire Solar Cells, Nanoletters, Jan. 28, 2010, vol. 10, No. 3, pp. 1082-1087.
Wong et al., Lateral Nanoconcentrator Nanowire Multijunction Photovoltaic Cells, GCEP Progress report, Apr. 20, 2009, pp. 1-18.
Zhang et al., Ultrahigh Responsivity Visible and Infrared Detection Using Silicon Nanowire Phototransistors, Nanoletters, May 14, 2010, vol. 10, No. 6, pp. 2117-2120.
U.S. Office Action for U.S. Appl. No. 13/494,661, notification date Nov. 7, 2012.
U.S. Office Action for U.S. Appl. No. 13/966,573, dated Aug. 6, 2013, 13 pages.
U.S. Office Action for U.S. Appl. No. 12/966,514, dated Aug. 15, 2013, 17 pages.
U.S. Office Action for U.S. Appl. No. 12/633,313, dated Aug. 1, 2013, 20 pages.
U.S. Office Action for U.S. Appl. No. 13/048,635, mailed Jun. 6, 2013, 24 pages.
U.S. Office Action for U.S. Appl. No. 12/966,535, mailed Jun. 14, 2013, 22 pages.
Taiwanese Office Action of Taiwan Patent Application No. 099116881, issued Jul. 18, 2013 (8 pages).
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/966,514, mailed Feb. 25, 2014.
U.S. Office Action for U.S. Appl. No. 12/945,492 mailed May 13, 2014.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 13/106,851 mailed May 29, 2014.
U.S. Office Action for U.S. Appl. No. 13/556,041 mailed Jun. 12, 2014.
Office Action issued on Jun. 19, 2014 in Taiwanese Application No. 099133891.
U.S. Office Action for U.S. Appl. No. 12/633,313 mailed Aug. 1, 2014.
U.S. Office Action for U.S. Appl. No. 13/693,207 mailed Oct. 9, 2014.
U.S. Office Action for U.S. Appl. No. 12/966,514 mailed Sep. 23, 2014.
Berstein et al., "Modern Physics", Chapter 14, Section 6, pp. 420-421, 2000, Prentice-Hall, Inc.
Notice of Allowance issued on Dec. 1, 2014 in U.S. Appl. No. 12/910,664.
U.S. Office Action for U.S. Appl. No. 13/543,307 mailed Dec. 24, 2014.
U.S. Office Action for U.S. Appl. No. 14/274,448 mailed Dec. 5, 2014.
International Search Report and Written Opinion for International Application No. PCT/US2014/056558 mailed Dec. 12, 2014.
Office Action issued on Nov. 11, 2014 in Taiwanese Application No. 098129911.
Notice of Allowance issued Jan. 30, 2015 in U.S. Appl. No. 14/487,375.
International Search Report and Written Opinion for International Application No. PCT/US2014/050544 mailed Jan. 9, 2015.
Office Action for U.S. Appl. No. 12/945,492 mailed Jan. 16, 2015.
Office Action for U.S. Appl. No. 13/963,847 mailed Mar. 12, 2015.
Office Action for U.S. Appl. No. 12/966,514 mailed Mar. 10, 2015.
Office Action issued on Jan. 16, 2015 in Chinese Application No. 201180054442.9.

(56) References Cited

OTHER PUBLICATIONS

Bernstein et al. "Modern Physics", Chapter 14, Section 6, pp. 420-421, 2000 by Prentice-Hall Inc.
Office Action issued Feb. 23, 2015 in U.S. Appl. No. 13/925,429.
Office Action issued on Mar. 4, 2015 in U.S. Appl. No. 13/556,041.
Office Action for U.S. Appl. No. 13/693,207 mailed May 7, 2015.
Kim, Y.S. et al., "ITO/AU/ITO multilayer thin films for transparent conducting electrode applications", Applied Surface Science, vol. 254 (2007), pp. 1524-1527.
Philipp, H.R. et al., "Optical Constants of Silicon in the Region 1 to 10 ev", Physical Review, vol. 120, No. 1, pp. 37-38.
Office Action for U.S. Appl. No. 13/543,307 mailed Apr. 17, 2015.
Office Action issued Mar. 19, 2015 in Chinese Application No. 201180065814.8.
Office Action for U.S. Appl. No. 13/288,131 mailed Apr. 17, 2015.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Office Action issued Aug. 12, 2015 in Chinese Application No. 201180054442.9.
Office Action mailed Sep. 30, 2015 in Japanese Application No. 2014-094365.
Office Action for U.S. Appl. No. 14/450,812 mailed Jul. 23, 2015.
Office Action for U.S. Appl. No. 14/293,164 mailed Aug. 14, 2015.
Kosonocky, et al., 160×244 Element PtSi Schottky-Barrier IR-CCD Image Sensor, IEEE Transactions on Electron Devices, vol. Ed-32, No. 8, Aug. 1985.
Office Action issued on Mar. 18, 2015 in Chinese Application No. 201180066970.6.
Office Action issued Apr. 3, 2015 in Chinese Application No. 201180051048.X.
Office Action issued May 15, 2015 in U.S. Appl. No. 14/274,448.
Office Action for U.S. Appl. 12/982,269 mailed May 22, 2015.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Office Action issued Jul. 9, 2015 in Taiwanese Application No. 102124069.
A. Gu et al., "Design and growth of III-V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 12/945,429 mailed Sep. 4, 2015.
Office Action for U.S. Appl. No. 14/450,812 mailed Oct. 28, 2015.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
Office Action issued Dec. 28, 2015 in Taiwanese Application No. 102149110.
Office Action issued Dec. 25, 2015 in Chinese Application No. 201410264248.9.
Office Action issued Dec. 30, 2015 in Taiwanese Application No. 104123757.
International Search Report and Written Opinion mailed Nov. 27, 2015 in International Application PCT/US2015/038999.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.
Office Action issued on Nov. 27, 2015 in Taiwanese Application No. 100138526.
International Search Report and Written Opinion mailed Jan. 8, 2016 in International Application No. PCT/US2015/055728.
Office Action issued Jan. 4, 2016 in U.S. Appl. No. 14/311,954.
Office Action issued Jan. 5, 2016 in U.S. Appl. No. 14/291,888.
Office Action issued Nov. 9, 2015 in U.S. Appl. No. 14/503,598.
Office Action issued Jan. 15, 2016 in U.S. Appl. No. 14/632,739.
Office Action issued Jan. 4, 2016 in U.S. Appl. No. 14/293,164.
Office Action issued Jan. 7, 2016 in U.S. Appl. No. 14/322,503.
Office Action issued Jan. 14, 2016 in U.S. Appl. No. 14/459,398.

* cited by examiner

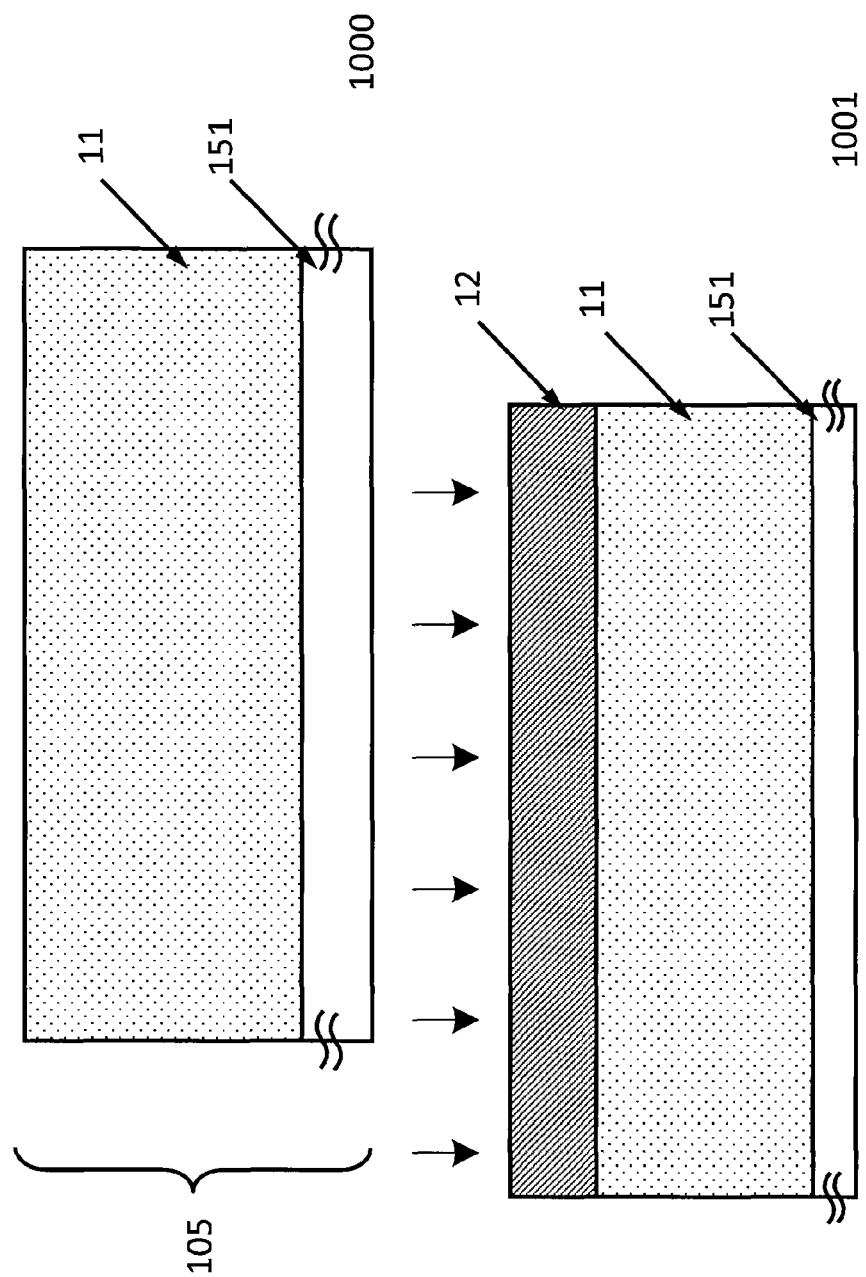

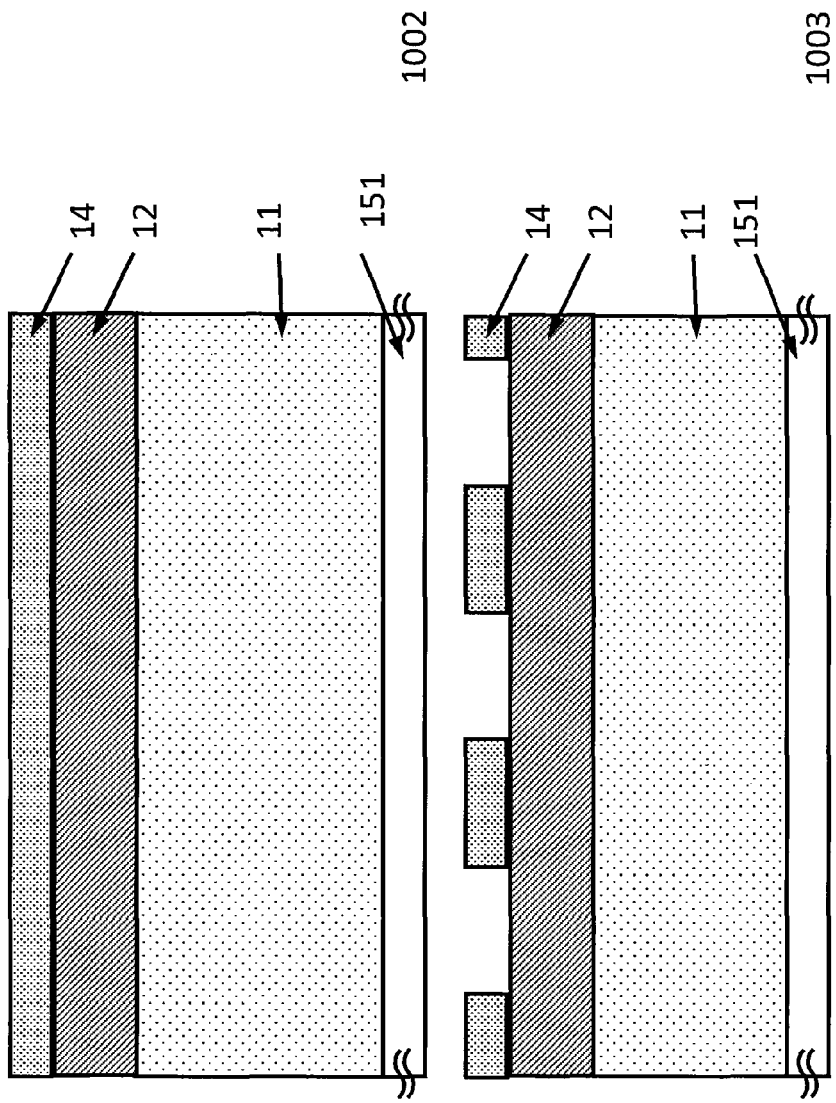
Fig. 1B, Cont.

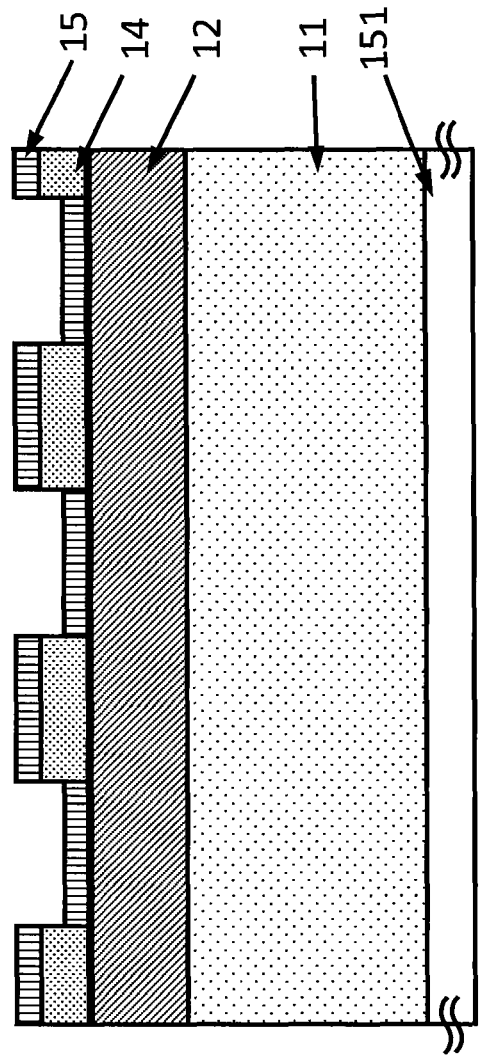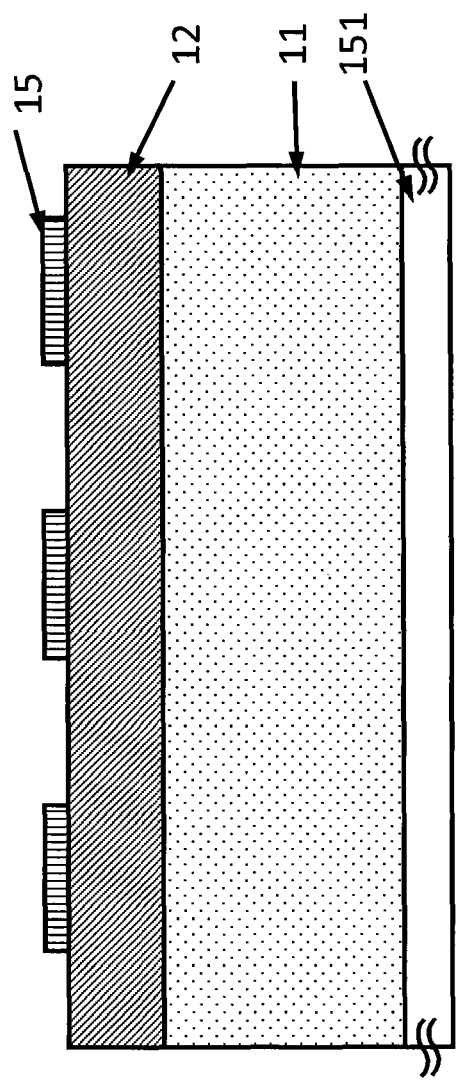
Fig. 1B, Cont.

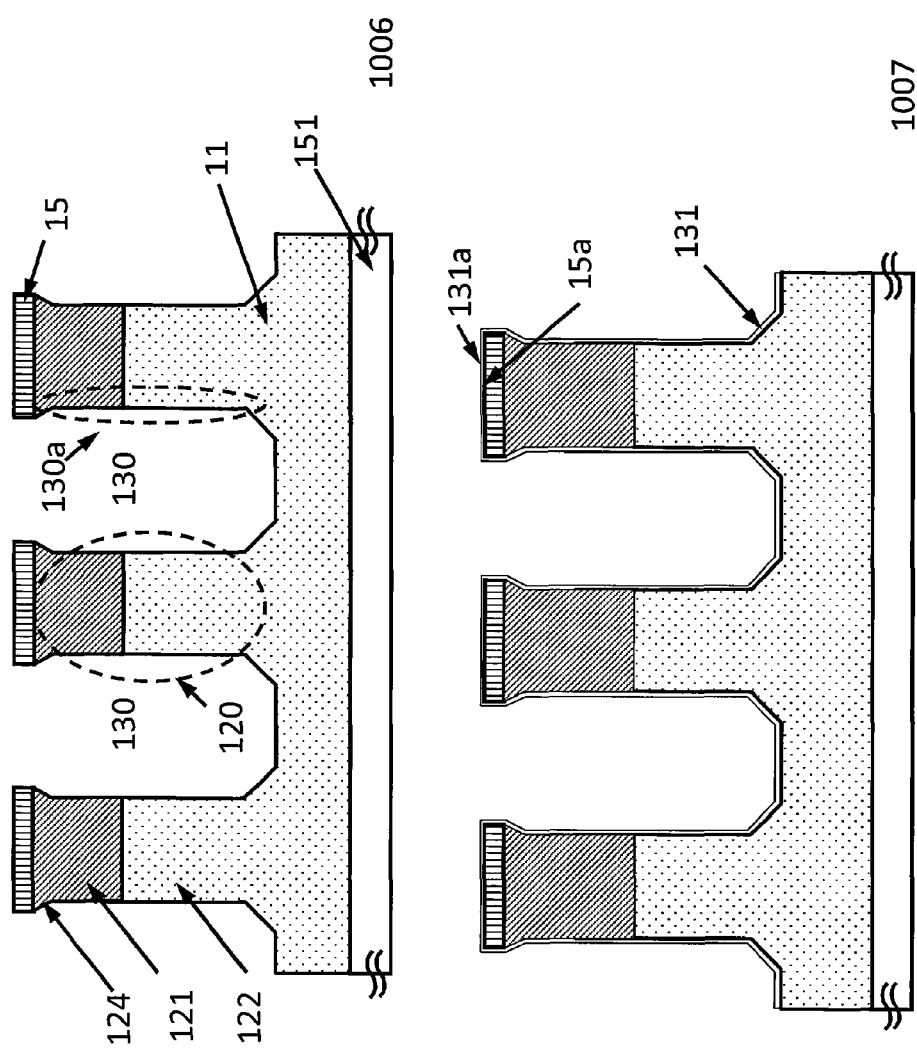
Fig. 1B, Cont.

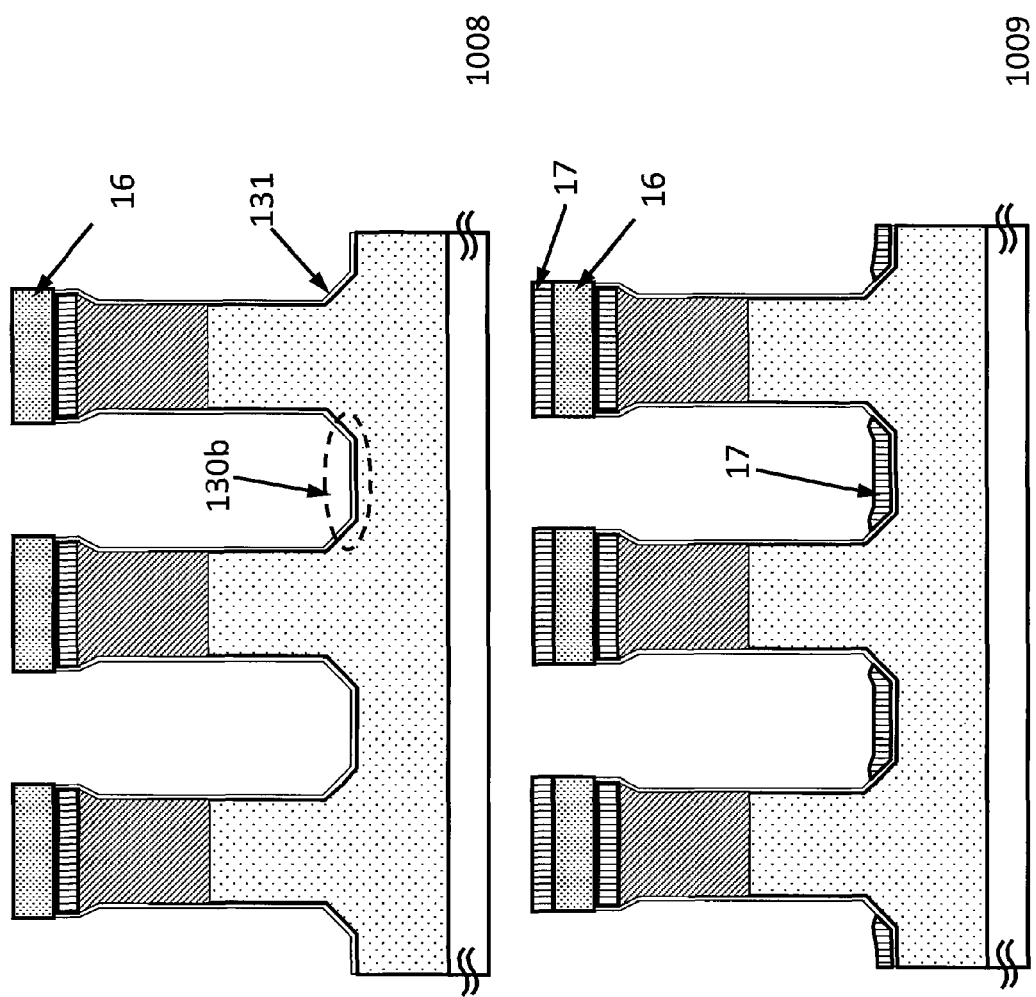

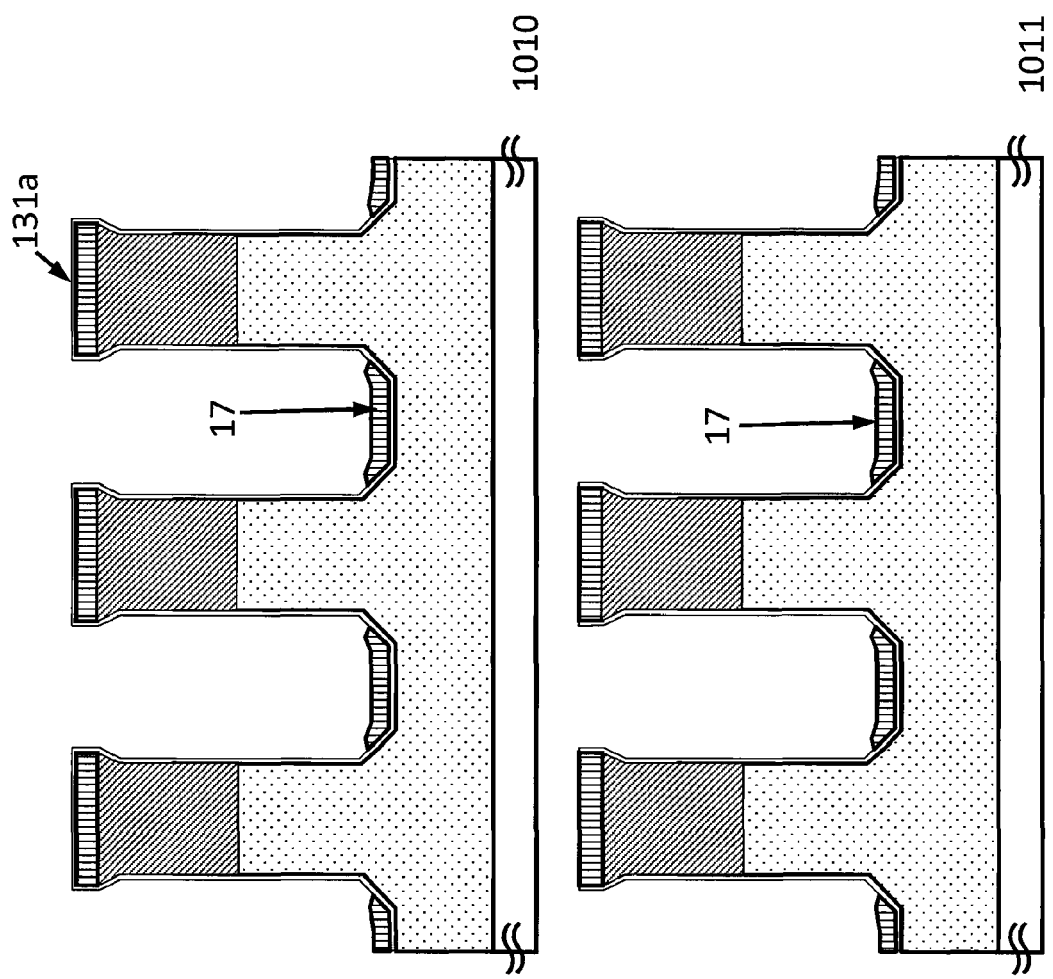
Fig. 1B, Cont.

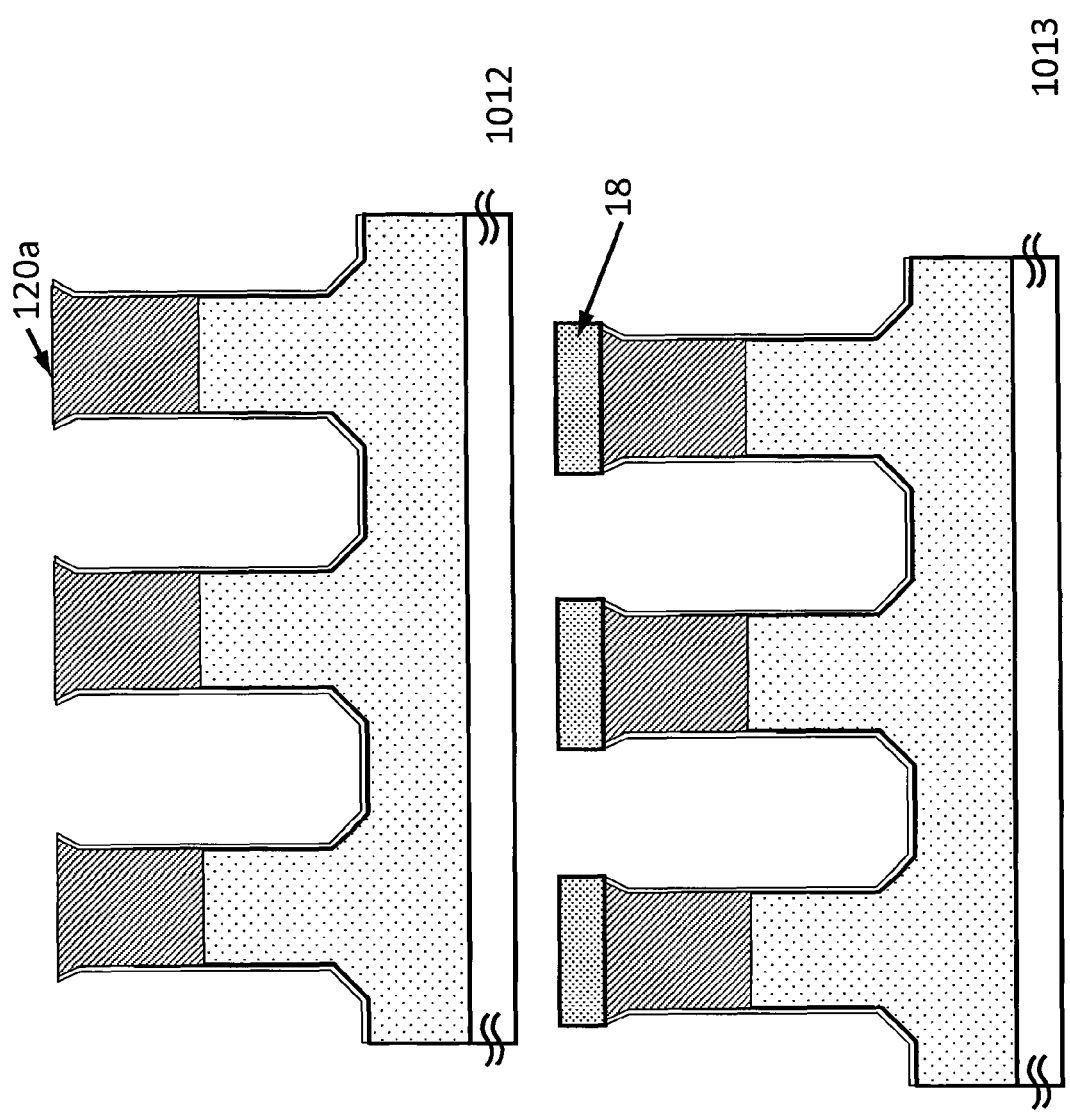

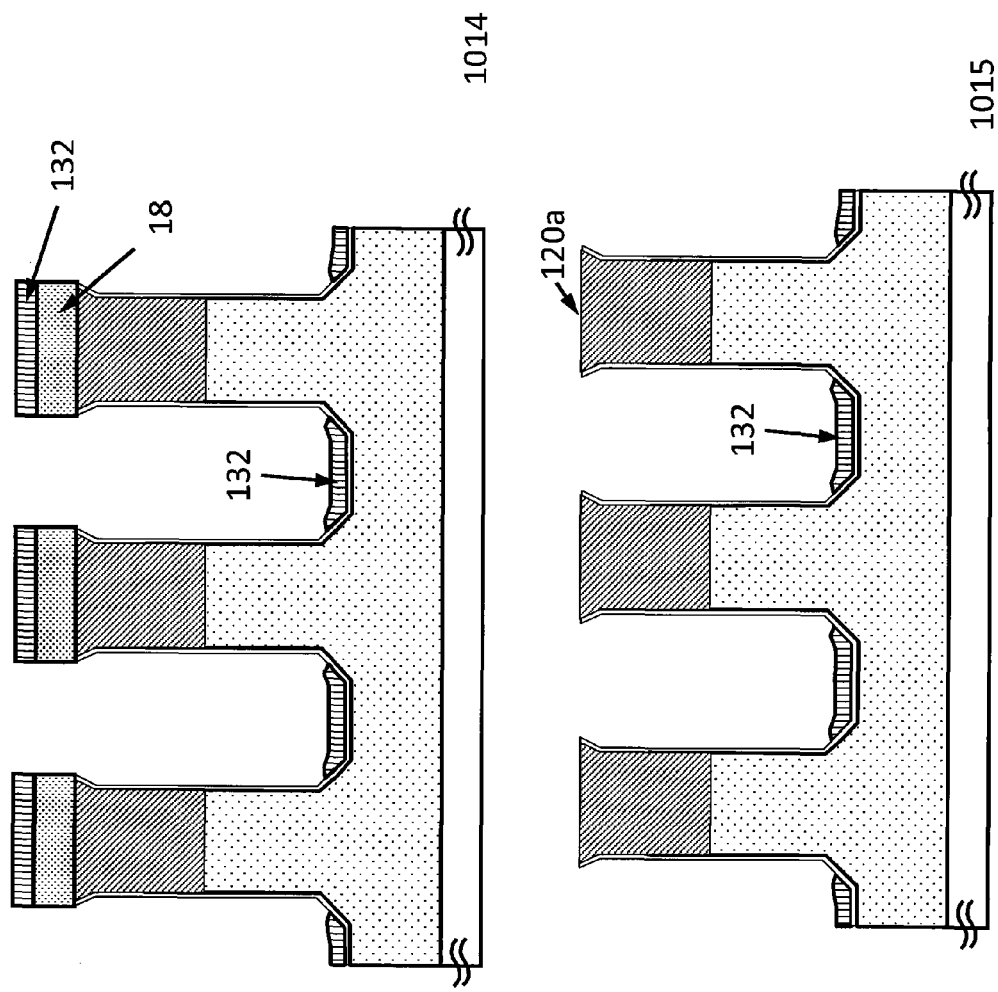

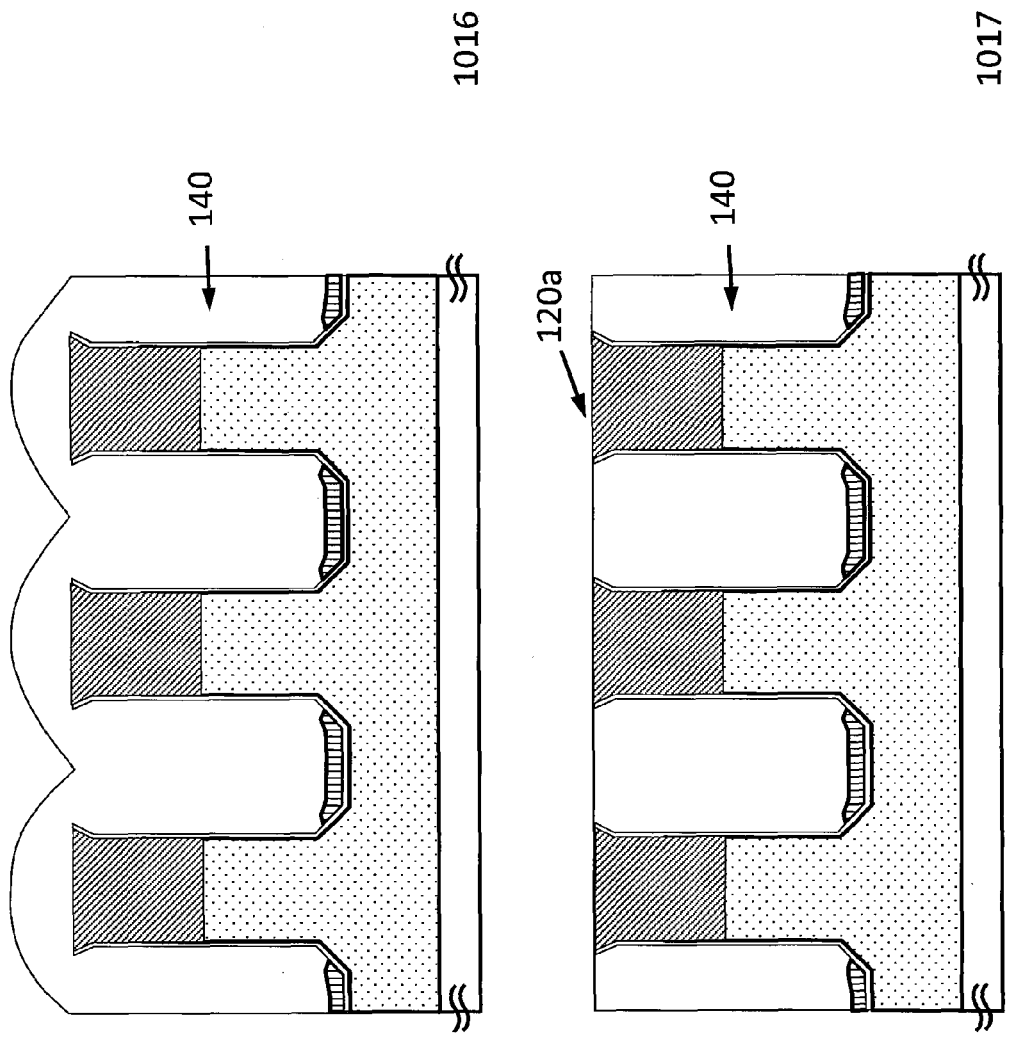
Fig. 1B, Cont.

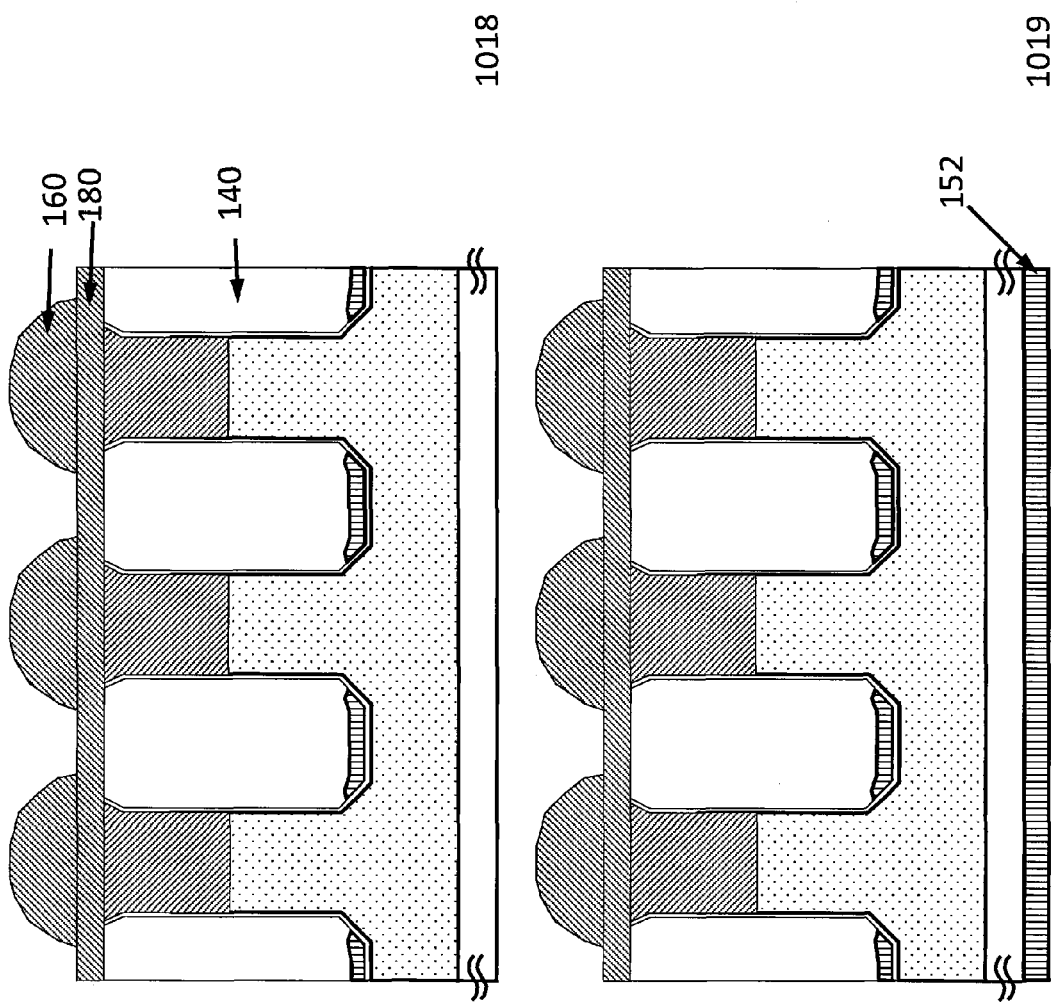

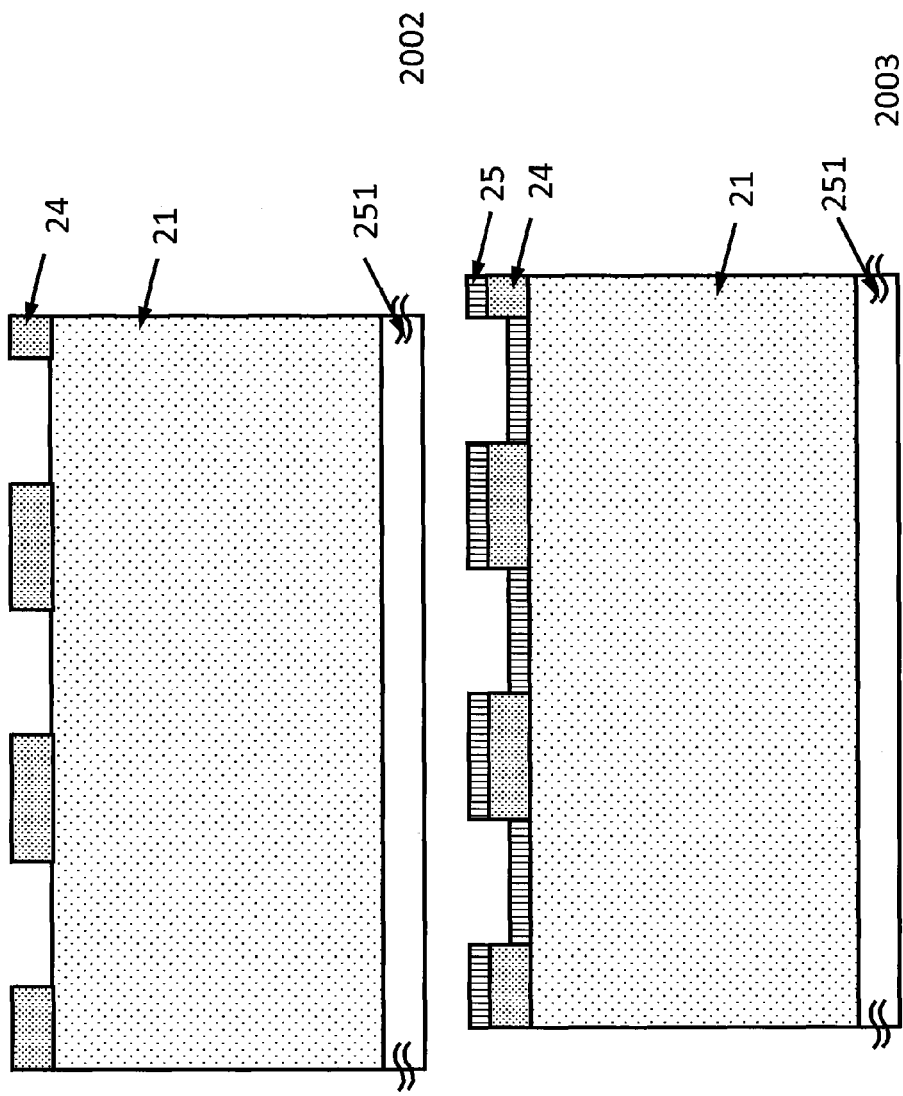
Fig. 2B, Cont.

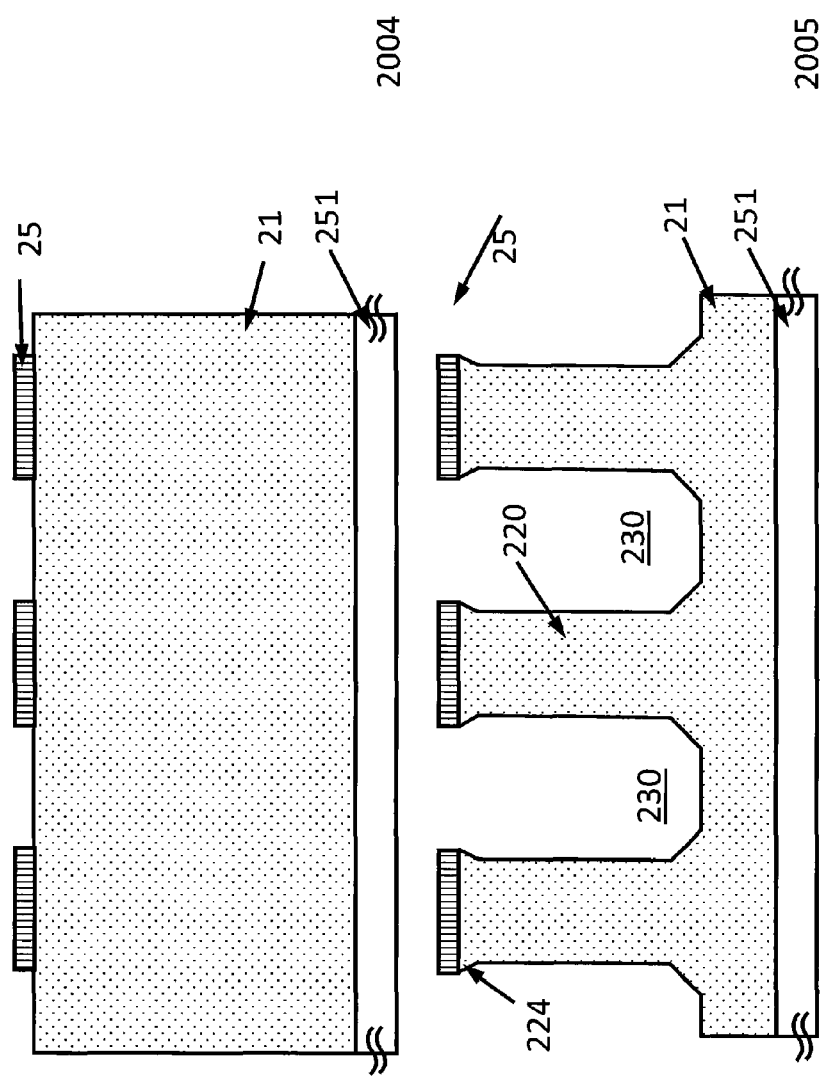
Fig. 2B, Cont.

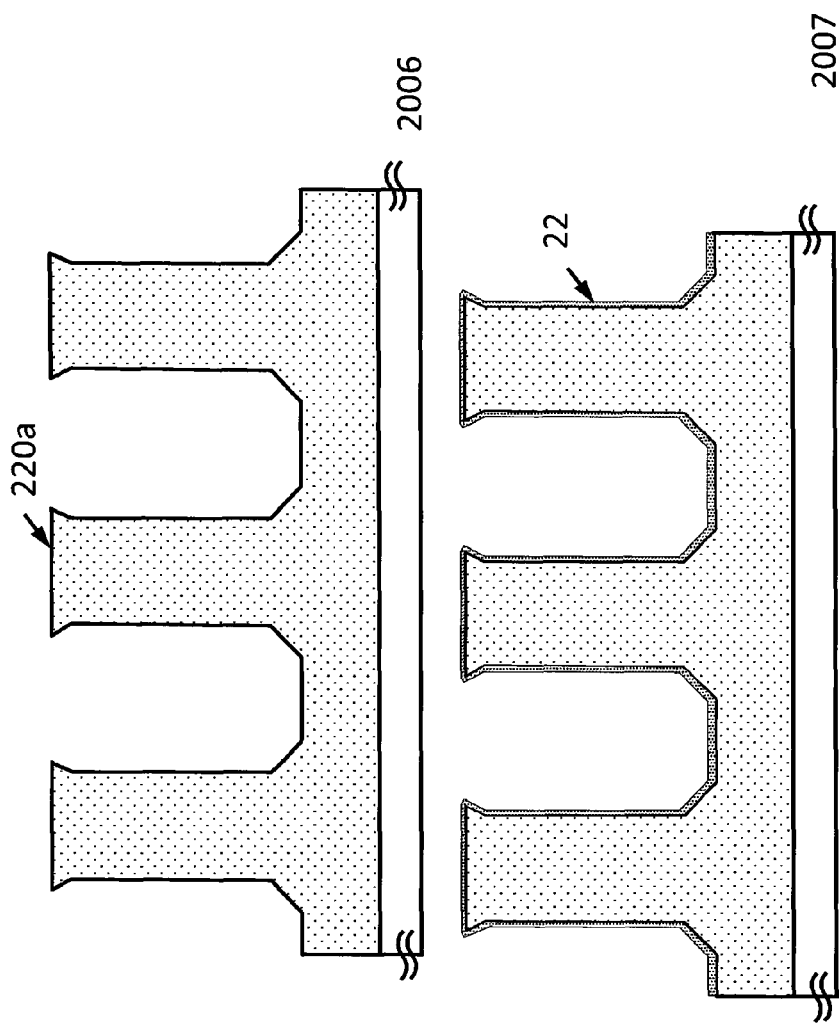
Fig. 2B, Cont.

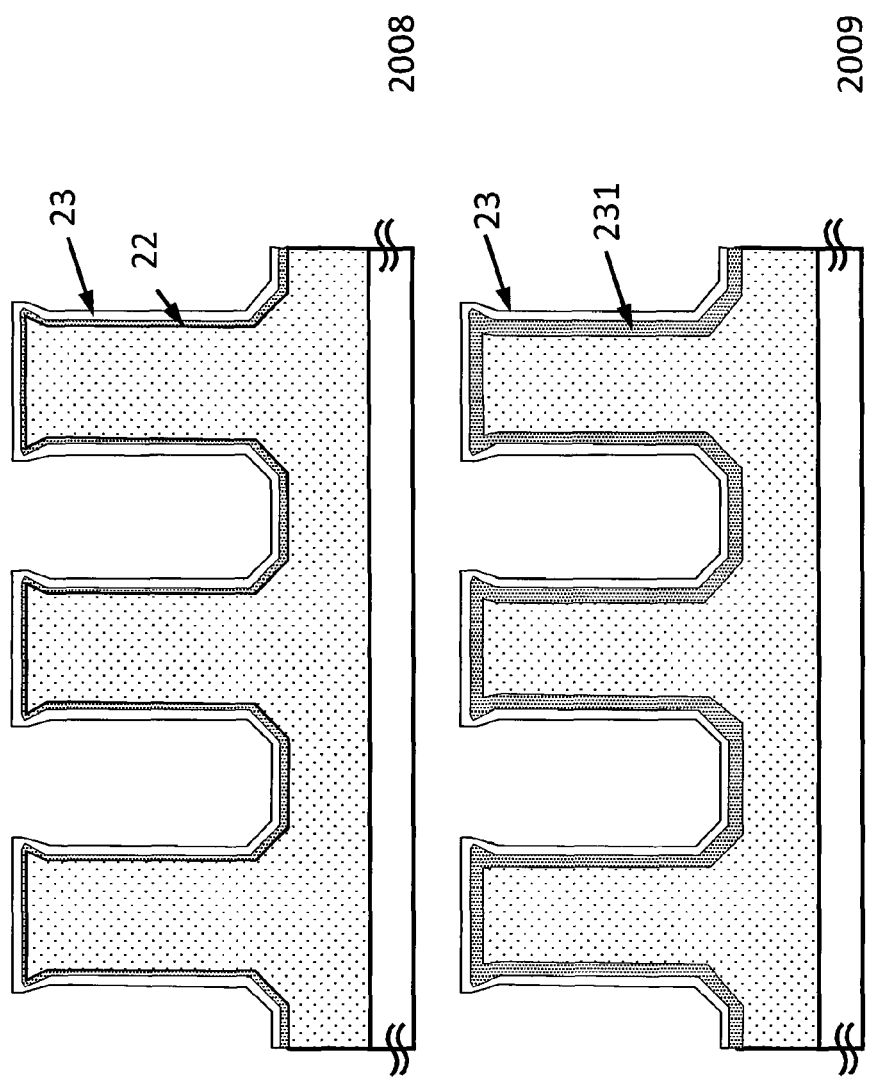
Fig. 2B, Cont.

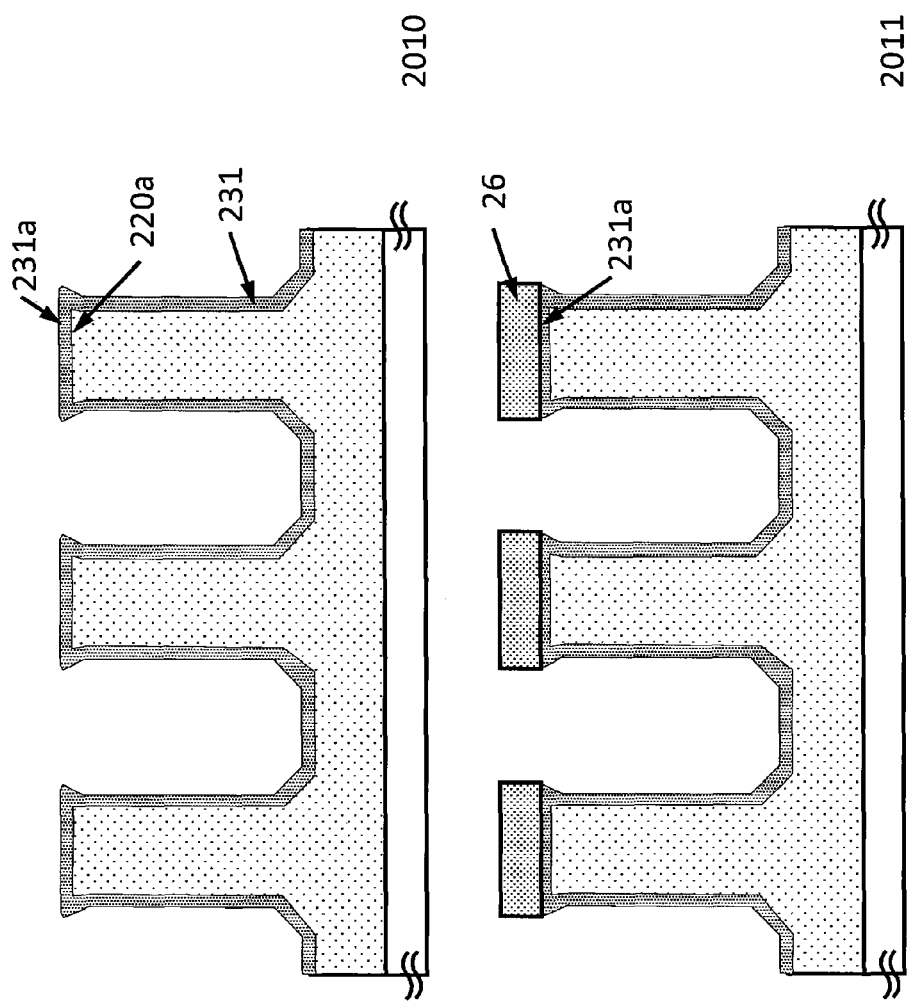

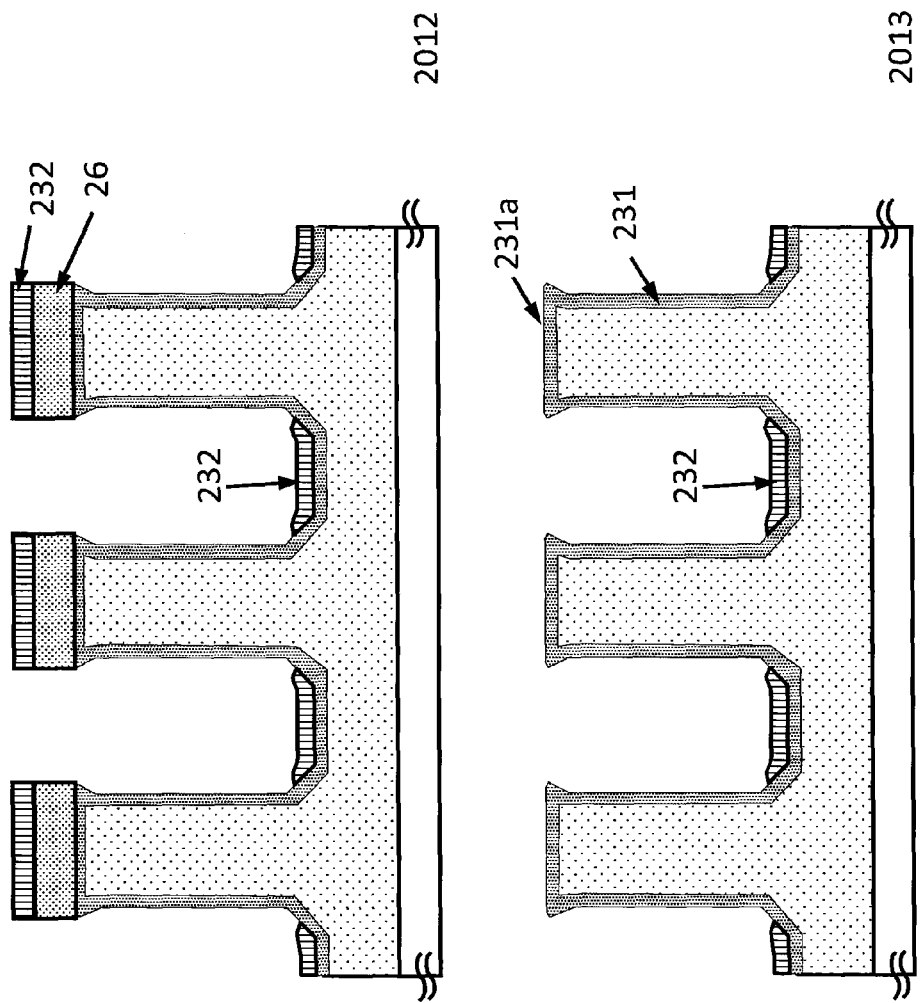

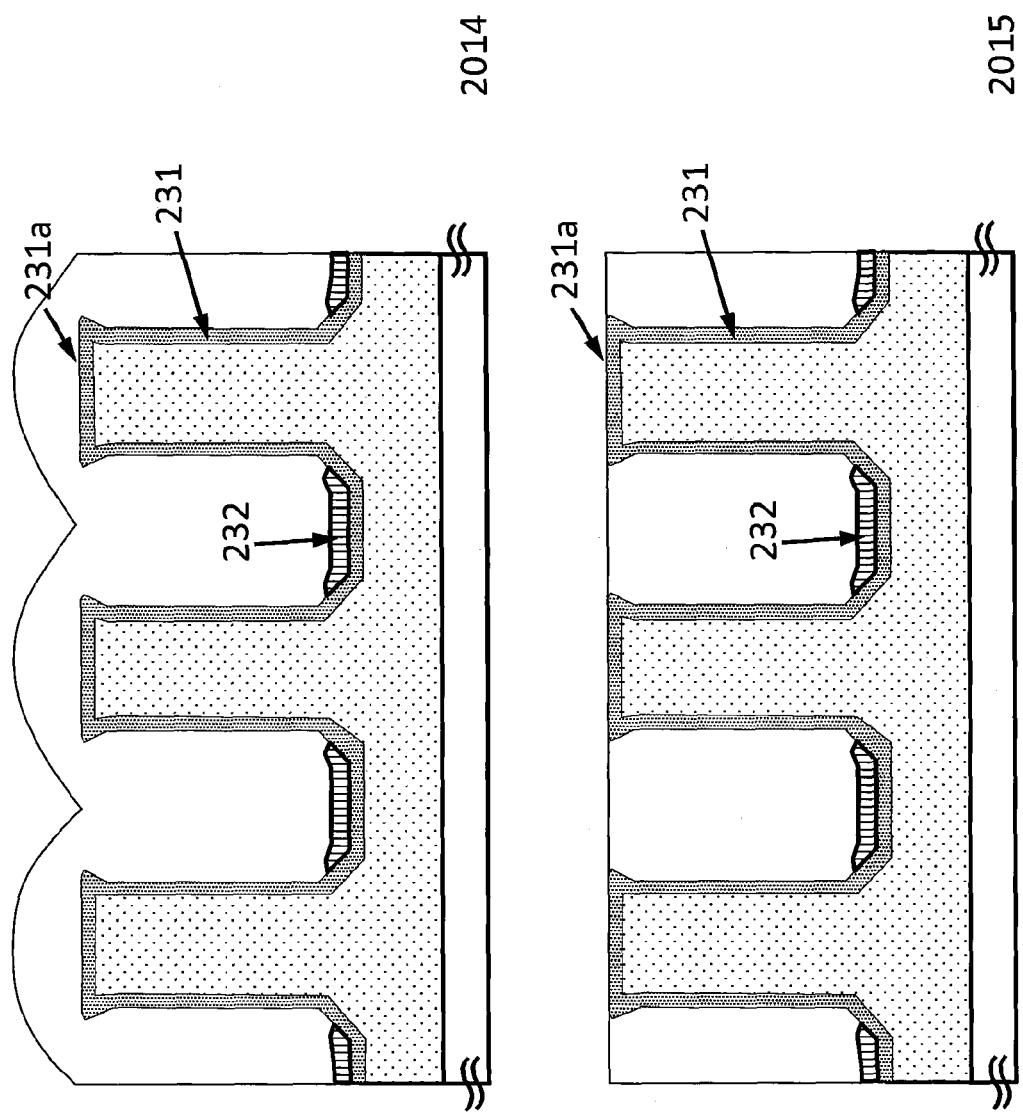

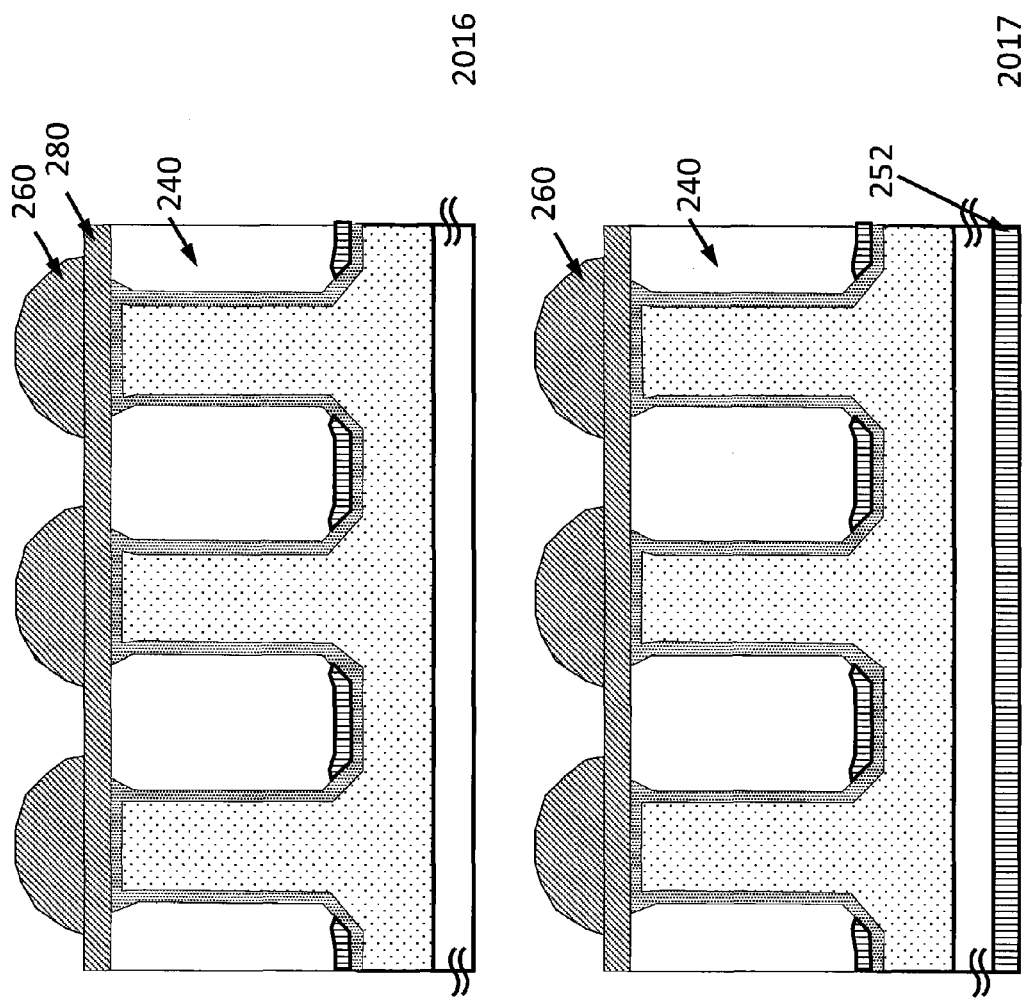

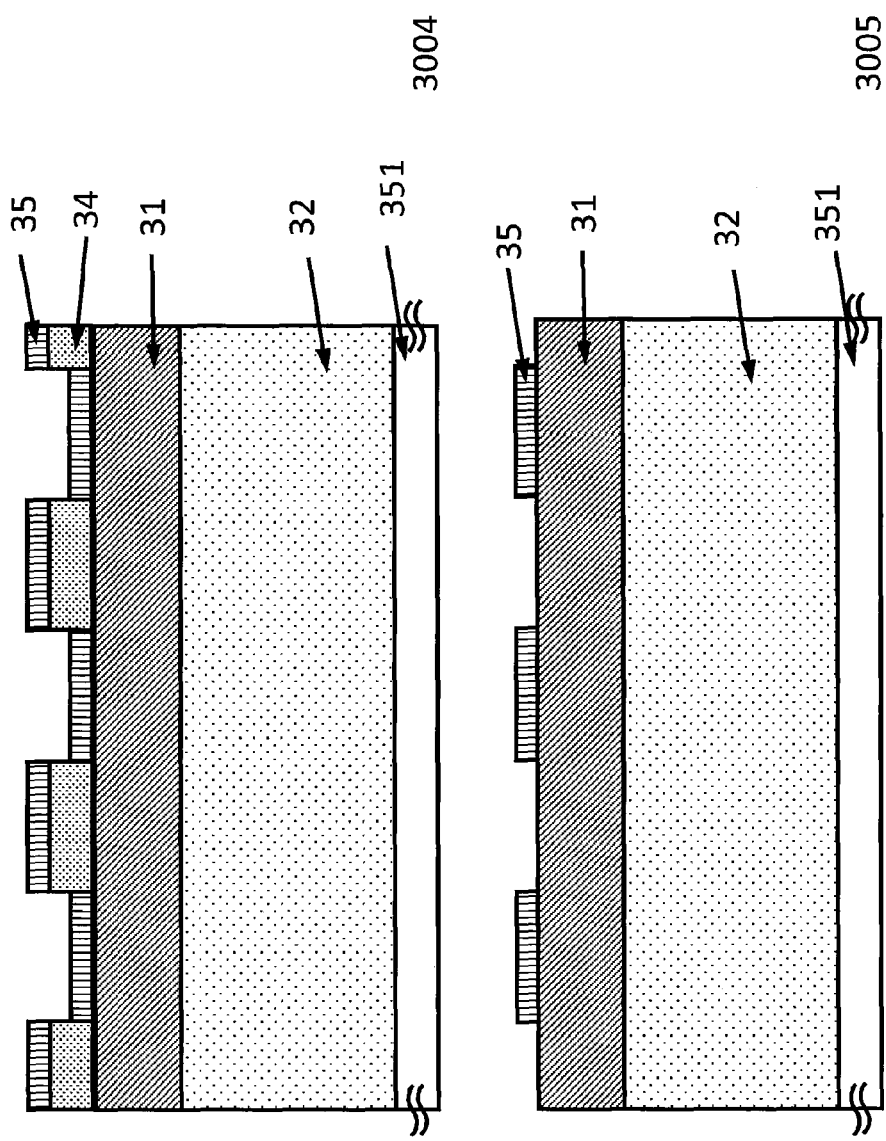
Fig. 3B, Cont.

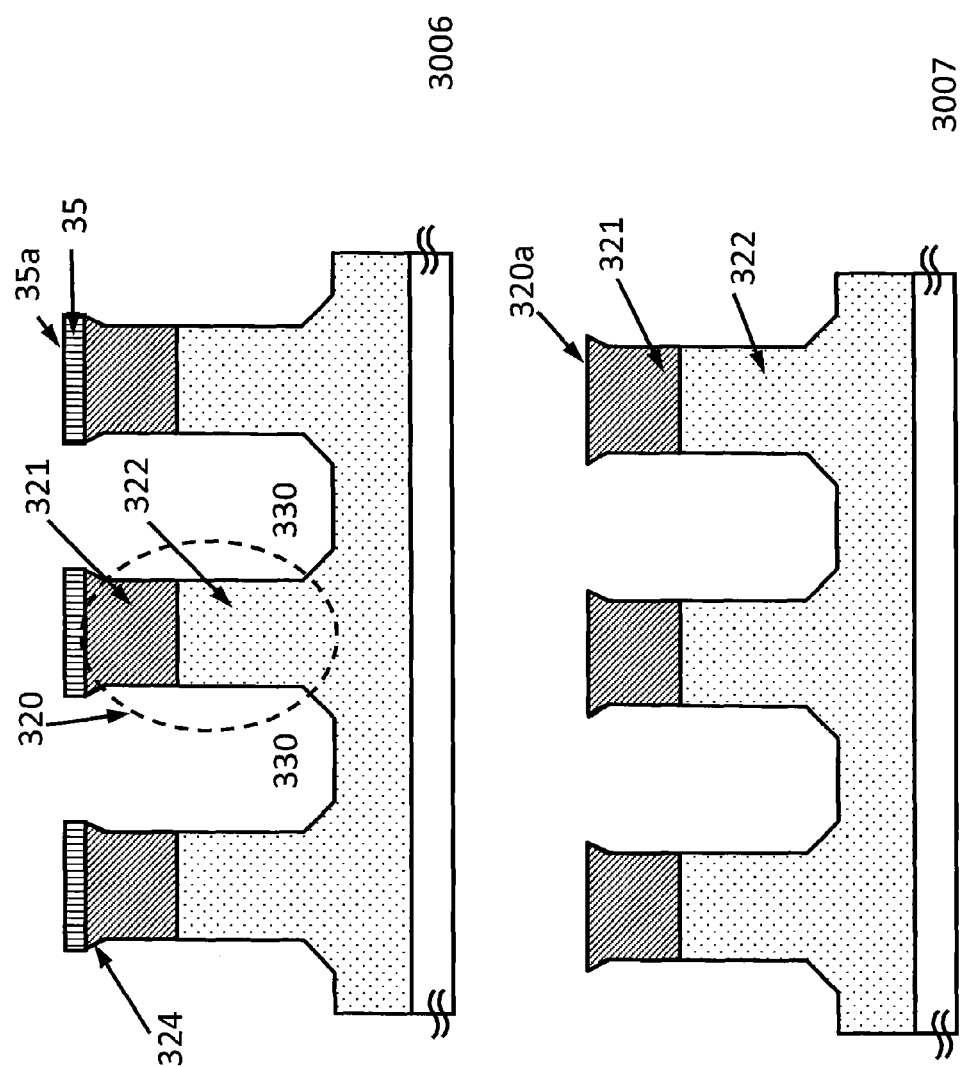
Fig. 3B, Cont.

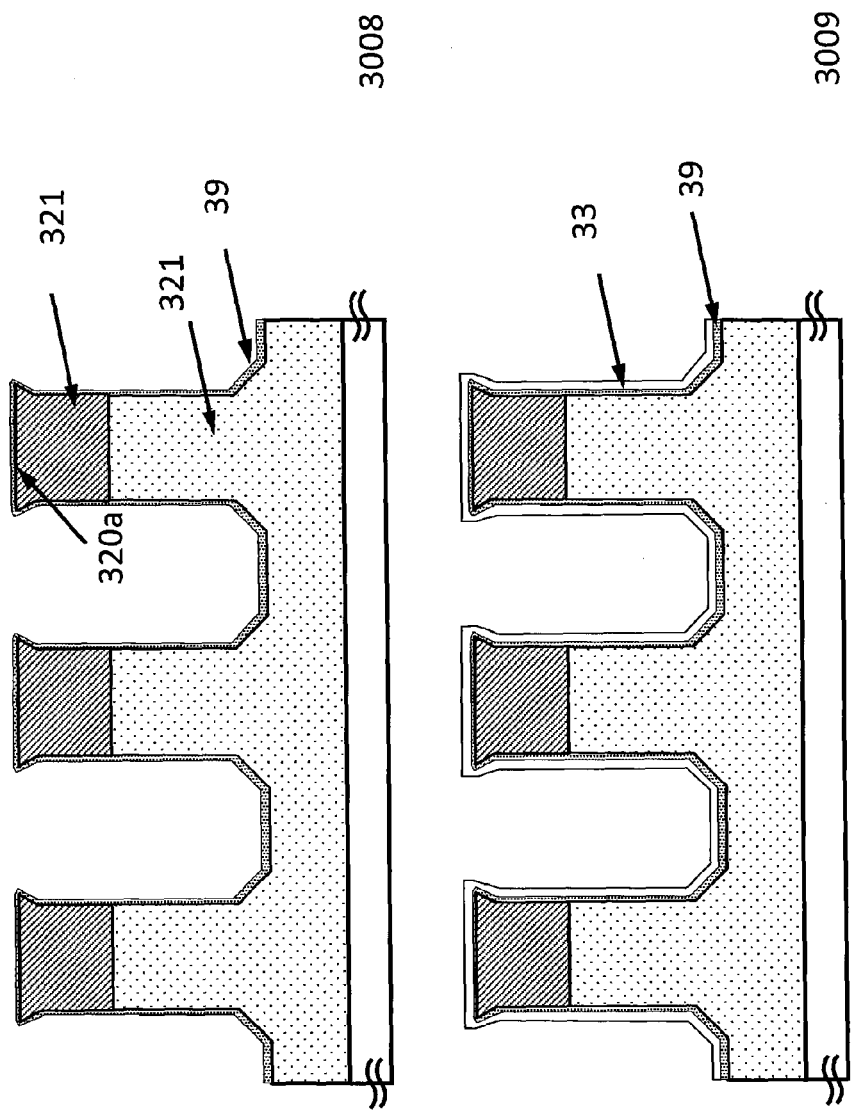
Fig. 3B, Cont.

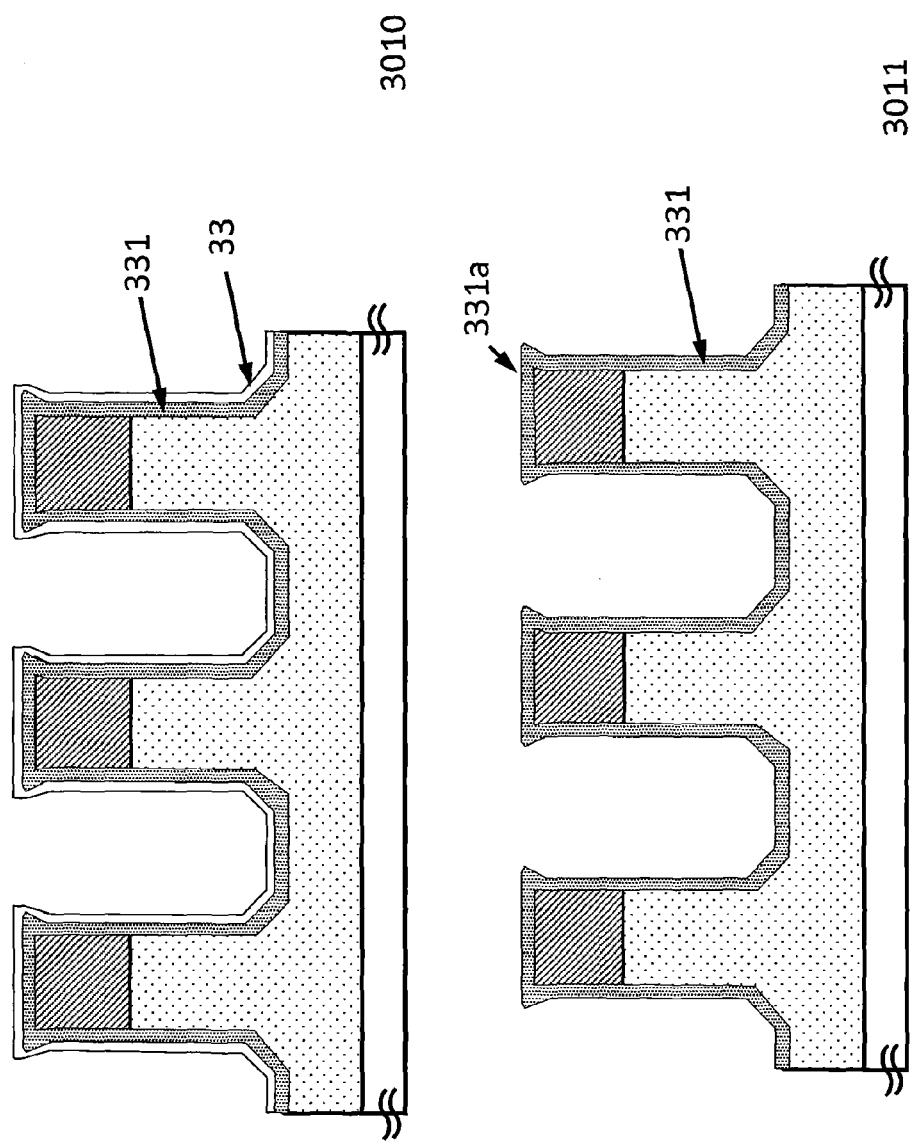

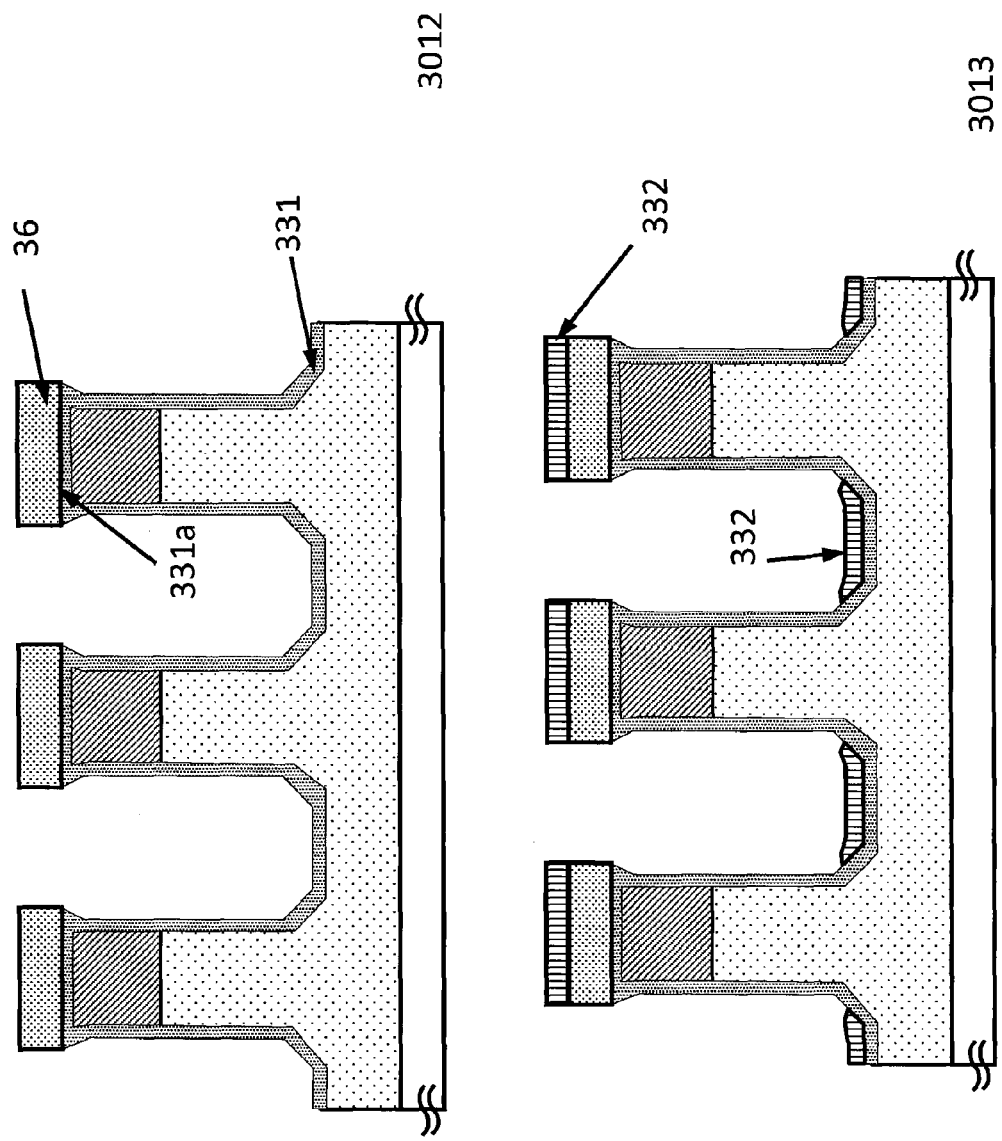
Fig. 3B, Cont.

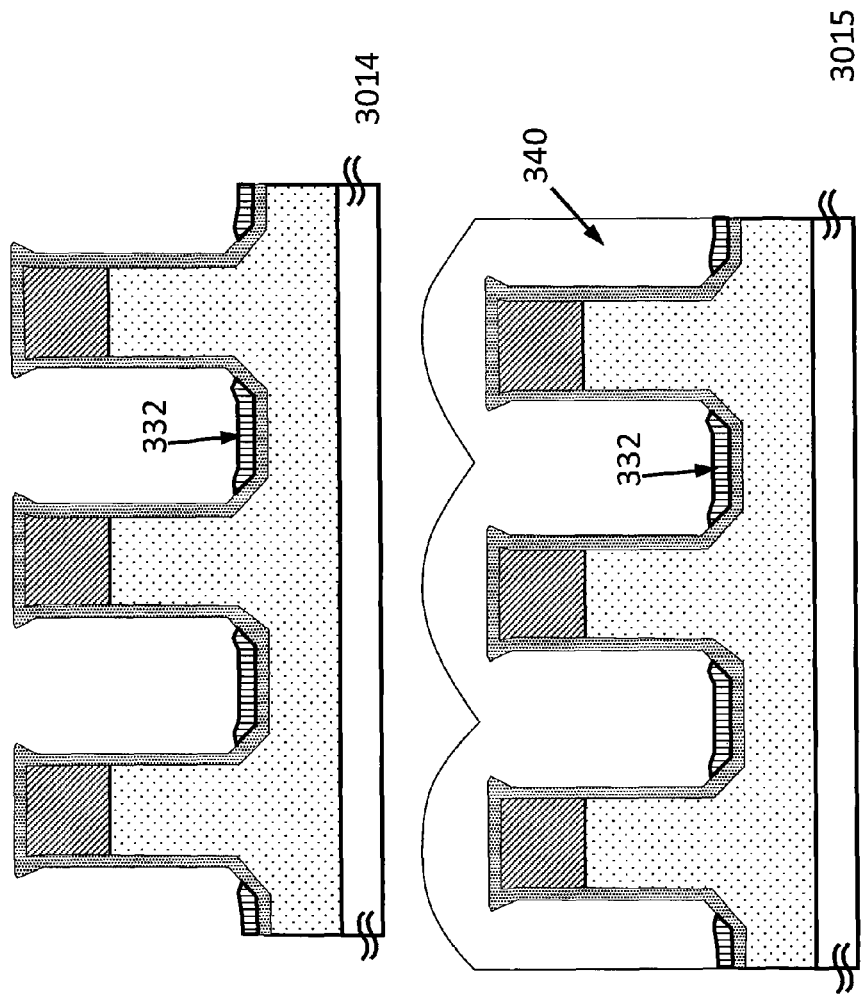
Fig. 3B, Cont.

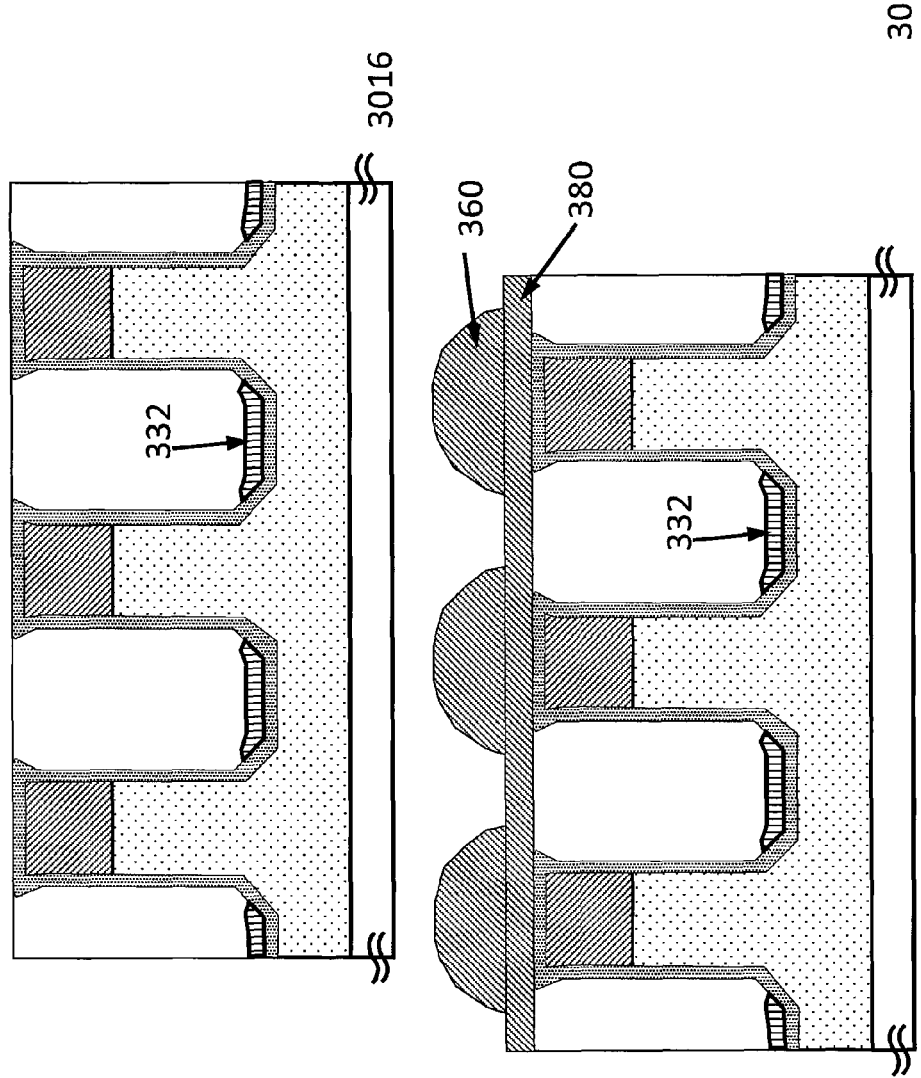
Fig. 3B, Cont.

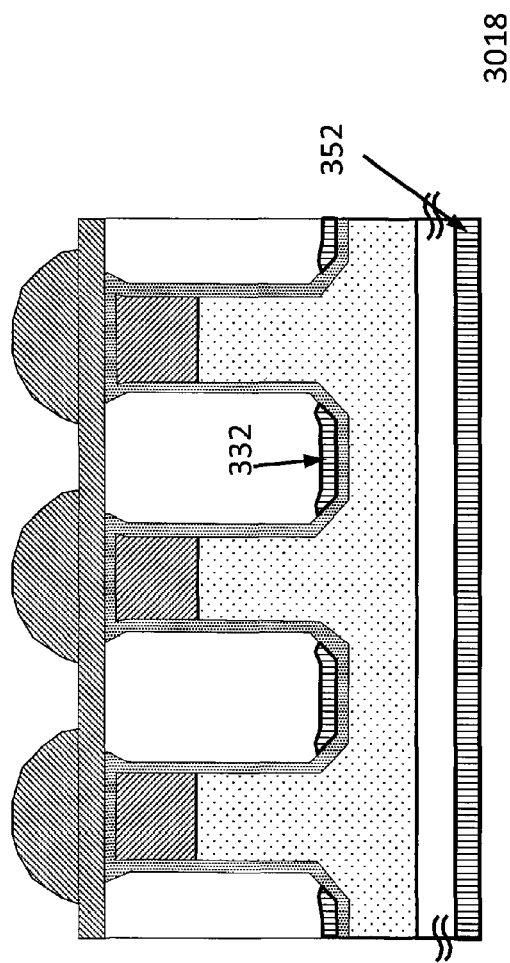
Fig. 3B, Cont.

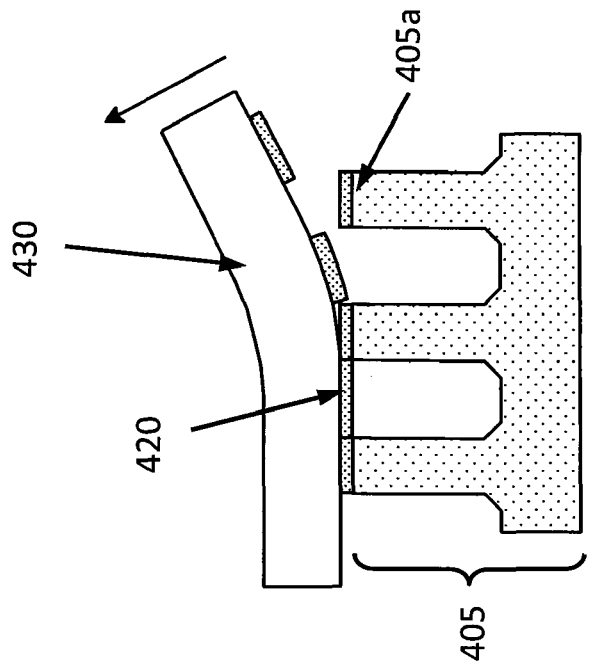
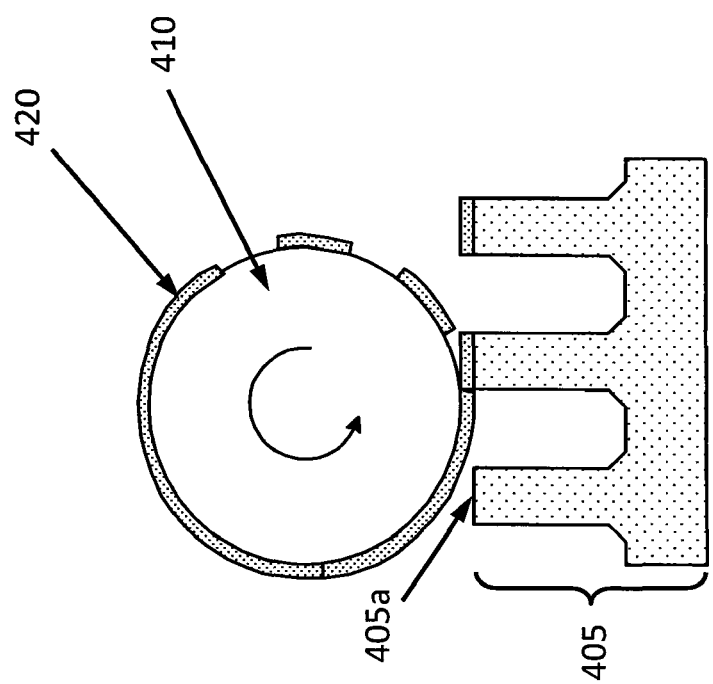
Fig. 4A
Fig. 4B

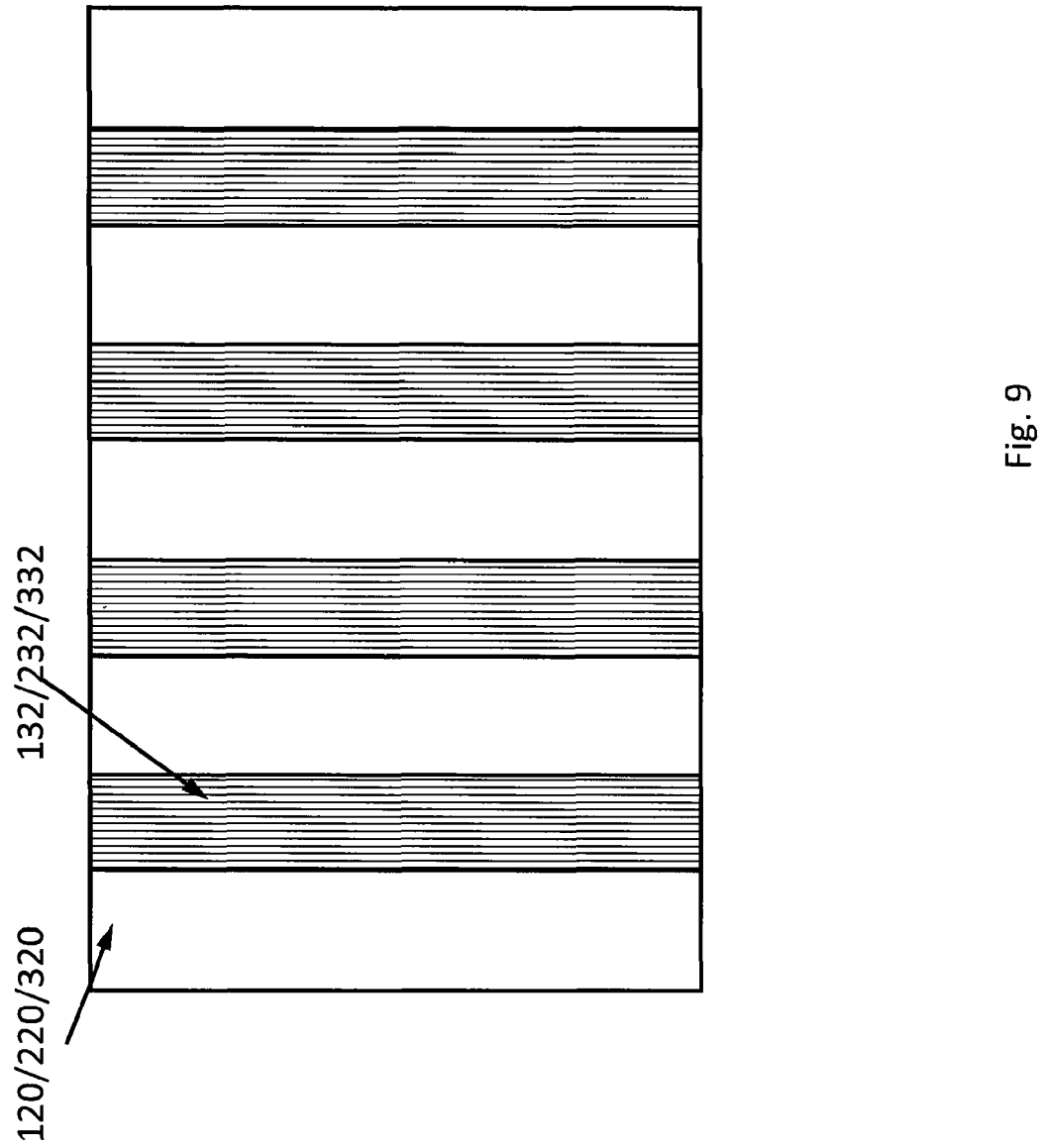

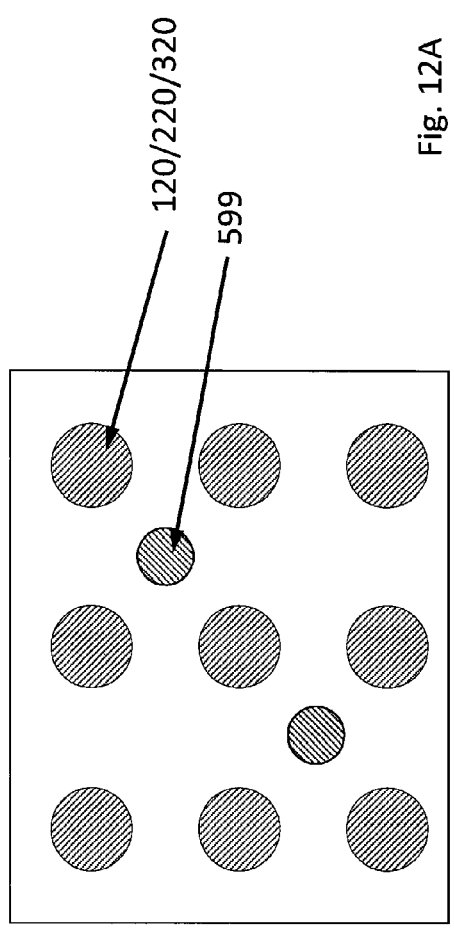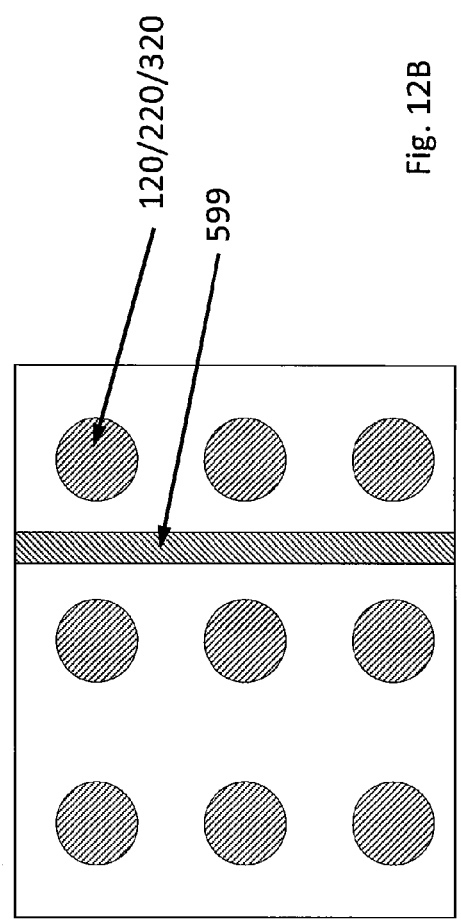

US 9,299,866 B2

NANOWIRE ARRAY BASED SOLAR ENERGY HARVESTING DEVICE

CROSS-REFERENCE TO RELATED APPLICATIONS

This application is related to U.S. patent application Ser. No. 12/204,686 (granted as U.S. Pat. No. 7,646,943), Ser. Nos. 12/648,942, 12/270,233, 12/472,264, 12/472,271, 12/478,598, 12/573,582, 12/575,221, 12/633,323, 12/633, 318, 12/633,313, 12/633,305, 12/621,497, 12/633,297, 61/266,064, 61/357,429, 61/360,421, 12/945,492, 12/910, 664, 12/966,514, 12/966,535, 12/966,573, 12/967,880 and 12/974,499, the disclosures of which are hereby incorporated by reference in their entirety.

BACKGROUND OF THE INVENTION

A photovoltaic device, also called a solar cell is a solid state device that converts the energy of sunlight directly into electricity by the photovoltaic effect. Assemblies of cells are used to make solar modules, also known as solar panels. The energy generated from these solar modules, referred to as solar power, is an example of solar energy.

The photovoltaic effect is the creation of a voltage (or a corresponding electric current) in a material upon exposure to light. Though the photovoltaic effect is directly related to the photoelectric effect, the two processes are different and should be distinguished. In the photoelectric effect, electrons are ejected from a material's surface upon exposure to radiation of sufficient energy. The photovoltaic effect is different in that the generated electrons are transferred between different bands (i.e. from the valence to conduction bands) within the material, resulting in the buildup of a voltage between two electrodes.

Photovoltaics is a method for generating electric power by using solar cells to convert energy from the sun into electricity. The photovoltaic effect refers to photons of light-packets of solar energy-knocking electrons into a higher state of energy to create electricity. At higher state of energy, the electron is able to escape from its normal position associated with a single atom in the semiconductor to become part of the current in an electrical circuit. These photons contain different amounts of energy that correspond to the different wavelengths of the solar spectrum. When photons strike a PV cell, they may be reflected or absorbed, or they may pass right through. The absorbed photons can generate electricity. The term photovoltaic denotes the unbiased operating mode of a photodiode in which current through the device is entirely due to the light energy. Virtually all photovoltaic devices are some type of photodiode.

A conventional solar cell often has opaque electrodes on a surface that receives light. Any light incident on such opaque electrodes is either reflected away from the solar cell or absorbed by the opaque electrodes, and thus does not contribute to generation of electricity. Therefore, a photovoltaic device that does not have this drawback is desired.

BRIEF SUMMARY OF THE INVENTION

Described herein is a photovoltaic device operable to convert light to electricity, comprising a substrate, a plurality of structures essentially perpendicular to the substrate, one or more recesses between the structures, each recess having a sidewall and a bottom wall, and a planar reflective layer disposed on the bottom wall of each recess, wherein the structures comprise a single crystalline semiconductor material; the sidewall of each recess is free of the planar reflective layer; and each recess is filled with a transparent material. Unlike a conventional solar cell, light incident on the planar reflective layer is not wasted but reflected to the structures to be absorbed and converted to electricity. This photovoltaic device can also be used as a photo detector.

BRIEF DESCRIPTION OF THE DRAWINGS

FIG. 1B is a process of manufacturing the photovoltaic device of FIG. 1A, according to an embodiment.

FIG. 4A shows a method of print coating a resist layer, according to an embodiment.

FIG. 4B shows a method of print coating a resist layer, according to another embodiment.

FIG. 9 shows a top view of an alternative stripe-shaped structures of the photovoltaic device.

FIG. 12A and FIG. 12B show top views of exemplary vias.

DETAILED DESCRIPTION OF THE INVENTION

Figure 1A:
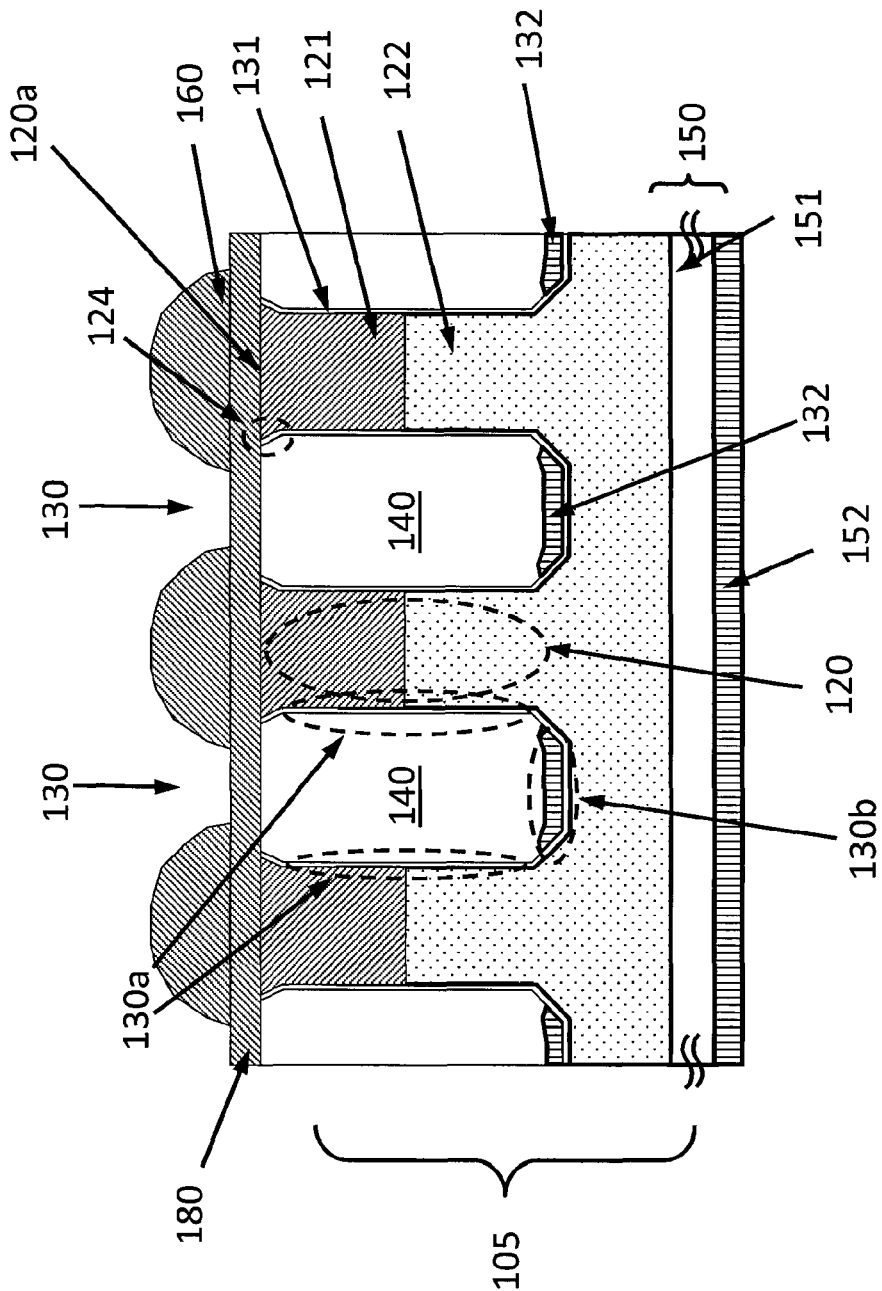
FIG. 1A is a schematic cross sectional view of a photovoltaic device according to an embodiment.

Described herein is a photovoltaic device operable to convert light to electricity, comprising a substrate, a plurality of structures essentially perpendicular to the substrate, one or more recesses between the structures, each recess having a sidewall and a bottom wall, and a planar reflective layer disposed on the bottom wall of each recess, wherein the structures comprise a single crystalline semiconductor material; the sidewall of each recess is free of the planar reflective layer; and each recess is filled with a transparent material. The term "photovoltaic device" as used herein means a device that can generate electrical power by converting light such as solar radiation into electricity. That the structures are single crystalline as used herein means that the crystal lattice of the entire structures is continuous and unbroken throughout the entire structures, with no grain boundaries therein. An electrically conductive material can be a material with essentially zero band gap. The electrical conductivity of an electrically conductive material is generally above $10^3$ S/cm. A semiconductor can be a material with a finite band gap up to about 3 eV and general has an electrical conductivity in the range of $10^3$ to $10^8$ S/cm. An electrically insulating material can be a material with a band gap greater than about 3 eV and generally has an electrical conductivity below $10^8$ S/cm. The term "structures essentially perpendicular to the substrate" as used herein means that angles between the structures and the substrate are from 85° to 90°. The term "recess" as used herein means a hollow space in the substrate and is open to a space outside the substrate.

According to an embodiment, the single crystalline semiconductor material is selected from a group consisting of silicon, germanium, group III-V compound materials, group II-VI compound materials, and quaternary materials. A group III-V compound material as used herein means a compound consisting of a group III element and a group V element. A group III element can be B, Al, Ga, In, Tl, Sc, Y, the lanthanide series of elements and the actinide series of elements. A group V element can be V, Nb, Ta, Db, N, P, As, Sb and Bi. A group II-VI compound material as used herein means a compound consisting of a group II element and a group VI element. A group II element can be Be, Mg, Ca, Sr, Ba and Ra. A group VI element can be Cr, Mo, W, Sg, O, S, Se, Te, and Po. A quaternary material is a compound consisting of four elements.

According to an embodiment, the structures are cylinders or prisms with a cross-section selected from a group consisting of elliptical, circular, rectangular, and polygonal cross-sections, strips, or a mesh. The term "mesh" as used herein means a web-like pattern or construction.

According to an embodiment, the structures are pillars with diameters from 50 nm to 5000 nm, heights from 1000 nm to 20000 nm, a center-to-center distance between two closest pillars of 300 nm to 15000 nm.

According to an embodiment, the structures have an overhanging portion along an entire contour of a top surface of the structures. The term "overhanging portion" as used herein means a portion of the structures that project over the sidewall of the recesses. The term "contour of a top surface of the structures" as used herein means the edge of the top surface of the structures. The top surface of the structures can be broken by the recesses. An edge of the top surface is the boundary on the top surface between the structures and the recesses.

According to an embodiment, each recess has a rounded or beveled inner edge between the sidewall and the bottom wall thereof.

According to an embodiment, the planar reflective layer is a material selected from a group consisting of ZnO, Al, Au, Ag, Pd, Cr, Cu, Ti, Ni and a combination thereof; the planar reflective layer is an electrically conductive material; the planar reflective layer is a metal; the planar reflective layer has a reflectance (i.e., the fraction of incident electromagnetic power that is reflected) of at least 50% for visible light (i.e., light have a wavelength from 390 to 750 nm) of any wavelength; the planar reflective layer has a thickness of at least 5 nm; the planar reflective layers in all the recesses are connected; the planar reflective layer is functional to reflect light incident thereon to the structures so that the light is absorbed by the structures; and/or the planar reflective layer is functional as an electrode of the photovoltaic device. The term "electrode" as used herein means a conductor used to establish electrical contact with the photovoltaic device.

According to an embodiment, the substrate has a flat surface opposite the structures.

According to an embodiment, the flat surface has a doped layer and optionally a metal layer metal layer disposed on and forming an Ohmic contact with the doped layer. An Ohmic contact is a region a current-voltage (I-V) curve across which is linear and symmetric.

According to an embodiment, total area of the planar reflective layer is at least 40% of a surface area of the flat surface.

According to an embodiment, the substrate has a thickness of at least 50 microns.

According to an embodiment, the structures are pillars arranged in an array; each structure is about 5 microns in height; a pitch of the structures is from 300 nm to 15 microns.

According to an embodiment, the transparent material has a surface coextensive with a top surface of the structures; the transparent material is substantially transparent to visible light with a transmittance of at least 50%; the transparent material is an electrically conductive material; the transparent material is a transparent conductive oxide; the transparent material forms an Ohmic contact with the planar reflective layer; and/or the transparent material is functional as an electrode of the photovoltaic device.

According to an embodiment, the photovoltaic device further comprises an electrode layer and optionally a coupling layer, wherein: the electrode layer is disposed on the transparent material and the structures; the electrode layer is the same material as the transparent material or different material from the transparent material; the electrode layer is substantially transparent to visible light with a transmittance of at least 50%; the electrode layer is an electrically conductive material; the electrode layer is a transparent conductive oxide; the electrode layer is functional as an electrode of the photovoltaic device; and/or the coupling layer is disposed on the electrode layer and only above a top surface of the structures. The term "coupling layer" as used herein means a layer effective to guide light into the structures.

According to an embodiment, the photovoltaic device further comprises a passivation layer and optionally a coupling layer, wherein: the passivation layer is disposed on the sidewall, and on the bottom wall under the planar reflective layer; a top surface of the structures is free of the passivation layer; and the passivation layer is effective to passivate the sidewall and the bottom wall; and/or each of the structures has a top portion and a bottom portion having dissimilar conduction types. The terms "passivation" and "passivate" as used herein means a process of eliminating dangling bonds (i.e., unsatisfied valence on immobilized atoms).

According to an embodiment further of the embodiment, the structures have one of the following doping profiles: (i) the bottom portion is intrinsic and the top portion is p type; (ii) the bottom portion is n type and the top portion is p type; (iii) the bottom portion is intrinsic and the top portion is n type; (iv) the bottom portion is p type and the top portion is n type.

According to an embodiment further of the embodiment, the top portion has a height of 1 micron to 20 micron; the passivation layer has a thickness from 1 nm to 100 nm; the passivation layer is an electrically insulating material selected from a group consisting of $HfO_2$, $SiO_2$, $Si_3N_4$, $Al_2O_3$, an organic molecule monolayer; the doped layer has an opposite conduction type from the top portion; the doped layer is electrically connected to the bottom portion; the doped layer, the bottom portion and the top portion form a p-n or p-i-n junction; the coupling layer is the same material as the cladding layer or different material from the cladding layer; and/or a refractive index of the structures $n_1$, a refractive index of the transparent material $n_2$, a refractive index of the coupling layer $n_3$, satisfy relations of $n_1 > n_2$ and $n_1 > n_3$.

According to an embodiment, the photovoltaic device further comprises a junction layer wherein: the junction layer is a doped semiconductor; the junction layer is disposed on the sidewall, on the bottom wall under the planar reflective layer, and on a top surface of the structures; and the junction layer is effective to passivate the sidewall and the bottom wall.

According to an embodiment further of the embodiment, the structures are a doped semiconductor and the structures and the junction layer have opposite conduction types; or the structures are an intrinsic semiconductor. An intrinsic semiconductor, also called an undoped semiconductor or i-type semiconductor, is a substantially pure semiconductor without any significant dopant species present. The number of charge carriers is therefore determined by the properties of the material itself instead of the amount of impurities. External electric field is not substantially screened in an intrinsic semiconductor because the intrinsic semiconductor does not have mobile electrons or holes supplied by dopants. It is thus more efficient to remove and/or collect electrons and/or holes generated in an intrinsic semiconductor by photons, using an external electric field.

According to an embodiment further of the embodiment, the junction layer has a thickness from 5 nm to 100 nm; the doped layer has an opposite conduction type from the junction layer; the doped layer is electrically connected to each of the structures; the doped layer, the structures and the junction layer form a p-n or p-i-n junction; the cladding layer has a thickness of about 175 nm; the coupling layer is the same material as the cladding layer or different material from the cladding layer; and/or a refractive index of the structures $n_1$, a refractive index of the transparent material $n_2$, a refractive index of the coupling layer $n_3$, satisfy relations of $n_1 > n_2$ and $n_1 > n_3$.

According to an embodiment, each of the structures has a top portion and a bottom portion having dissimilar conduction types.

According to an embodiment further of the embodiment, the top portion and the junction layer have the same conduction type; and the structures have one of the following doping profiles: (i) the bottom portion is intrinsic and the top portion is p type; (ii) the bottom portion is n type and the top portion is p type; (iii) the bottom portion is intrinsic and the top portion is n type; (iv) the bottom portion is p type and the top portion is n type.

According to an embodiment further of the embodiment, the junction layer has a thickness from 5 nm to 100 nm; the doped layer has an opposite conduction type from the junction layer; the doped layer is electrically connected to the bottom portion of each of the structures; the doped layer, the bottom portion, the top portion and the junction layer form a p-n or p-i-n junction; the coupling layer is the same material as the cladding layer or different material from the cladding layer; and/or a refractive index of the structures $n_1$, a refractive index of the transparent material $n_2$, a refractive index of the coupling layer $n_3$, satisfy relations of $n_1 > n_2$ and $n_1 > n_3$.

According to an embodiment, a method of making the photovoltaic device comprises: generating a pattern of openings in a resist layer using a lithography technique; forming the structures and recesses by etching the substrate; depositing the planar reflective layer such that the sidewall of each recess is free of the planar reflective layer; depositing the transparent material such that each recess is completely filled by the transparent material. A resist layer as used herein means a thin layer used to transfer a pattern to the substrate which the resist layer is deposited upon. A resist layer can be patterned via lithography to form a (sub)micrometer-scale, temporary mask that protects selected areas of the underlying substrate during subsequent processing steps. The resist is generally proprietary mixtures of a polymer or its precursor and other small molecules (e.g. photoacid generators) that have been specially formulated for a given lithography technology. Resists used during photolithography are called photoresists. Resists used during e-beam lithography are called e-beam resists. A lithography technique can be photolithography, e-beam lithography, holographic lithography. Photolithography is a process used in microfabrication to selectively remove parts of a thin film or the bulk of a substrate. It uses light to transfer a geometric pattern from a photo mask to a light-sensitive chemical photo resist, or simply "resist," on the substrate. A series of chemical treatments then engraves the exposure pattern into the material underneath the photo resist. In complex integrated circuits, for example a modern CMOS, a wafer will go through the photolithographic cycle up to 50 times. E-beam lithography is the practice of scanning a beam of electrons in a patterned fashion across a surface covered with a film (called the resist), ("exposing" the resist) and of selectively removing either exposed or non-exposed regions of the resist ("developing"). The purpose, as with photolithography, is to create very small structures in the resist that can subsequently be transferred to the substrate material, often by etching. It was developed for manufacturing integrated circuits, and is also used for creating nanotechnology artifacts.

According to an embodiment, the method of making the photovoltaic device further comprises: planarizing the transparent material; coating the substrate with the resist layer; developing (i.e., selectively removing either exposed or non-exposed regions of the resist) the pattern in the resist layer; depositing a mask layer; and lifting off the resist layer. A mask layer as used herein means a layer that protects an underlying portion of the substrate from being etched.

According to an embodiment, the method of making the photovoltaic device further comprises ion implantation or depositing a dopant layer. A dopant, also called a doping agent, is a trace impurity element that is inserted into a substance (in very low concentrations) in order to alter the electrical properties or the optical properties of the substance. Ion implantation is process by which ions of a material can be implanted into another solid, thereby changing the physical properties of the solid. Ion implantation is used in semiconductor device fabrication and in metal finishing, as well as various applications in materials science research. The ions introduce both a chemical change in the target, in that they can be a different element than the target or induce a nuclear transmutation, and a structural change, in that the crystal structure of the target can be damaged or even destroyed by the energetic collision cascades.

According to an embodiment, the structures and recesses are formed by deep etch followed by isotropic etch. A deep etch is a highly anisotropic etch process used to create deep, steep-sided holes and trenches in wafers, with aspect ratios of often 20:1 or more. An exemplary deep etch is the Bosch process. The Bosch process, also known as pulsed or time-multiplexed etching, alternates repeatedly between two modes to achieve nearly vertical structures: 1. a standard, nearly isotropic plasma etch, wherein the plasma contains some ions, which attack the wafer from a nearly vertical direction (For silicon, this often uses sulfur hexafluoride ($SF_6$)); 2. deposition of a chemically inert passivation layer (for instance, $C_4F_8$ source gas yields a substance similar to Teflon). Each phase lasts for several seconds. The passivation layer protects the entire substrate from further chemical attack and prevents further etching. However, during the etching phase, the directional ions that bombard the substrate attack the passivation layer at the bottom of the trench (but not along the sides). They collide with it and sputter it off, exposing the substrate to the chemical etchant. These etch/deposit steps are repeated many times over resulting in a large number of very small isotropic etch steps taking place only at the bottom of the etched pits. To etch through a 0.5 mm silicon wafer, for example, 100-1000 etch/deposit steps are needed. The two-phase process causes the sidewalls to undulate with an amplitude of about 100-500 nm. The cycle time can be adjusted: short cycles yield smoother walls, and long cycles yield a higher etch rate. Isotropic etch is non-directional removal of material from a substrate via a chemical process using an etchant substance. The etchant may be a corrosive liquid or a chemically active ionized gas, known as a plasma.

According to an embodiment, the method of making the photovoltaic device further comprises applying a resist layer by a print coating method, the print coating method comprising: coating a roller of a flexible material with a resist layer; transferring the resist layer to a surface of a substrate by rolling the roller on the surface, wherein the surface is flat or textured. According to an embodiment, the roller is polydimethylsiloxane.

According to an embodiment, the method of making the photovoltaic device further comprises applying a resist layer by a print coating method, the print coating method comprising: coating a stamp of a flexible material with a resist layer; transferring the resist layer to a surface of a substrate by pressing the stamp on the surface, wherein the surface is flat or textured. According to an embodiment, the stamp is polydimethylsiloxane.

According to an embodiment, a method of converting light to electricity comprises: exposing the photovoltaic device to light; drawing an electrical current from the photovoltaic device. The electrical current can be drawn from the planar reflective layer.

According to an embodiment, a photo detector comprises the photovoltaic device, wherein the photo detector is functional to output an electrical signal when exposed to light.

According to an embodiment, a method of detecting light comprises exposing the photovoltaic device to light; measuring an electrical signal from the photovoltaic device. The electrical signal can be an electrical current, an electrical voltage, an electrical conductance and/or an electrical resistance.

According to an embodiment, photovoltaic devices produce direct current electricity from sun light, which can be used to power equipment or to recharge a battery. A practical application of photovoltaics was to power orbiting satellites and other spacecraft, but today the majority of photovoltaic modules are used for grid connected power generation. In this case an inverter is required to convert the DC to AC. There is a smaller market for off-grid power for remote dwellings, boats, recreational vehicles, electric cars, roadside emergency telephones, remote sensing, and cathodic protection of pipelines. In most photovoltaic applications the radiation is sunlight and for this reason the devices are known as solar cells. In the case of a p-n junction solar cell, illumination of the material results in the creation of an electric current as excited electrons and the remaining holes are swept in different directions by the built-in electric field of the depletion region. Solar cells are often electrically connected and encapsulated as a module. Photovoltaic modules often have a sheet of glass on the front (sun up) side, allowing light to pass while protecting the semiconductor wafers from the elements (rain, hail, etc.). Solar cells are also usually connected in series in modules, creating an additive voltage. Connecting cells in parallel will yield a higher current. Modules are then interconnected, in series or parallel, or both, to create an array with the desired peak DC voltage and current.

According to an embodiment, the photovoltaic device can also be associated with buildings: either integrated into them, mounted on them or mounted nearby on the ground. The photovoltaic device can be retrofitted into existing buildings, usually mounted on top of the existing roof structure or on the existing walls. Alternatively, the photovoltaic device can be located separately from the building but connected by cable to supply power for the building. The photovoltaic device can be used as as a principal or ancillary source of electrical power. The photovoltaic device can be incorporated into the roof or walls of a building.

According to an embodiment, the photovoltaic device can also be used for space applications such as in satellites, spacecrafts, space stations, etc. The photovoltaic device can be used as main or auxiliary power sources for land vehicles, marine vehicles (boats) and trains. Other applications include road signs, surveillance cameras, parking meters, personal mobile electronics (e.g., cell phones, smart phones, laptop computers, personal media players).

EXAMPLES

FIG. 1A shows a schematic cross-section of a photovoltaic device 100, according to an embodiment. The photovoltaic device 100 comprises a substrate 105, a plurality of structures 120 essentially perpendicular to the substrate 105, one or more recesses 130 between the structures 120, and an electrode layer 180. Each recess 130 is filled with a transparent material 140. Each recess 130 has a sidewall 130*a* and a bottom wall 130*b*. The sidewall 130*a* and the bottom wall 130*b* both have a passivation layer 131. A top surface 120*a* of the structures 120 is free of the passivation layer 131. The bottom wall 130*b* has a planar reflective layer 132 disposed on the passivation layer 131. The sidewall 130*a* does not have any planar reflective layer. Each structure 120 has a top portion 121 and a bottom portion 122, the top portion 121 and the bottom portion 122 having dissimilar conduction types. The transparent material 140 preferably has a surface coextensive with the top surface 120*a* of the structures 120. The photovoltaic device 100 further comprises an electrode layer 180 disposed on the transparent material 140 and the structures 120. The term "dissimilar conduction types" as used herein means that the top portion 121 and the bottom portion 122 cannot be both p type, or both n type. The structures 120 can have one of the following four doping profiles (i.e., doping level distribution): (i) the bottom portion 122 is intrinsic and the top portion 121 is p type; (ii) the bottom portion 122 is n type and the top portion 121 is p type; (iii) the bottom portion 122 is intrinsic and the top portion 121 is n type; (iv) the bottom portion 122 is p type and the top portion 121 is n type. The top portion 121 can have a doping profile with decreasing doping levels in a direction from the top surface 120*a* to the bottom portion 122. The structures 120 are a single crystalline semiconductor material. The photovoltaic device 100 can further comprise a coupling layer 160 disposed on the electrode layer 180 and only directly above the top surface 120*a*.

The structures 120 can comprise any suitable single crystalline semiconductor material, such as silicon, germanium, group III-V compound materials (e.g., gallium arsenide, gallium nitride, etc.), group II-VI compound materials (e.g., cadmium selenide, cadmium sulfide, cadmium telluride, zinc oxide, zinc selenide, etc.), quaternary materials (e.g., copper indium gallium selenide).

Figure 10:
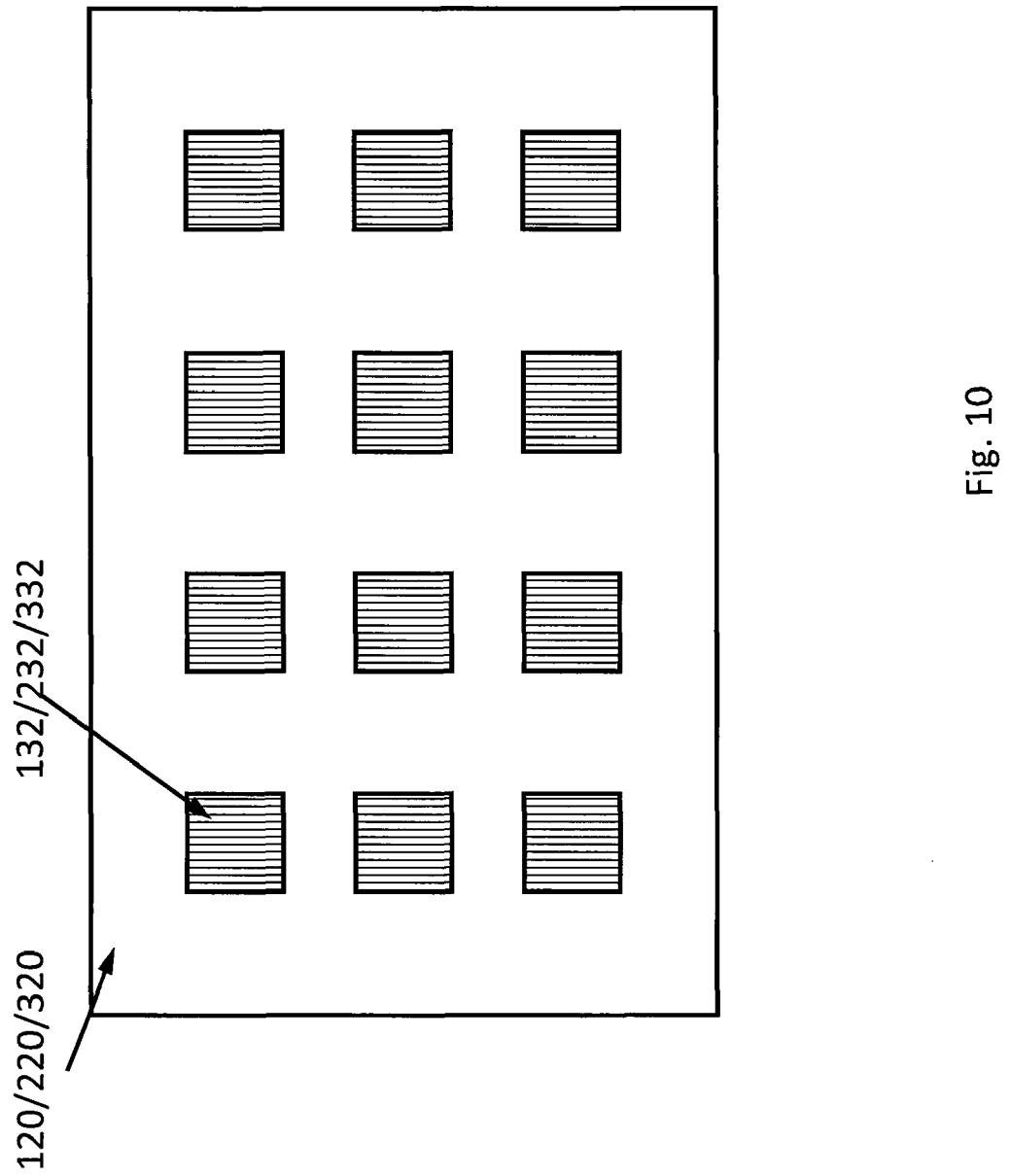
FIG. 10 shows a top view of an alternative mesh-shaped structures of the photovoltaic device.

The structures 120 can have any cross-sectional shape. For example, the structures 120 can be cylinders or prisms with elliptical, circular, rectangular, polygonal cross-sections. The structures 120 can also be strips, or a mesh as shown in FIG. 10. According to one embodiment, the structures 120 are pillars with diameters from 50 nm to 5000 nm, heights from 1000 nm to 20000 nm, a center-to-center distance between two closest pillars of 300 nm to 15000 nm. The top portion 121 preferably has a height of 1 micron to 20 micron. The top portion 121 preferably has a gradient of doping levels, with a highest doping level at the top surface 120a. Preferably, the structures 120 have an overhanging portion 124 along an entire contour of the top surface 120a of the structures 120.

Each recess 130 preferably has a rounded or beveled inner edge between the sidewall 130a and the bottom wall 130b.

The passivation layer 131 can be any suitable electrically insulating material, such as $HfO_2$, $SiO_2$, $Si_3N_4$, $Al_2O_3$, an organic molecule monolayer, etc. The passivation layer 131 can have any suitable thickness, such as from 1 nm to 100 nm. The passivation layer 131 is effective to passivate the sidewall 130a and the bottom wall 130b.

The planar reflective layer 132 can be any suitable material, such as ZnO, Al, Au, Ag, Pd, Cr, Cu, Ti, Ni, a combination thereof, etc. The planar reflective layer 132 preferably is an electrically conductive material, more preferably a metal. The planar reflective layer 132 preferably has a reflectance of at least 50%, more preferably has a reflectance of at least 70%, most preferably has a reflectance of at least 90%, for visible light of any wavelength. The planar reflective layer 132 has a thickness of preferably at least 5 nm, more preferably at least 20 nm. The planar reflective layer 132 in all the recesses 130 is preferably connected. The planar reflective layer 132 is functional to reflect light incident thereon to the structures 120 so the light is absorbed by the structures 120. A photovoltaic device often has opaque electrodes on a surface that receives light. Any light incident on such opaque electrodes is either reflected away from the photovoltaic device or absorbed by the opaque electrodes, and thus does not contribute to generation of electricity. The planar reflective layer 132 preferably is functional as an electrode of the photovoltaic device 100.

The transparent material 140 is substantially transparent to visible light, preferably with a transmittance of at least 50%, more preferably at least 70%, most preferably at least 90%. The transparent material 140 can be an electrically conductive material. The transparent material 140 preferably is a transparent conductive oxide, such as ITO (indium tin oxide), AZO (aluminum doped zinc oxide), ZIO (zinc indium oxide), ZTO (zinc tin oxide), etc. The transparent material 140 preferably forms an Ohmic contact with the planar reflective layer 132. The transparent material 140 preferably is functional as an electrode of the photovoltaic device 100. The transparent material 140 can also be a suitable electrically insulating material such as $SiO_2$ or a polymer.

The substrate 105 preferably has a flat surface 150 opposite the structures 120. The flat surface 150 can have a doped layer 151 of the opposite conduction type from the top portions 121, i.e. if the top portion 121 is n type, the doped layer 151 is p type; if the top portion 121 is p type, the doped layer 151 is n type. The doped layer 151 is electrically connected to the bottom portion 122 of each of the structures 120. If the bottom portion 122 is intrinsic, the top portion 121, the bottom portion 122 and the doped layer 151 form a p-i-n junction. If the bottom portion 122 is n type or p type, the top portion 121 and the bottom portion 122 form a p-n junction. The flat surface 150 can also have a metal layer 152 disposed on the doped layer 151. The metal layer 152 forms an Ohmic contact with the doped layer 151. The substrate 105 preferably has a thickness of at least 50 microns. Total area of the planar reflective layer 132 is preferable at least 40% of a surface area of the flat surface 150.

The electrode layer 180 can be the same material as the transparent material 140 or different material from the transparent material 140. The electrode layer 180 is substantially transparent to visible light, preferably with a transmittance of at least 50%, more preferably at least 70%, most preferably at least 90%. The electrode layer 180 is an electrically conductive material. The electrode layer 180 preferably is a transparent conductive oxide, such as ITO (indium tin oxide), AZO (aluminum doped zinc oxide), ZIO (zinc indium oxide), ZTO (zinc tin oxide), etc. The electrode layer 180 preferably forms an Ohmic contact with the top portions 121 of the structures 120. The electrode layer 180 preferably is functional as an electrode of the photovoltaic device 100.

Figure 5:
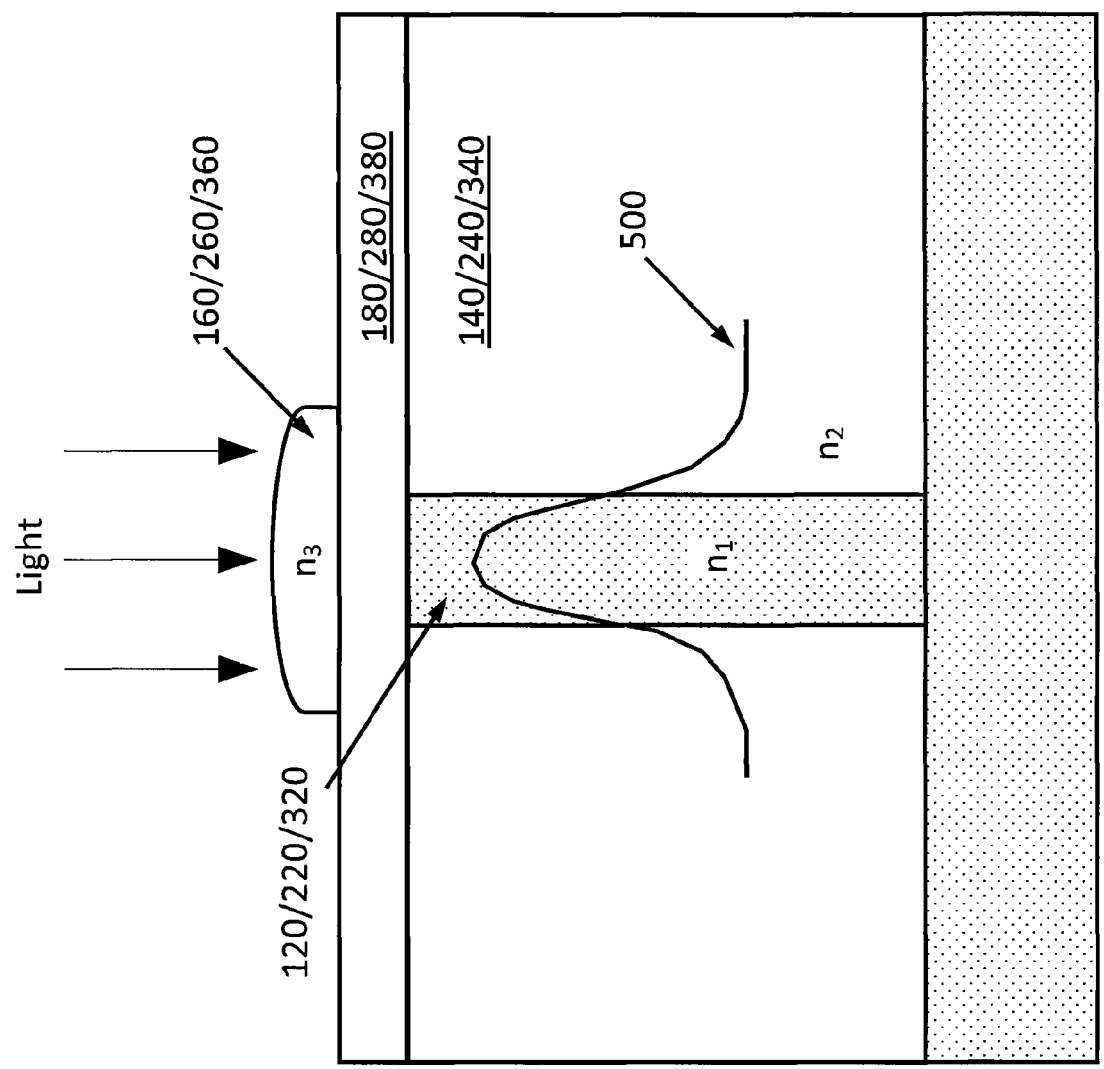
FIG. 5 shows a schematic of light concentration in the structures of the photovoltaic device.

The coupling layer 160 can be the same material as the transparent material 140 or different material from the transparent material 140. As shown in FIG. 5, refractive index of the structure 120 $n_1$, refractive index of the transparent material 140 $n_2$, refractive index of the coupling layer 160 $n_3$, preferably satisfy relations of $n_1 > n_2$ and $n_1 > n_3$, which lead to enhanced light concentration in the structures 120.

In one embodiment, the structures 120 are pillars arranged in an array, such as a rectangular array, a hexagonal array, a square array, concentric ring. Each structure 120 is about 5 microns in height. A pitch of the structures 120 is from 300 nm to 15 microns. The term "pitch" is defined as a distance of a structure 120 to a nearest neighbor of the structure 120 along a direction parallel to the substrate 105. The term "array" as used herein means a spatial arrangement having a particular order.

A method of making the photovoltaic device 100 as shown in FIG. 1B, according to an embodiment, comprises the following steps:

In step 1000, providing the substrate 105 having the doped layer 151 and an epi layer 11 disposed on the doped layer 151. Epitaxy is a process of growing a crystal of a particular orientation on top of another crystal, where the orientation is determined by the underlying crystal. The term "epi layer" as used herein means a layer grown by epitaxy.

In step 1001, an upper layer 12 of the epi layer 11 is doped by ion implantation.

In step 1002, a resist layer 14 is applied on the doped upper layer 12. The resist layer 14 can be applied by spin coating. The resist layer 14 can be a photo resist or an e-beam resist.

In step 1003, lithography is performed. The resist layer 14 now has a pattern of openings in which the doped upper layer 12 is exposed. Shapes and locations of the openings correspond to the shapes and locations of the recesses 130. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 1004, a mask layer 15 is deposited. The deposition can be done using a technique such as thermal evaporation, e-beam evaporation, sputtering. The mask layer 15 can be a metal such as Cr or Al, or a dielectric such as $SiO_2$ or $Si_3N_4$. The thickness of the mask layer 15 can be determined by a depth of the recesses 130 and etching selectivity (i.e., ratio of etching rates of the mask layer 15 and the substrate 105).

In step 1005, remainder of the resist layer 14 is lift off by a suitable solvent or ashed in a resist asher to remove any mask layer 15 support thereon. A portion of the mask layer 15 in the openings of the resist layer 14 is retained. A portion of the doped upper layer 12 is now exposed through the retained mask layer 15.

In step 1006, the exposed portion of the doped upper layer 12 and the portion of the epi layer 11 directly therebelow are deep etched to a desired depth (e.g., 1 to 20 microns) followed by an isotropic etch, until the epi layer 11 is partially exposed, to form the structures 120 with the overhanging portion 124 and the recesses 130 with the beveled inner edge. Each of the structures 120 now has the top portion 121 which is part of the upper doped layer 12 and a bottom portion 122 which is part of the epi layer 11. Deep etching includes alternating deposition and etch steps and can lead to "scalloping" on the sidewall 130a of the recesses 130, i.e. the sidewall 130a is not smooth. The sidewall 130a can be smoothed by thermal annealing or dipping into an etchant such as potassium hydroxide (KOH) followed by rinsing. The deep etching can use gases such as $C_4F_8$ and $SF_6$.

In step 1007, the passivation layer 131 is conformally (i.e., isotropically) deposited on surfaces of the recesses 130 and a top surface 15a of the retained mask layer 15. A conformal layer, such as the passivation 131, is a layer that covers a morphologically uneven surface and has an essentially uniform thickness. The passivation layer 131 can be deposited by a suitable technique such as plating, chemical vapor deposition or atomic layer deposition.

In step 1008, a resist layer 16 is selectively applied such that the sidewall 130a and bottom wall 130b of the recesses are free of the resist layer 16 and a top surface 131a of the passivation layer 131 is completely covered by the resist layer 16. The resist layer 16 can be selectively applied by a suitable method such as a print coating method detailed hereinbelow according an embodiment.

In step 1009, a metal layer 17 is anisotropically deposited (i.e., non-conformally) such that the resist layer 16 and the bottom wall 130b are covered by the metal layer 17 while the sidewall 130a is free of the metal layer 17. The metal layer 17 can be deposited by a suitable technique such as thermal evaporation, e-beam evaporation. The metal 17 can be any suitable metal such as aluminum.

In step 1010, the resist layer 16 is lift off by a suitable solvent or ashed in a resist asher to remove any metal layer 17 support thereon. The top surface 131a of the passivation layer 131 is now exposed.

In step 1011, the top surface 131a of the passivation layer 131 is selected removed by a suitable technique such as ion milling, dry etching, sputtering, while leaving the passivation layer 131 on the sidewall 130a and bottom wall 130b of the recesses 130 intact. The top surface 15a of the retained mask layer 15 is now exposed. The metal layer 17 on the bottom wall 130b protects the passivation layer 131 underneath from being removed.

In step 1012, the retained mask layer 15 and the metal layer 17 are removed by a suitable technique such as wet etch in a suitable etchant. Now the top surface 120a of the structures 120 is exposed.

In step 1013, a resist layer 18 is selectively applied such that the sidewall 130a and bottom wall 130b of the recesses are free of the resist layer 18 and the top surface 120a of the structures 120 is completely covered by the resist layer 18. The resist layer 18 can be selectively applied by a suitable method such as the print coating method detailed hereinbelow according an embodiment.

In step 1014, the planar reflective layer 132 is anisotropically deposited (i.e., non-conformally) such that the resist layer 18 and the bottom wall 130b are covered by the planar reflective layer 132 while the sidewall 130a is free of the planar reflective layer 132. The planar reflective layer 132 can be deposited by a suitable technique such as thermal evaporation, e-beam evaporation. The planar reflective layer 132 can be any suitable material such as silver.

In step 1015, the resist layer 18 is lift off by a suitable solvent or ashed in a resist asher to remove any portion of the planar reflective layer 132 support thereon. The top surface 120a of the structures 120 is now exposed.

In step 1016, the transparent material 140 is deposited such that the planar reflective layer 132, the passivation layer 131 and the top surface 120a are completely covered and the recesses 130 are completely filled. The transparent material 140 can be deposited by a suitable technique such as plating, chemical vapor deposition or atomic layer deposition.

In step 1017, the transparent material 140 is planarized using a suitable technique such as chemical mechanical polishing/planarization (CMP) such that the transparent material 140 has a surface coextensive with the top surface 120a of the structures 120 and the top surface 120a is exposed.

In step 1018, the electrode layer 180 is deposited using a suitable technique such as thermal evaporation, e-beam evaporation, sputtering, onto the transparent material 140 and the top surfaces 120a. The coupling layer 160 can be then deposited using a suitable technique such as sputtering, thermal evaporation or e-beam evaporation onto the electrode layer 180.

In step 1019, the metal layer 152 is deposited on the doped layer 151.

The method can further comprise one or more steps of thermal annealing.

Figure 2A:
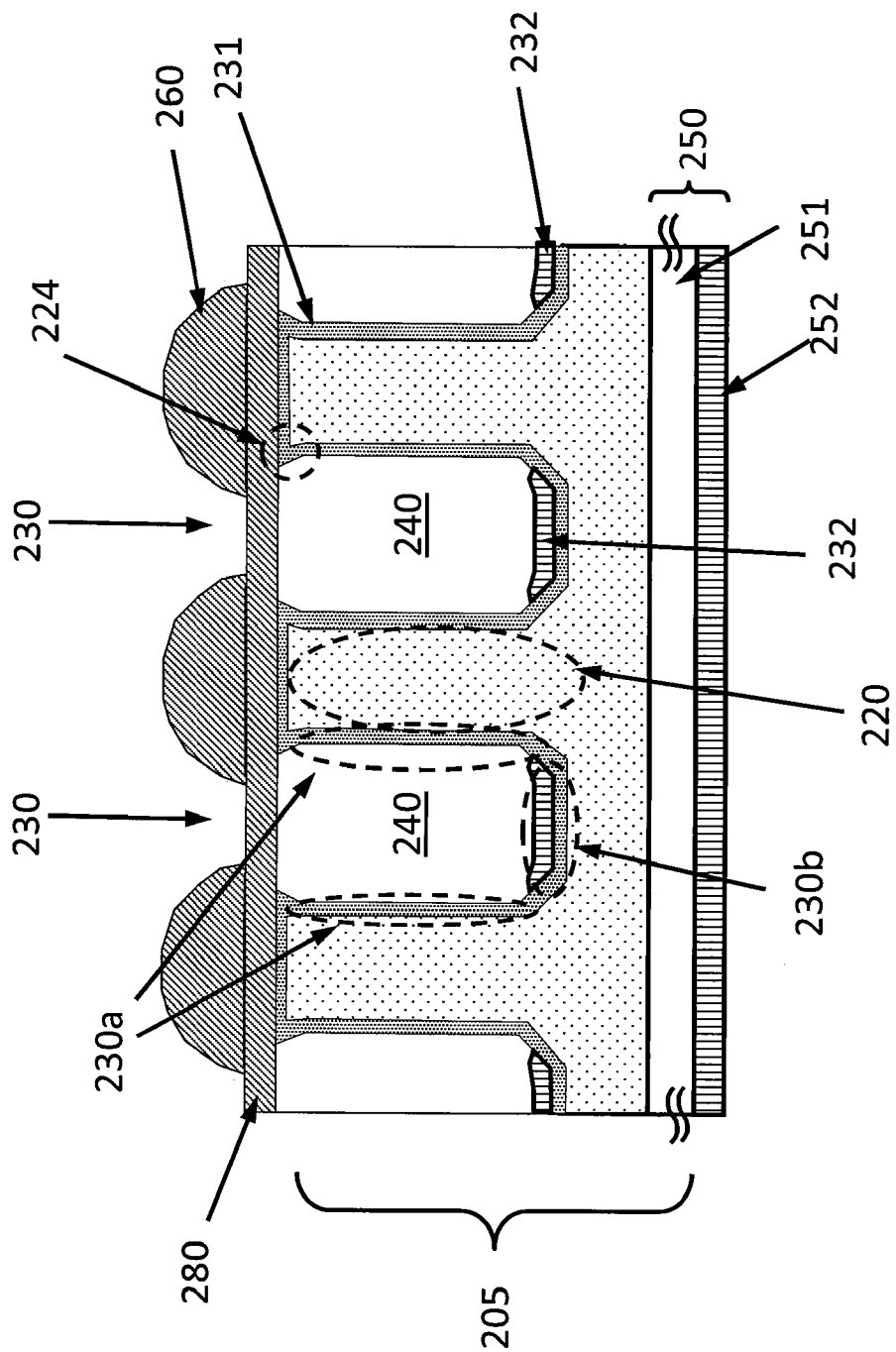
FIG. 2A is a schematic cross sectional view of a photovoltaic device according to an embodiment.

FIG. 2A shows a schematic cross-section of a photovoltaic device 200, according to another embodiment. The photovoltaic device 200 comprises a substrate 205, a plurality of structures 220 essentially perpendicular to the substrate 205, one or more recesses 230 between the structures 220 and an electrode layer 280. Each recess 230 is filled with a transparent material 240. Each recess 230 has a sidewall 230a and a bottom wall 230b. The sidewall 230a, the bottom wall 230b of each recess 230 and a top surface 220a of the structures 220 have a junction layer 231 disposed thereon. The junction layer 231 is a doped semiconductor. The bottom wall 230b has a planar reflective layer 232 disposed on the junction layer 231. The sidewall 230a does not have any planar reflective layer. The structures 220 are a single crystalline semiconductor material. The structure 220 can be an intrinsic semiconductor or a doped semiconductor. If the structure 220 is a doped semiconductor, the structures 220 and the junction layer 231 have opposite conduction types, i.e., if the structures 220 are p type, the junction layer 231 is n type; if the structures 220 are n type, the junction layer 231 is p type. The transparent material 240 preferably has a surface coextensive with the top surface 220a of the structures 220. The photovoltaic device 200 further comprises an electrode layer 280 disposed on the transparent material 240 and the structures 220. The photovoltaic device 200 can further comprise a coupling layer 260 disposed on the electrode layer 280 and only directly above the top surface 220a.

The structures 220 can comprise any suitable single crystalline semiconductor material, such as silicon, germanium, group III-V compound materials (e.g., gallium arsenide, gallium nitride, etc.), group II-VI compound materials (e.g., cadmium selenide, cadmium sulfide, cadmium telluride, zinc oxide, zinc selenide, etc.), quaternary materials (e.g., copper indium gallium selenide).

The structures 220 can have any cross-sectional shape. For example, the structures 220 can be cylinders or prisms with elliptical, circular, rectangular, polygonal cross-sections. The structures 220 can also be strips as shown in FIG. 9, or a mesh as shown in FIG. 10. According to one embodiment, the structures 220 are pillars with diameters from 50 nm to 5000 nm, heights from 1000 nm to 20000 nm, a center-to-center distance between two closest pillars of 300 nm to 15000 nm. Preferably, the structures 220 have an overhanging portion 224 along an entire contour of the top surface 220a of the structures 220.

Each recess 230 preferably has a rounded or beveled inner edge between the sidewall 230a and the bottom wall 230b.

The junction layer 231 preferably has a thickness from 5 nm to 100 nm. The junction layer 231 is effective to passivate surfaces of the structures 220.

The planar reflective layer 232 can be any suitable material, such as ZnO, Al, Au, Ag, Pd, Cr, Cu, Ti, Ni, a combination thereof, etc. The planar reflective layer 232 preferably is an electrically conductive material, more preferably a metal. The planar reflective layer 232 preferably has a reflectance of at least 50%, more preferably has a reflectance of at least 70%, most preferably has a reflectance of at least 90%, for visible light of any wavelength. The planar reflective layer 232 has a thickness of preferably at least 5 nm, more preferably at least 20 nm. The planar reflective layer 232 in all the recesses 230 is preferably connected. The planar reflective layer 232 is functional to reflect light incident thereon to the structures 220 so the light is absorbed by the structures 220. The planar reflective layer 232 preferably is functional as an electrode of the photovoltaic device 200.

The transparent material 240 is substantially transparent to visible light, preferably with a transmittance of at least 50%, more preferably at least 70%, most preferably at least 90%. The transparent material 240 can be an electrically conductive material. The transparent material 240 preferably is made of a transparent conductive oxide, such as ITO (indium tin oxide), AZO (aluminum doped zinc oxide), ZIO (zinc indium oxide), ZTO (zinc tin oxide), etc. The transparent material 240 preferably forms an Ohmic contact with the junction layer 231. The transparent material 240 preferably forms an Ohmic contact with the planar reflective layer 232. The transparent material 240 preferably is functional as an electrode of the photovoltaic device 200. The transparent material 140 can also be a suitable electrically insulating material such as $SiO_2$ or a polymer.

The substrate 205 preferably has a flat surface 250 opposite the structures 220. The flat surface 250 can have a doped layer 251 of the opposite conduction type from the junction layer 231, i.e. if the junction layer 231 is n type, the doped layer 251 is p type; if the junction layer 231 is p type, the doped layer 251 is n type. The doped layer 251 is electrically connected to each of the structures 220. If the structures 220 are intrinsic, the junction layer 231, the structures 220 and the doped layer 251 form a p-i-n junction. If the structures 220 are n-type or p-type, the junction layer 231 and the structures 220 form a p-n junction. The flat surface 250 can also have a metal layer 252 disposed on the doped layer 251. The metal layer 252 forms an Ohmic contact with the doped layer 251. The substrate 205 preferably has a thickness of at least 50 microns. Total area of the planar reflective layer 232 is preferable at least 40% of a surface area of the flat surface 250.

The electrode layer 280 can be the same material as the transparent material 240 or different material from the transparent material 240. The electrode layer 280 is substantially transparent to visible light, preferably with a transmittance of at least 50%, more preferably at least 70%, most preferably at least 90%. The electrode layer 280 is an electrically conductive material. The electrode layer 280 preferably is a transparent conductive oxide, such as ITO (indium tin oxide), AZO (aluminum doped zinc oxide), ZIO (zinc indium oxide), ZTO (zinc tin oxide), etc. The electrode layer 280 preferably forms an Ohmic contact with the junction layer 231. The electrode layer 280 preferably is functional as an electrode of the photovoltaic device 200.

The coupling layer 260 can be the same material as the transparent material 240 or different material from the transparent material 240. As shown in FIG. 5, refractive index of the structure 220 $n_1$, refractive index of the transparent material 240 $n_2$, refractive index of the coupling layer 260 $n_3$, preferably satisfy relations of $n_1 > n_2$ and $n_1 > n_3$, which lead to enhanced light concentration in the structures 220.

In one embodiment, the structures 220 are pillars arranged in an array, such as a rectangular array, a hexagonal array, a square array, concentric ring. Each pillar is about 5 microns in height. A pitch of the structures 220 is from 300 nm to 15 microns.

Figure 2B:
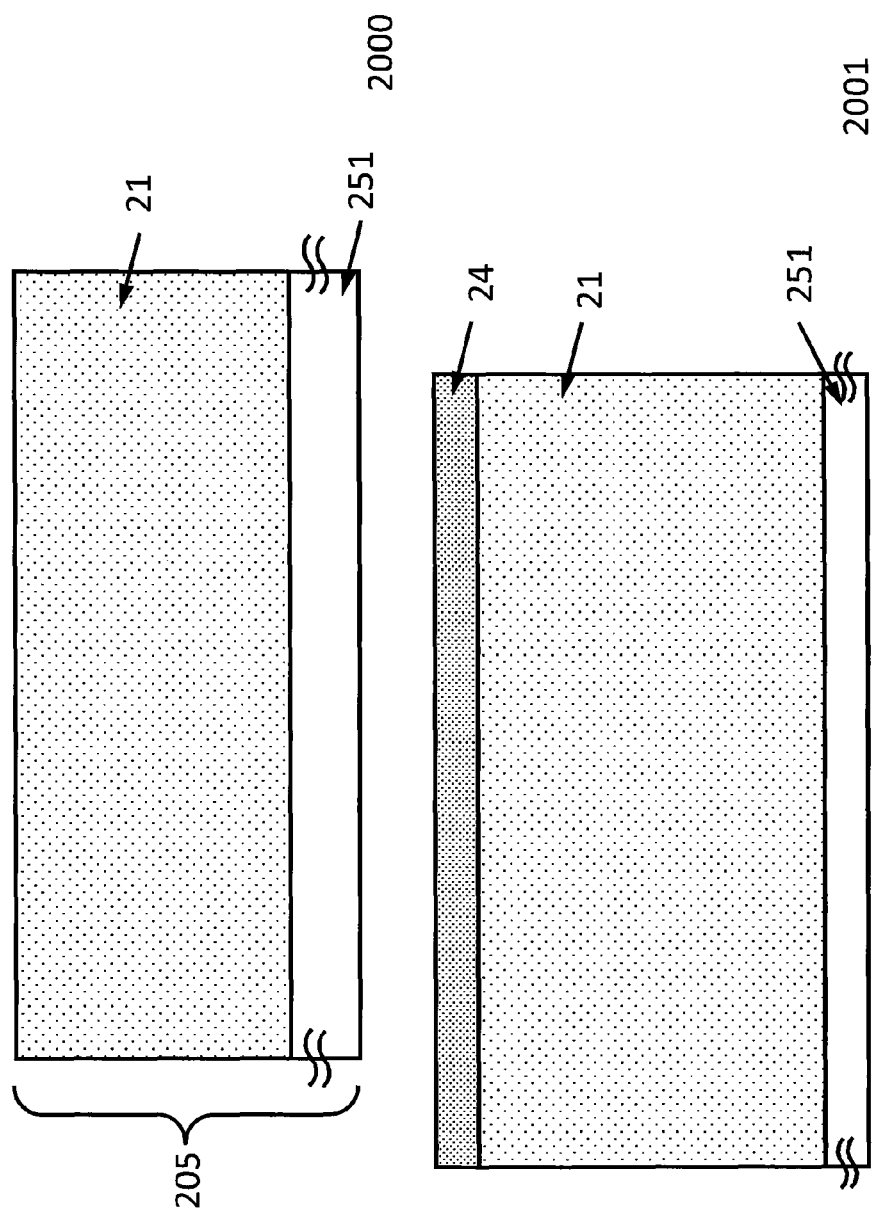
FIG. 2B is a process of manufacturing the photovoltaic device of FIG. 2A, according to an embodiment.

A method of making the photovoltaic device 200 as shown in FIG. 2B, according to an embodiment, comprises the following steps:

In step 2000, providing the substrate 205 having the doped layer 251 and an epi layer 21 disposed on the doped layer 251.

In step 2001, a resist layer 24 is applied on the epi layer 21. The resist layer 24 can be applied by spin coating. The resist layer 24 can be a photo resist or an e-beam resist.

In step 2002, lithography is performed. The resist layer 24 now has a pattern of openings in which the epi layer 21 is exposed. Shapes and locations of the openings correspond to the shapes and locations of the recesses 230. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 2003, a mask layer 25 is deposited. The deposition can be done using a technique such as thermal evaporation, e-beam evaporation, sputtering. The mask layer 25 can be a metal such as Cr or Al, or a dielectric such as $SiO_2$ or $Si_3N_4$. The thickness of the mask layer 25 can be determined by a depth of the recesses 230 and etching selectivity (i.e., ratio of etching rates of the mask layer 25 and the substrate 205).

In step 2004, remainder of the resist layer 24 is lift off by a suitable solvent or ashed in a resist asher to remove any mask layer 25 support thereon. A portion of the mask layer 25 in the openings of the resist layer 24 is retained. A portion of the epi layer 21 is now exposed through the retained mask layer 25.

In step 2005, the exposed portion of the epi layer 21 is deep etched to a desired depth (e.g., 1 to 20 microns) followed by an isotropic etch, to form the structures 220 with the overhanging portion 224 and the recesses 230 with the beveled inner edge. Deep etching includes alternating deposition and etch steps and can lead to "scalloping" on the sidewall 230b of the recesses 230, i.e. the sidewall 230b is not smooth. The sidewall 230b can be smoothed by thermal annealing or dipping into an etchant such as potassium hydroxide (KOH) followed by rinsing. The deep etching can use gases such as $C_4F_8$ and $SF_6$.

In step 2006, the mask layer 25 is removed by a suitable such as wet etching with suitable etchant, ion milling, sputtering. The top surface 220a of the structures 220 is exposed.

In step 2007, a dopant layer 22 is conformally (i.e., isotropically) deposited on surfaces of the recesses 230 and a top surface 220a of the structures 220. The dopant layer 22 can be deposited by a suitable technique such as plating, chemical vapor deposition or atomic layer deposition. The dopant layer 22 can comprise any suitable material such as trimethylboron, triisopropylborane $((C_3H_7)_3B)$, triethoxyborane $((C_2H_5O)_3B$, and/or triisopropoxyborane $((C_3H_7O)_3B$. More details can be found in an abstract of a presentation titled "Atomic layer deposition of boron oxide as dopant source for shallow doping of silicon" by Bodo Kalkofen and Edmund P. Burte in the 218th Electrochemical Society Meeting, Oct. 10, 2010-Oct. 15, 2010, which is hereby incorporated by reference in its entirety.

In step 2008, a shield layer 23 is conformally (i.e., isotropically) deposited on surfaces of the dopant layer 22. The shield layer 23 can be deposited by a suitable technique such as plating, chemical vapor deposition or atomic layer deposition. The shield layer 23 has a suitable material (such as silicon oxide, silicon nitride) and a suitable thickness (e.g., at least 10 nm, at least 100 nm or at least 1 micron) effective to prevent the dopant layer 22 from evaporation in step 2009.

In step 2009, the dopant layer 22 is diffused into the sidewall 230*b*, the bottom wall 230*a* and the top surface 220*a* by thermal annealing, which forms the junction layer 231 thereon. Thermal annealing can be conducted, for example, at about 850° C. for 10 to 30 minutes under a suitable atmosphere (e.g., argon).

In step 2010, the shield layer 23 is removed by a suitable technique such as wet etch using a suitable etchant such as HF. The junction layer 231 is now exposed.

In step 2011, a resist layer 26 is selectively applied such that the sidewall 230*a* and bottom wall 230*b* of the recesses 230 are free of the resist layer 26 and a top surface 231*a* of the junction layer 231 is completely covered by the resist layer 26. The resist layer 26 can be selectively applied by a suitable method such as the print coating method detailed hereinbelow according an embodiment.

In step 2012, the planar reflective layer 232 is anisotropically deposited (i.e., non-conformally) such that the resist layer 26 and the bottom wall 230*b* are covered by the planar reflective layer 232 while the sidewall 230*a* is free of the planar reflective layer 232. The planar reflective layer 232 can be deposited by a suitable technique such as thermal evaporation, e-beam evaporation. The planar reflective layer 232 can be any suitable material such as silver.

In step 2013, the resist layer 26 is lift off by a suitable solvent or ashed in a resist asher to remove any portion of the planar reflective layer 232 support thereon. The top surface 231*a* of the junction layer 220 is now exposed.

In step 2014, the transparent material 240 is deposited such that the planar reflective layer 232, the junction layer 231 and the top surface 231*a* are completely covered and the recesses 230 are completely filled. The transparent material 240 can be deposited by a suitable technique such as plating, chemical vapor deposition or atomic layer deposition.

In step 2015, the transparent material 240 is planarized using a suitable technique such as CMP such that the transparent material 240 has a surface coextensive with the top surface 220*a* of the structures 220 and the top surface 231*a* of the junction layer 231 is exposed.

In step 2016, the electrode layer 280 is deposited using a suitable technique such as thermal evaporation, e-beam evaporation, sputtering, onto the transparent material 240 and the top surfaces 231*a*. The coupling layer 260 can be then deposited using a suitable technique such as sputtering, thermal evaporation or e-beam evaporation onto the electrode layer 280.

In step 2017, the metal layer 252 is deposited on the doped layer 251.

The method can further comprise one or more steps of thermal annealing.

Figure 3A:
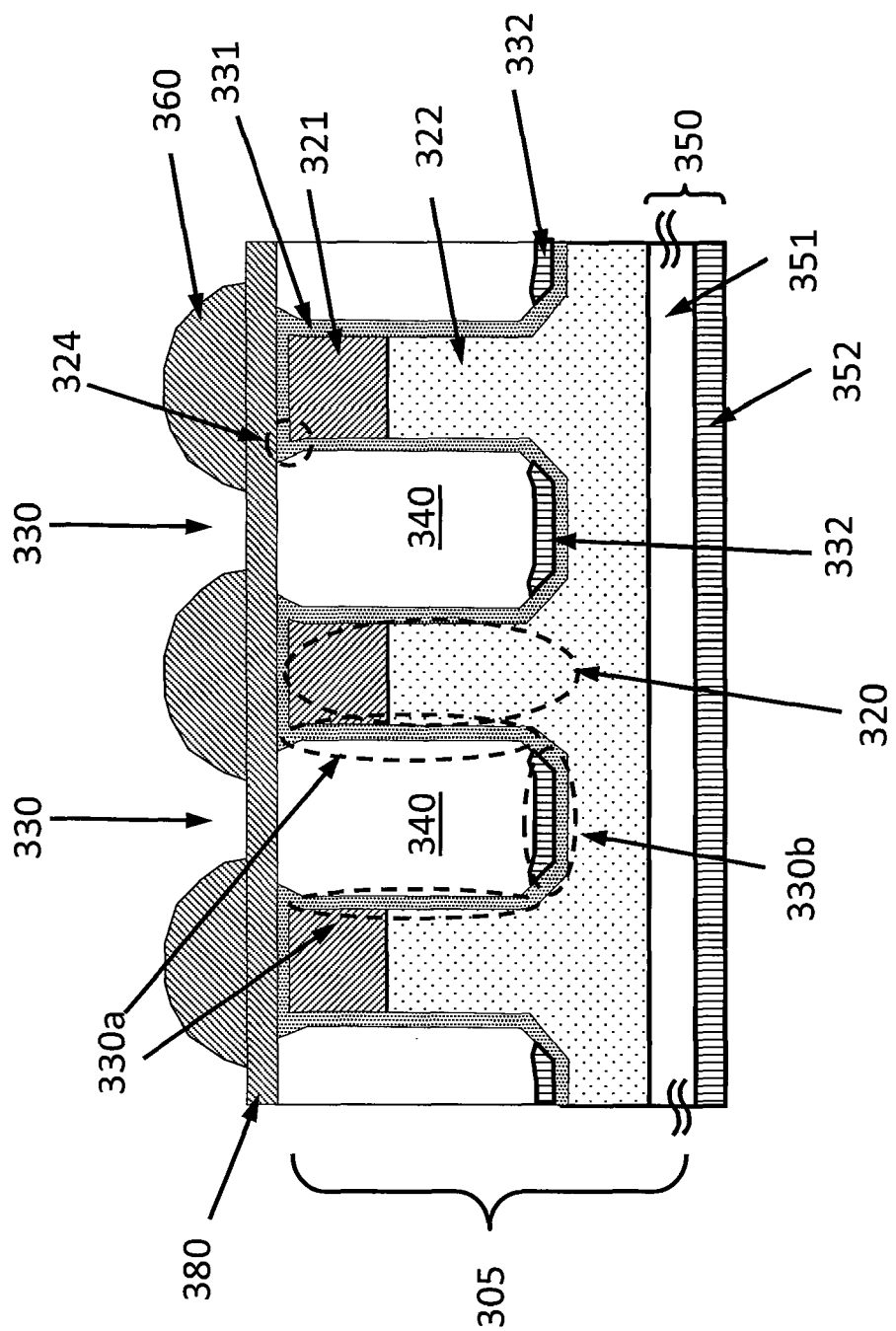
FIG. 3A is a schematic cross sectional view of a photovoltaic device according to an embodiment.

FIG. 3A shows a schematic cross-section of a photovoltaic device 300, according to an embodiment. The photovoltaic device 300 comprises a substrate 305, a plurality of structures 320 essentially perpendicular to the substrate 305, one or more recesses 330 between the structures 320 and an electrode layer 380. Each recess 330 is filled with a transparent material 340. Each recess 330 has a sidewall 330*a* and a bottom wall 330*b*. The sidewall 330*a*, the bottom wall 330*b* of each recess 330 and a top surfaces 320*a* of the structures 320 have a junction layer 331 disposed thereon. The junction layer 331 is a doped semiconductor. The bottom wall 330*b* has a planar reflective layer 332 disposed on the junction layer 331. The sidewall 330*a* does not have any planar reflective layer. Each structure 320 has a top portion 321 and a bottom portion 322. The structures 320 can have one of the following four doping profiles (i.e., doping level distribution): (i) the bottom portion 322 is intrinsic and the top portion 321 is p type; (ii) the bottom portion 322 is n type and the top portion 321 is p type; (iii) the bottom portion 322 is intrinsic and the top portion 321 is n type; (iv) the bottom portion 322 is p type and the top portion 321 is n type. The top portion 321 can have a doping profile with decreasing doping levels in a direction from the top surface 320*a* to the bottom portion 322. The structures 320 are a single crystalline semiconductor material. The top portion 321 of the structures 320 and the junction layer 331 are semiconductor materials of the same conduction types, i.e., if the top portion 321 is p type, the junction layer 331 is p type; if the top portion 321 is n type, the junction layer 331 is n type. The transparent material 340 preferably has a surface coextensive with the top surface 320*a* of the structures 320. The photovoltaic device 300 further comprises an electrode layer 380 disposed on the transparent material 340 and the structures 320. The photovoltaic device 300 can further comprise a coupling layer 360 disposed on the electrode layer 280 and only directly above the top surface 320*a*.

The structures 320 can comprise any suitable single crystalline semiconductor material, such as silicon, germanium, group III-V compound materials (e.g., gallium arsenide, gallium nitride, etc.), group II-VI compound materials (e.g., cadmium selenide, cadmium sulfide, cadmium telluride, zinc oxide, zinc selenide, etc.), quaternary materials (e.g., copper indium gallium selenide).

The structures 320 can have any cross-sectional shape. For example, the structures 320 can be cylinders or prisms with elliptical, circular, rectangular, polygonal cross-sections. The structures 320 can also be strips as shown in FIG. 9, or a mesh as shown in FIG. 10. According to one embodiment, the structures 320 are pillars with diameters from 50 nm to 5000 nm, heights from 1000 nm to 20000 nm, a center-to-center distance between two closest pillars of 300 nm to 15000 nm. The top portion 321 preferably has a height of 1 micron to 20 micron. The top portion 321 preferably has a gradient of doping levels, with a highest doping level at the top surface 320*a*. Preferably, the structures 320 have an overhanging portion 324 along an entire contour of the top surface 320*a* of the structures 320.

Each recess 330 preferably has a rounded or beveled inner edge between the sidewall 130*a* and the bottom wall 330*b*.

The junction layer 331 preferably has a thickness from 5 nm to 100 nm. The junction layer 331 is effective to passivate surfaces of the structures 320.

The planar reflective layer 332 can be any suitable material, such as ZnO, Al, Au, Ag, Pd, Cr, Cu, Ti, Ni, a combination thereof, etc. The planar reflective layer 332 preferably is an electrically conductive material, more preferably a metal. The planar reflective layer 332 preferably has a reflectance of at least 50%, more preferably has a reflectance of at least 70%, most preferably has a reflectance of at least 90%, for visible light of any wavelength. The planar reflective layer 332 has a thickness of preferably at least 5 nm, more preferably at least 20 nm. The planar reflective layer 332 in all the recesses 330 is preferably connected. The planar reflective layer 332 is functional to reflect light incident thereon to the structures 320 so the light is absorbed by the structures 320. The planar reflective layer 332 preferably is functional as an electrode of the photovoltaic device 300.

The transparent material 340 is substantially transparent to visible light, preferably with a transmittance of at least 50%, more preferably at least 70%, most preferably at least 90%. The transparent material 340 can be an electrically conductive material. The transparent material 340 preferably is made of a transparent conductive oxide, such as ITO (indium tin oxide), AZO (aluminum doped zinc oxide), ZIO (zinc indium oxide), ZTO (zinc tin oxide), etc. The transparent material 340 preferably forms an Ohmic contact with the junction layer 331. The transparent material 340 preferably forms an Ohmic contact with the planar reflective layer 332. The transparent material 340 preferably is functional as an electrode of the photovoltaic device 300. The transparent material 340 can also be a suitable electrically insulating material such as $SiO_2$ or a polymer.

The substrate 305 preferable has a flat surface 350 opposite the structures 320. The flat surface 350 can have a doped layer 351 of the opposite conduction type from the junction layer 331, i.e. if the junction layer 331 is n type, the doped layer 351 is also p type; if the junction layer 331 is p type, the doped layer 351 is also n type. The doped layer 351 is electrically connected to the bottom portion 322 of each of the structures 320. If the bottom portion 322 is intrinsic, the junction layer 331 and the top portion 321 form a p-i-n junction with the bottom portion 322 and the doped layer 351. If the bottom portion 322 is n type or p type, the junction layer 331 and the top portion 321 form a p-n junction with the bottom portion 322. The flat surface 350 can also have a metal layer 352 disposed on the doped layer 351. The metal layer 352 forms an Ohmic contact with the doped layer 351. The substrate 305 preferably has a thickness of at least 50 microns. Total area of the planar reflective layer 332 is preferable at least 40% of a surface area of the flat surface 350.

The electrode layer 380 can be the same material as the transparent material 340 or different material from the transparent material 340. The electrode layer 380 is substantially transparent to visible light, preferably with a transmittance of at least 50%, more preferably at least 70%, most preferably at least 90%. The electrode layer 380 is an electrically conductive material. The electrode layer 380 preferably is a transparent conductive oxide, such as ITO (indium tin oxide), AZO (aluminum doped zinc oxide), ZIO (zinc indium oxide), ZTO (zinc tin oxide), etc. The electrode layer 380 preferably forms an Ohmic contact with the junction layer 331. The electrode layer 380 preferably is functional as an electrode of the photovoltaic device 300.

The coupling layer 360 can be the same material as the transparent material 340 or different material from the transparent material 340. As shown in FIG. 5, refractive index of the structure 320 $n_1$, refractive index of the transparent material 340 $n_2$, refractive index of the coupling layer 360 $n_3$, preferably satisfy relations of $n_1 > n_2$ and $n_1 > n_3$, which lead to enhanced light concentration in the structures 320.

In one embodiment, the structures 320 are pillars arranged in an array, such as a rectangular array, a hexagonal array, a square array, concentric ring. Each pillar is about 5 microns in height. A pitch of the structures 320 is from 300 nm to 15 microns. The "pitch" is defined as a distance of a structure 320 to a nearest neighbor of the structure 320 along a direction parallel to the substrate 305.

Figure 3B:
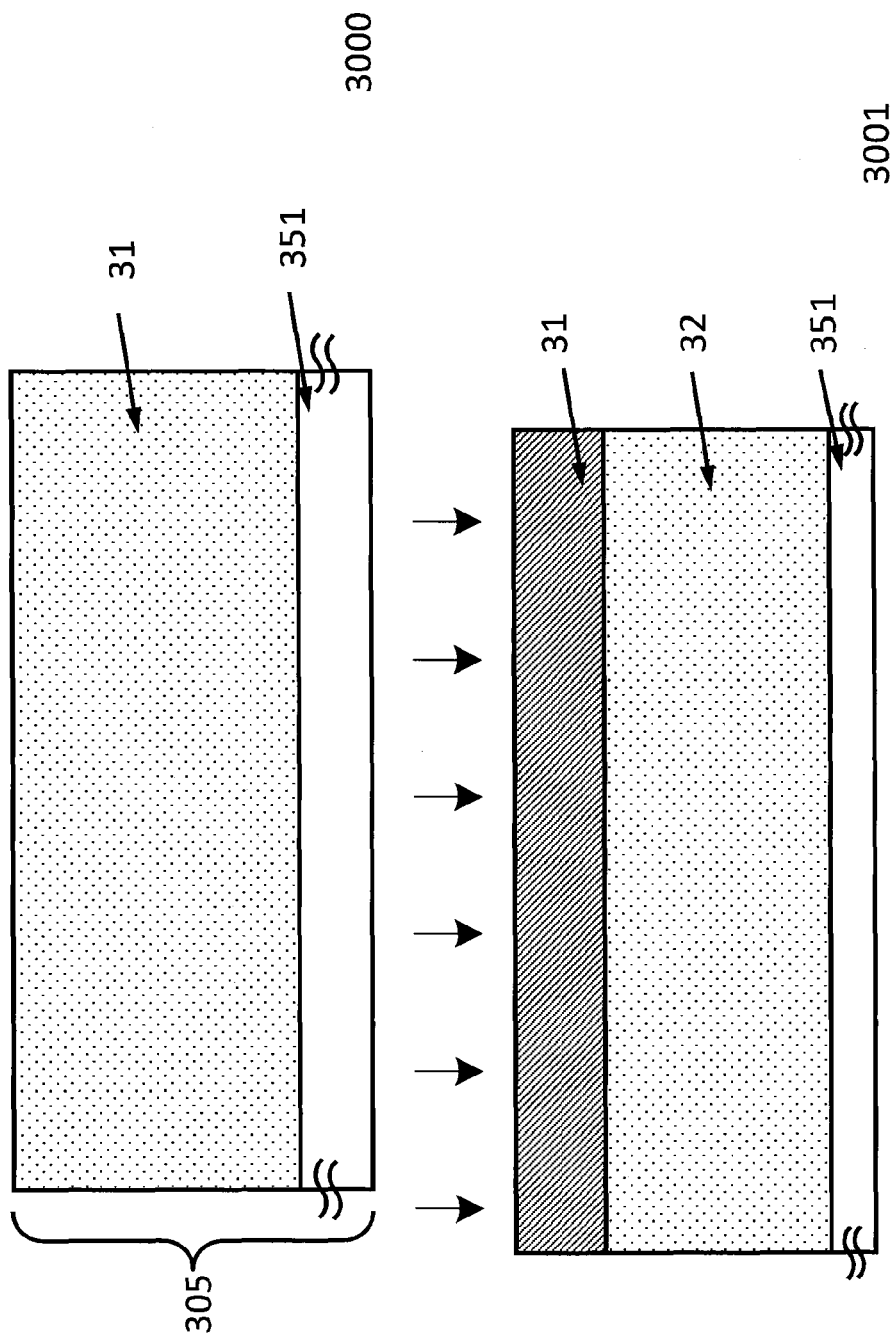
FIG. 3B is a process of manufacturing the photovoltaic device of FIG. 3A, according to an embodiment.
Figure 3B:
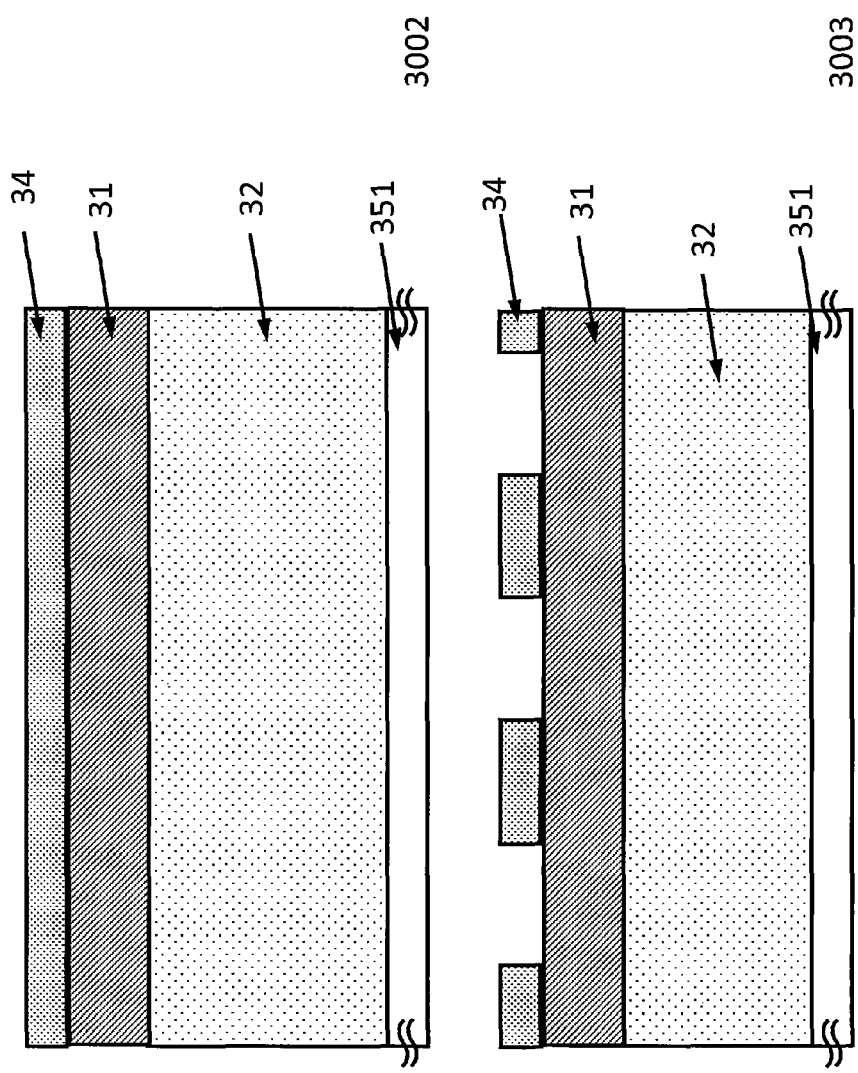

A method of making the photovoltaic device 300 as shown in FIG. 3B, according to an embodiment, comprises the following steps:

In step 3000, providing the substrate 305 having the doped layer 351 and an epi layer 31 disposed on the doped layer 351.

In step 3001, an upper layer 32 of the epi layer 31 is doped by ion implantation.

In step 3002, a resist layer 34 is applied on the doped upper layer 32. The resist layer 34 can be applied by spin coating. The resist layer 34 can be a photo resist or an e-beam resist.

In step 3003, lithography is performed. The resist layer 34 now has a pattern of openings in which the doped upper layer 32 is exposed. Shapes and locations of the openings correspond to the shapes and locations of the recesses 330. The resolution of the lithography is limited by the wavelength of the radiation used. Photolithography tools using deep ultraviolet (DUV) light with wavelengths of approximately 248 and 193 nm, allows minimum feature sizes down to about 50 nm. E-beam lithography tools using electron energy of 1 keV to 50 keV allows minimum feature sizes down to a few nanometers.

In step 3004, a mask layer 35 is deposited. The deposition can be done using a technique such as thermal evaporation, e-beam evaporation, sputtering. The mask layer 35 can be a metal such as Cr or Al, or a dielectric such as $SiO_2$ or $Si_3N_4$. The thickness of the mask layer 35 can be determined by a depth of the recesses 330 and etching selectivity (i.e., ratio of etching rates of the mask layer 35 and the substrate 305).

In step 3005, remainder of the resist layer 34 is lift off by a suitable solvent or ashed in a resist asher to remove any mask layer 35 support thereon. A portion of the mask layer 35 in the openings of the resist layer 34 is retained. A portion of the doped upper layer 32 is now exposed through the retained mask layer 35.

In step 3006, the exposed portion of the doped upper layer 32 and the portion of the epi layer 31 directly therebelow are deep etched to a desired depth (e.g., 1 to 20 microns) followed by an isotropic etch, until the epi layer 31 is partially exposed, to form the structures 320 with the overhanging portion 324 and the recesses 330 with the beveled inner edge. Each of the structures 320 now has the top portion 321 which is part of the upper doped layer 32 and a bottom portion 322 which is part of the epi layer 31. Deep etching includes alternating deposition and etch steps and can lead to "scalloping" on the sidewall 330b of the recesses 330, i.e. the sidewall 330b is not smooth. The sidewall 330b can be smoothed by thermal annealing or dipping into an etchant such as potassium hydroxide (KOH) followed by rinsing. The deep etching can use gases such as $C_4F_8$ and $SF_6$.

In step 3007, the mask layer 35 is removed by a suitable such as wet etching with suitable etchant, ion milling, sputtering. The top surface 320a of the structures 320 is exposed.

In step 3008, a dopant layer 39 is conformally (i.e., isotropically) deposited on surfaces of the recesses 330 and a top surface 320a of the structures 320. The dopant layer 39 can be deposited by a suitable technique such as plating, chemical vapor deposition or atomic layer deposition. The dopant layer 39 can comprise any suitable material such as trimethylboron, triisopropylborane $((C_3H_7)_3B)$, triethoxyborane $((C_2H_5O)_3B)$, and/or triisopropoxyborane $((C_3H_7O)_3B)$. More details can be found in an abstract of a presentation titled "Atomic layer deposition of boron oxide as dopant source for shallow doping of silicon" by Bodo Kalkofen and Edmund P. Burte in the 218th Electrochemical Society Meeting, Oct. 10, 2010-Oct. 15, 2010, which is hereby incorporated by reference in its entirety.

In step 3009, a shield layer 33 is conformally (i.e., isotropically) deposited on surfaces of the dopant layer 39. The shield layer 33 can be deposited by a suitable technique such as plating, chemical vapor deposition or atomic layer deposition. The shield layer 33 has a suitable material (such as silicon oxide, silicon nitride) and a suitable thickness (e.g., at least 10 nm, at least 100 nm or at least 1 micron) effective to prevent the dopant layer 39 from evaporation in step 3010.

In step 3010, the dopant layer 39 is diffused into the sidewall 330*b*, the bottom wall 330*a* and the top surface 320*a* by thermal annealing, which forms the junction layer 331 thereon. Thermal annealing can be conducted, for example, at about 850° C. for 10 to 30 minutes under a suitable atmosphere (e.g., argon).

In step 3011, the shield layer 33 is removed by a suitable technique such as wet etch using a suitable etchant such as HF. The junction layer 331 is now exposed.

In step 3012, a resist layer 36 is selectively applied such that the sidewall 330*a* and bottom wall 330*b* of the recesses 330 are free of the resist layer 36 and a top surface 331*a* of the junction layer 331 is completely covered by the resist layer 36. The resist layer 36 can be selectively applied by a suitable method such as the print coating method detailed hereinbelow according an embodiment.

In step 3013, the planar reflective layer 332 is anisotropically deposited (i.e., non-conformally) such that the resist layer 36 and the bottom wall 330*b* are covered by the planar reflective layer 332 while the sidewall 330*a* is free of the planar reflective layer 332. The planar reflective layer 332 can be deposited by a suitable technique such as thermal evaporation, e-beam evaporation. The planar reflective layer 332 can be any suitable material such as silver.

In step 3014, the resist layer 36 is lift off by a suitable solvent or ashed in a resist asher to remove any portion of the planar reflective layer 332 support thereon. The top surface 331*a* of the junction layer 320 is now exposed.

In step 3015, the transparent material 340 is deposited such that the planar reflective layer 332, the junction layer 331 and the top surface 331*a* are completely covered and the recesses 330 are completely filled. The transparent material 340 can be deposited by a suitable technique such as plating, chemical vapor deposition or atomic layer deposition.

In step 3016, the transparent material 340 is planarized using a suitable technique such as CMP such that the transparent material 340 has a surface coextensive with the top surface 320*a* of the structures 320 and the top surface 331*a* of the junction layer 331 is exposed.

In step 3017, the electrode layer 380 is deposited using a suitable technique such as thermal evaporation, e-beam evaporation, sputtering, onto the transparent material 340 and the top surfaces 331*a*. The coupling layer 360 can be then deposited using a suitable technique such as sputtering, thermal evaporation or e-beam evaporation onto the electrode layer 380.

In step 3018, the metal layer 352 is deposited on the doped layer 351.

The method can further comprise one or more steps of thermal annealing.

Figure 6:
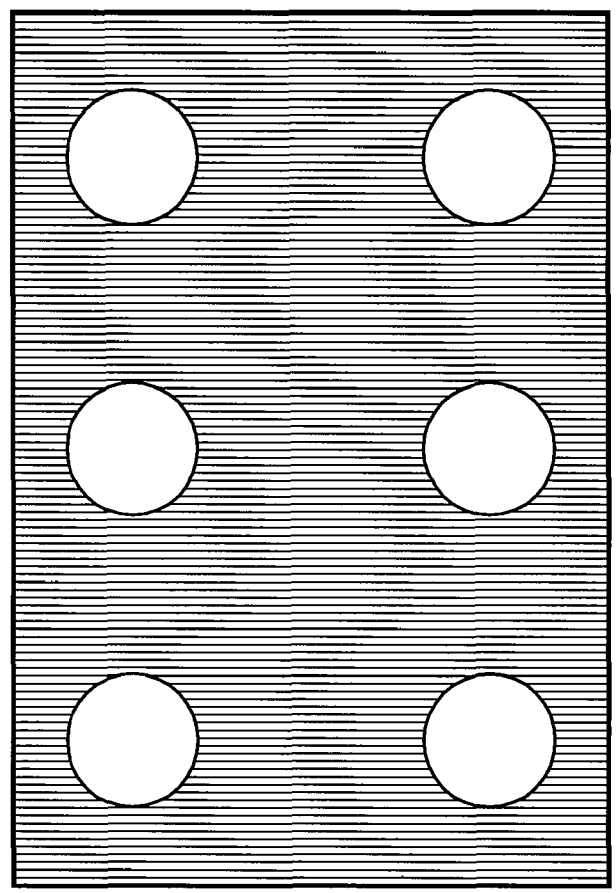
FIG. 6 shows an exemplary top cross sectional view of the photovoltaic device.
Figure 7:
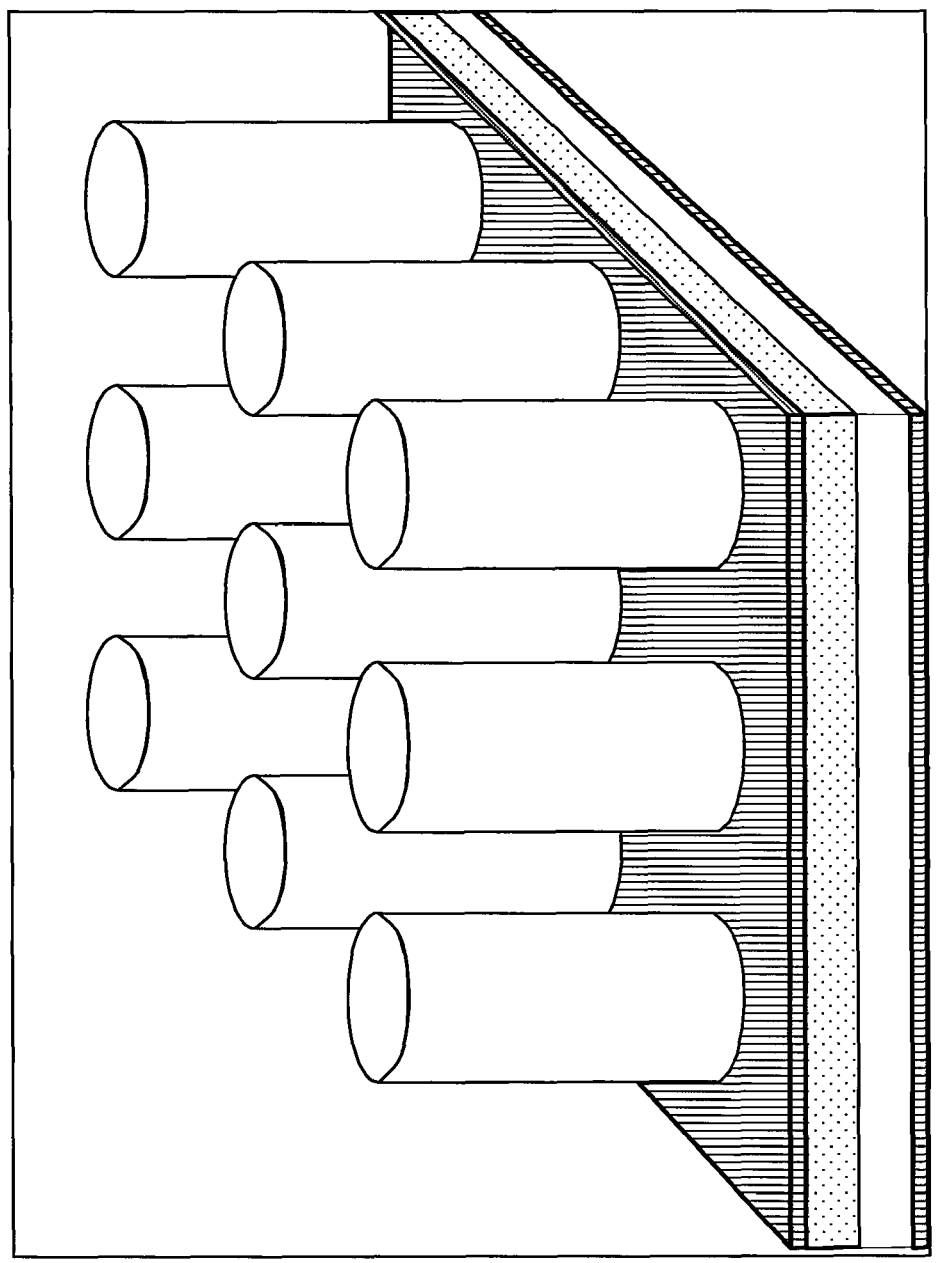
FIG. 7 shows an exemplary perspective view of the photovoltaic device.

FIG. 6 shows an exemplary top cross sectional view of the photovoltaic device 100, 200 or 300, with the transparent material 140/240/340, the electrode layer 180/280/380 and the coupling layer 160/260/360 not shown for clarity. FIG. 7 shows an exemplary perspective view of the photovoltaic device 100, 200 or 300, with the transparent material 140/240/340, the electrode layer 180/280/380 and the coupling layer 160/260/360 not shown for clarity.

An embodiment of the print method used in steps 1008, 1013, 2011 and 3012 comprises: coating a roller 410 of a flexible material such as polydimethylsiloxane (PDMS) with a resist layer 420; transferring the resist layer 420 to a surface 405*a* of a substrate 405 by rolling the roller 410 on the surface 405*a*. The surface 405*a* can be flat or textured. During rolling the roller 410, the surface 405*a* can face upward or downward.

Another embodiment of the print method used in steps 1008, 1013, 2011 and 3012 comprises: coating a stamp 430 of a flexible material such as polydimethylsiloxane (PDMS) with a resist layer 420; transferring the resist layer 420 to a surface 405*a* of a substrate 405 by pressing the stamp 430 on the surface 405*a*. The surface 405*a* can be flat or textured. During rolling the roller 410, the surface 405*a* can face upward or downward.

Figure 11A:
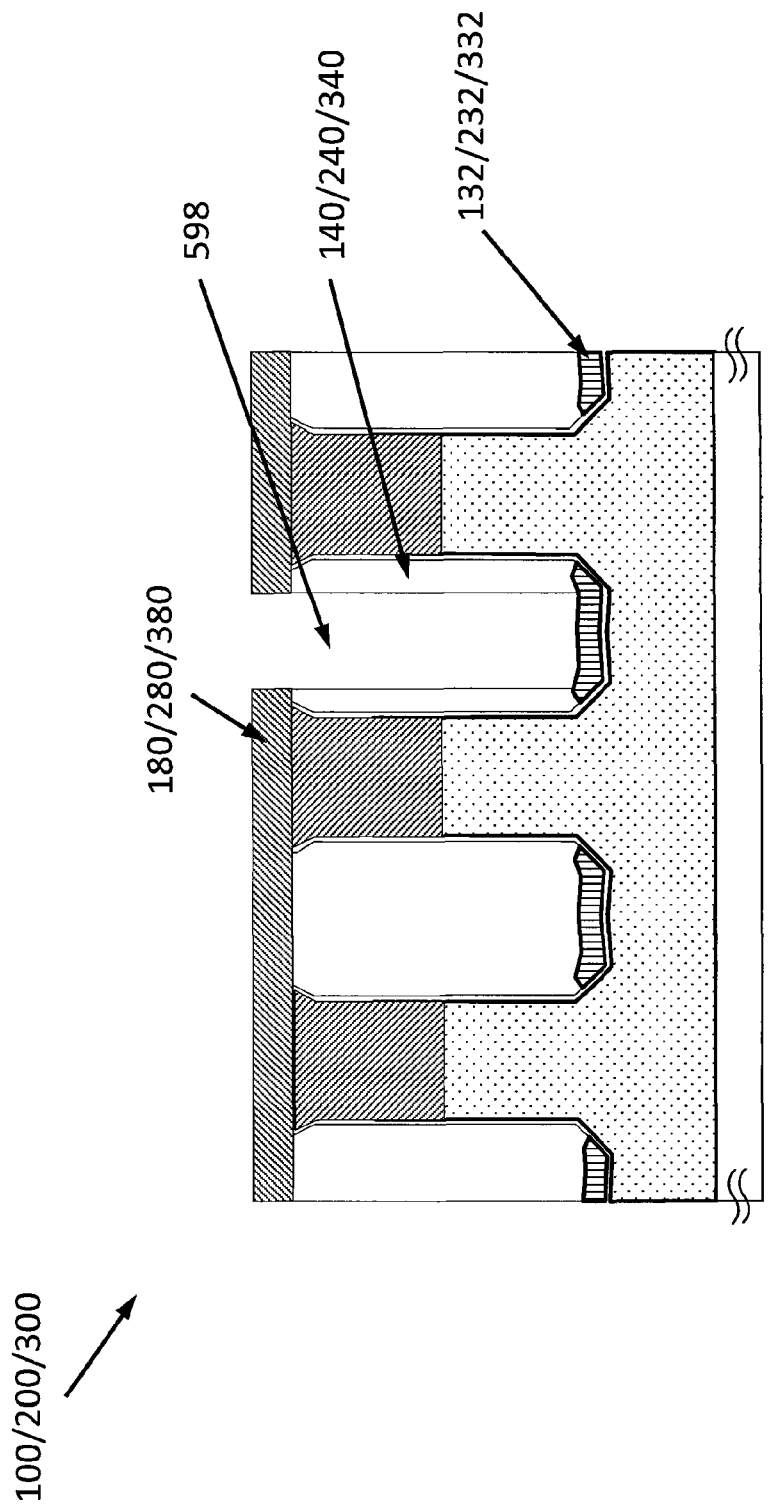
FIG. 11A and FIG. 11B show a process of making vias.
Figure 11B:
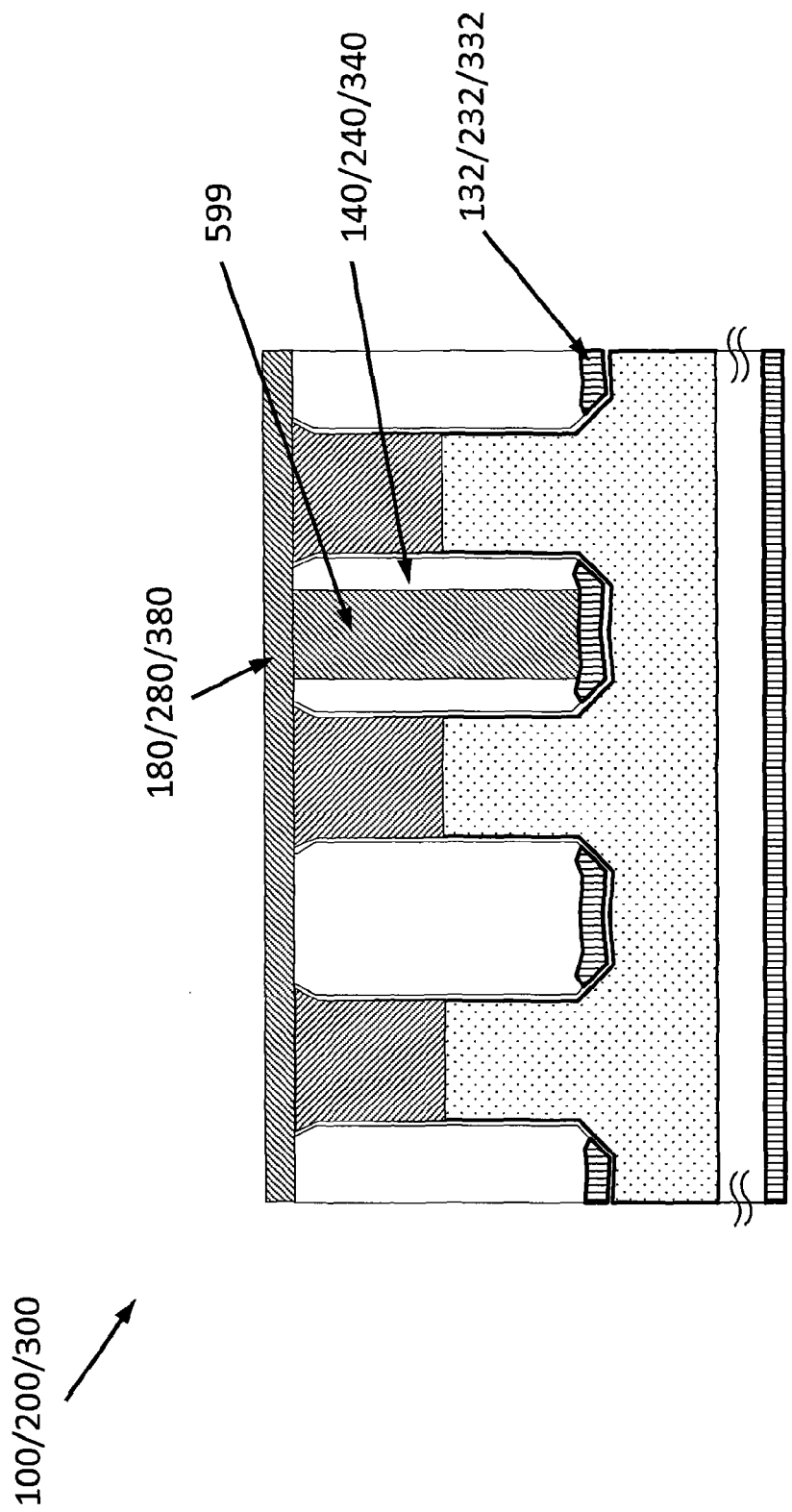

As shown in FIG. 11B, the photovoltaic device 100, 200 or 300 can further comprise at least one via 599 in the transparent material 140, 240 or 340 and between the electrode layer 180, 280 or 380 and the planar reflective layer 132, 232 or 332, wherein the at least one via 599 is an electrically conductive material, preferably an electrically conductive transparent material (e.g. ITO, AZO, etc.) and the at least one via electrically connects the electrode layer 180, 280 or 380 and the planar reflective layer 132, 232 or 332. As shown in FIG. 11A, the via 599 can be made by etching a recess 598 through the electrode layer 180, 280 or 380 and the transparent material 140, 240 or 340 until the planar reflective layer 132, 232 or 332 is exposed and then filling the recess 598 to form the via 599. As shown in FIGS. 12A and 12B, the vias 599 can be any suitable shape such as rod-shaped or bar-shaped.

Figure 8A:
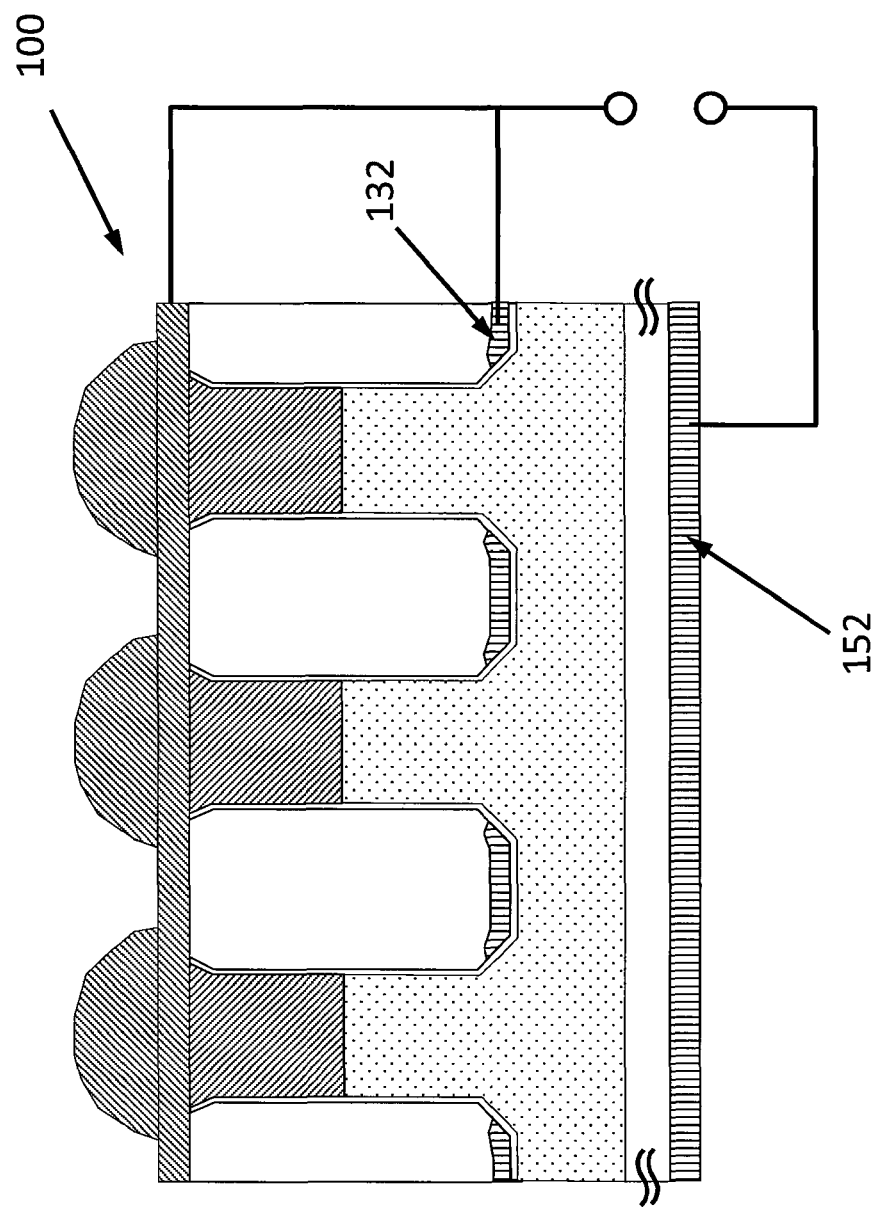
FIGS. 8A-8C shows schematics of drawing electrical current from the photovoltaic devices of FIG. 1A, FIG. 2A and FIG. 3A, respectively.
Figure 8B:
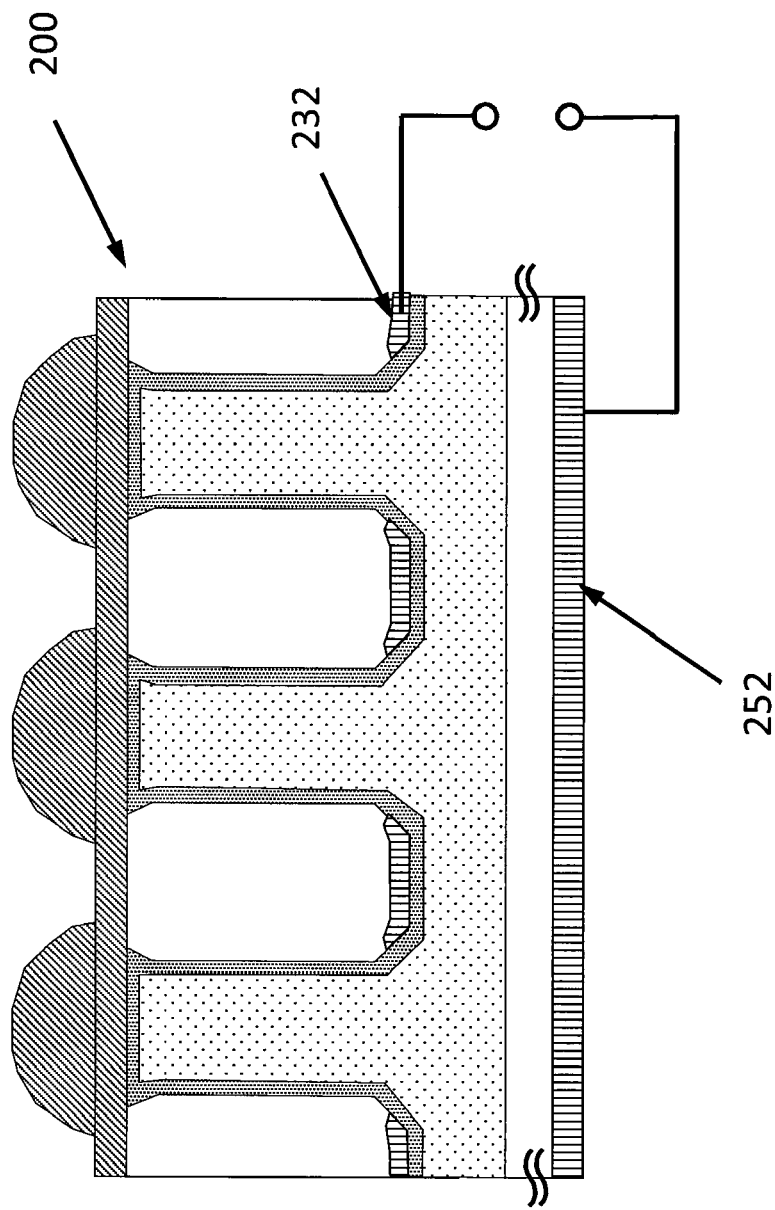
Figure 8C:
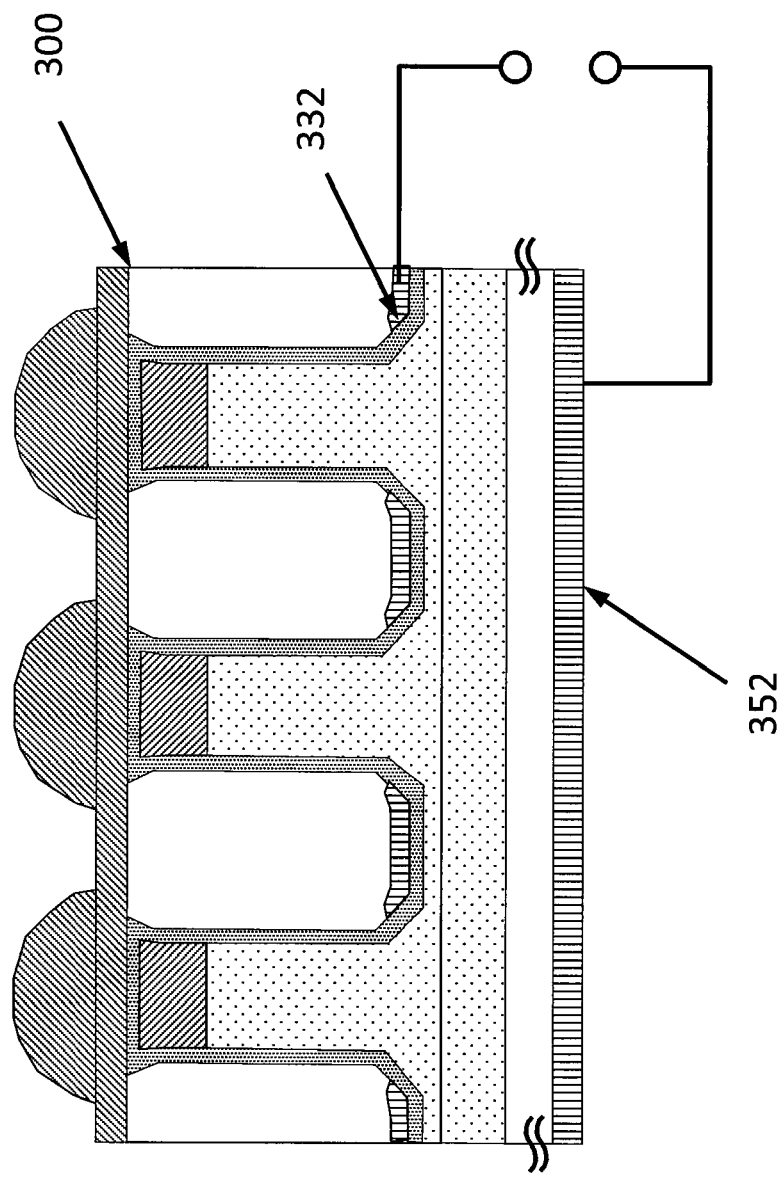

A method of converting light to electricity comprises: exposing the photovoltaic device 100, 200 or 300 to light; reflecting light to the structures 120, 220 or 320 using the planar reflective layer 132, 232 or 332; absorbing the light and converting the light to electricity using the structures 120, 220 or 320; drawing an electrical current from the photovoltaic device 100, 200 or 300. As shown in FIGS. 8A-8C, the electrical current can be drawn from the metal layer 152 and the planar reflective layer 132 or the metal layer 152 and the electrode layer 180, the metal layer 252 and the planar reflective layer 232, the metal layer 352 and the planar reflective layer 332, respectively, in the photovoltaic device 100, 200 or 300.

A photo detector according to an embodiment comprises the photovoltaic device 100, 200 or 300, wherein the photo detector is functional to output an electrical signal when exposed to light.

A method of detecting light comprises: exposing the photovoltaic device 100, 200 or 300 to light; measuring an electrical signal from the photovoltaic device 100, 200 or 300. The electrical signal can be an electrical current, an electrical voltage, an electrical conductance and/or an electrical resistance. A bias voltage can be applied to the structures 120, 220 and 320 respectively in the photovoltaic device 100, 200 or 300 when measuring the electrical signal.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A photovoltaic device operable to convert light to electricity, comprising a substrate, a plurality of structures essentially perpendicular to the substrate, one or more recesses between the structures, each recess having a sidewall and a bottom wall, and a planar reflective layer disposed on the bottom wall of each recess, wherein the structures comprise a single crystalline semiconductor material; the sidewall of each recess is free of the planar reflective layer; and each recess is filled with a transparent material, wherein the structures have an overhanging portion along an entire contour of a top surface of the structures.

2. The photovoltaic device of claim 1, wherein the single crystalline semiconductor material is selected from a group consisting of silicon, germanium, group III-V compound materials, group II-VI compound materials, and quaternary materials.

3. The photovoltaic device of claim 1, wherein the structures are cylinders or prisms with a cross-section selected from a group consisting of elliptical, circular, rectangular, and polygonal cross-sections, strips, or a mesh.

4. The photovoltaic device of claim 1, wherein the structures are pillars with diameters from 50 nm to 5000 nm, heights from 1000 nm to 20000 nm, a center-to-center distance between two closest pillars of 300 nm to 15000 nm.

5. The photovoltaic device of claim 1, wherein each recess has a rounded or beveled inner edge between the sidewall and the bottom wall thereof.

6. The photovoltaic device of claim 1, wherein the planar reflective layer is a material selected from a group consisting of ZnO, Al, Au, Ag, Pd, Cr, Cu, Ti, Ni, and a combination thereof.

7. The photovoltaic device of claim 1, wherein the planar reflective layer is an electrically conductive material.

8. The photovoltaic device of claim 1, wherein the planar reflective layer is a metal.

9. The photovoltaic device of claim 1, wherein the planar reflective layer has a reflectance of at least 50% for visible light of any wavelength.

10. The photovoltaic device of claim 1, wherein the planar reflective layer has a thickness of at least 5 nm.

11. The photovoltaic device of claim 1, wherein the planar reflective layer is functional to reflect light incident thereon to the structures so that the light is absorbed by the structures.

12. The photovoltaic device of claim 1, wherein the planar reflective layers in all the recesses are connected.

13. The photovoltaic device of claim 1, wherein the planar reflective layer is functional as an electrode of the photovoltaic device.

14. The photovoltaic device of claim 1, wherein the substrate has a flat surface opposite the structures.

15. The photovoltaic device of claim 14, wherein the flat surface has a doped layer and optionally a metal layer metal layer disposed on and forming an Ohmic contact with the doped layer.

16. The photovoltaic device of claim 15, wherein:
the transparent material has a surface coextensive with a top surface of the structures;
the transparent material is substantially transparent to visible light with a transmittance of at least 50%;
the transparent material is an electrically conductive material or an electrically insulating material;
the transparent material is a transparent conductive oxide;
the transparent material forms an Ohmic contact with the planar reflective layer; and/or
the transparent material is functional as an electrode of the photovoltaic device.

17. The photovoltaic device of claim 16, further comprising an electrode layer and optionally a coupling layer, wherein: the electrode layer is disposed on the transparent material and the structures; the electrode layer is the same material as the transparent material or different material from the transparent material; the electrode layer is substantially transparent to visible light with a transmittance of at least 50%; the electrode layer is an electrically conductive material; the electrode layer is a transparent conductive oxide; the electrode layer is functional as an electrode of the photovoltaic device; and/or the coupling layer is disposed on the electrode layer and only above a top surface of the structures.

18. The photovoltaic device of claim 17, further comprising a passivation layer, wherein: the passivation layer is disposed on the sidewall, and on the bottom wall under the planar reflective layer; a top surface of the structures is free of the passivation layer; and the passivation layer is effective to passivate the sidewall and the bottom wall; and/or each of the structures has a top portion and a bottom portion having dissimilar conduction types.

19. The photovoltaic device of claim 18, wherein the structures have one of the following doping profiles: (i) the bottom portion is intrinsic and the top portion is p type; (ii) the bottom portion is n type and the top portion is p type; (iii) the bottom portion is intrinsic and the top portion is n type; (iv) the bottom portion is p type and the top portion is n type.

20. The photovoltaic device of claim 18, further comprising a cladding layer, wherein:
the top portion has a height of 1 micron to 20 micron;
the passivation layer has a thickness from 1 nm to 100 nm;
the passivation layer is an electrically insulating material selected from a group consisting of $HfO_2$, $SiO_2$, $Si_3N_4$, $Al_2O_3$, an organic molecule monolayer;
the doped layer has an opposite conduction type from the top portion;
the doped layer is electrically connected to the bottom portion;
the doped layer, the bottom portion and the top portion form a p-n or p-i-n junction;
the coupling layer is the same material as the cladding layer or different material from the cladding layer; and/or a refractive index of the structures $n_1$, a refractive index of the transparent material $n_2$, a refractive index of the coupling layer $n_3$, satisfy relations of $n_1>n_2$ and $n_1>n_3$.

21. The photovoltaic device of claim 17, further comprising a junction layer wherein: the junction layer is a doped semiconductor; the junction layer is disposed on the sidewall, on the bottom wall under the planar reflective layer, and on a top surface of the structures; and the junction layer is effective to passivate the sidewall and the bottom wall.

22. The photovoltaic device of claim 21, wherein the structures are a doped semiconductor and the structures and the junction layer have opposite conduction types; or the structures are an intrinsic semiconductor.

23. The photovoltaic device of claim 21, further comprising a cladding layer, wherein:
the junction layer has a thickness from 5 nm to 100 nm; the doped layer has an opposite conduction type from the junction layer;
the doped layer is electrically connected to each of the structures; the doped layer, the structures and the junction layer form a p-n or p-i-n junction;
the cladding layer has a thickness of about 175 nm;
the coupling layer is the same material as the cladding layer or different material from the cladding layer; and/or
a refractive index of the structures $n_1$, a refractive index of the transparent material $n_2$, a refractive index of the coupling layer $n_3$, satisfy relations of $n_1>n_2$ and $n_1>n_3$.

24. The photovoltaic device of claim 21, wherein: each of the structures has a top portion and a bottom portion having dissimilar conduction types.

25. The photovoltaic device of claim 24, wherein the top portion and the junction layer have the same conduction type; and the structures have one of the following doping profiles: (i) the bottom portion is intrinsic and the top portion is p type; (ii) the bottom portion is n type and the top portion is p type;

(iii) the bottom portion is intrinsic and the top portion is n type; (iv) the bottom portion is p type and the top portion is n type.

26. The photovoltaic device of claim 24, wherein: the junction layer has a thickness from 5 nm to 100 nm; the doped layer has an opposite conduction type from the junction layer; the doped layer is electrically connected to the bottom portion of each of the structures; the doped layer, the bottom portion, the top portion and the junction layer form a p-n or p-i-n junction; the coupling layer is the same material as the cladding layer or different material from the cladding layer; and/or a refractive index of the structures $n_1$, a refractive index of the transparent material $n_2$, a refractive index of the coupling layer $n_3$, satisfy relations of $n_1 > n_2$ and $n_1 > n_3$.

27. The photovoltaic device of claim 17, further comprising at least one via in the transparent material and between the electrode layer and the planar reflective layer, wherein the at least one via is an electrically conductive material and the at least one via electrically connects the electrode layer and the planar reflective layer.

28. The photovoltaic device of claim 14, wherein total area of the planar reflective layer is at least 40% of a surface area of the flat surface.

29. The photovoltaic device of claim 1, wherein the substrate has a thickness of at least 50 microns.

30. The photovoltaic device of claim 1, wherein the structures are pillars arranged in an array; each structure is about 5 microns in height; a pitch of the structures is from 300 nm to 15 microns.

31. A photo detector comprising the photovoltaic device of claim 1, wherein the photo detector is functional to output an electrical signal when exposed to light.

32. The method of claim 31, wherein the electrical signal is an electrical current, an electrical voltage, an electrical conductance and/or an electrical resistance.

33. A method of detecting light comprises: exposing the photovoltaic device of claim 1 to light; measuring an electrical signal from the photovoltaic device.

34. The method of claim 33, wherein a bias voltage is applied to the structures in the photovoltaic device.

35. A method of making a photovoltaic device comprising a substrate, a plurality of structures essentially perpendicular to the substrate, one or more recesses between the structures, each recess having a sidewall and a bottom wall, a planar reflective layer disposed on the bottom wall of each recess and each recess filled with a transparent material, the method comprising:
  generating a pattern of openings in a resist layer using a lithography technique, wherein locations and shapes of the openings correspond to location and shapes of the structures;
  forming the structures and recesses by etching the substrate;
  depositing the planar reflective layer to the bottom wall, such that the sidewall of each recess is free of the planar reflective layer;
  depositing the transparent material such that each recess is completely filled by the transparent material;
  wherein the structures comprise a single crystalline semiconductor material, wherein the structures have an overhanging portion along an entire contour of a top surface of the structures.

36. The method of claim 35, further comprising:
  planarizing the transparent material; coating the substrate with the resist layer;
  developing the pattern in the resist layer;
  depositing a mask layer; and
  lifting off the resist layer.

37. The method of claim 35, further comprising ion implantation or depositing a dopant layer.

38. The method of claim 35, wherein the structures and recesses are formed by deep etch followed by isotropic etch.

39. The method of claim 35, further comprising applying a resist layer by a print coating method, the print coating method comprising:
  coating a roller of a flexible material with a resist layer;
  transferring the resist layer to a surface of a substrate by rolling the roller on the surface, wherein the surface is flat or textured.

40. The method of claim 39, wherein the roller is polydimethylsiloxane.

41. The method of claim 35, further comprising applying a resist layer by a print coating method, the print coating method comprising:
  coating a stamp of a flexible material with a resist layer;
  transferring the resist layer to a surface of a substrate by pressing the stamp on the surface, wherein the surface is flat or textured.

42. The method of claim 41, wherein the stamp is polydimethylsiloxane.

43. A method of converting light to electricity comprising:
  exposing a photovoltaic device to light, wherein the photovoltaic device comprises a substrate, a plurality of structures essentially perpendicular to the substrate, one or more recesses between the structures, each recess having a sidewall and a bottom wall, a planar reflective layer disposed on the bottom wall of each recess, the sidewall of each recess being free of the planar reflective layer, and each recess filled with a transparent material;
  reflecting light to the structures using the planar reflective layer;
  absorbing the light and converting the light to electricity using the structures;
  drawing an electrical current from the photovoltaic device;
  wherein the structures comprise a single crystalline semiconductor material, wherein the structures have an overhanging portion along an entire contour of a top surface of the structures.

44. The method of claim 43, wherein the electrical current is drawn from the planar reflective layer.

* * * * *